(12) United States Patent
Kodama

(10) Patent No.: US 7,033,727 B2
(45) Date of Patent: Apr. 25, 2006

(54) PHOTOSENSITIVE COMPOSITION AND ACID GENERATOR

(75) Inventor: Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/668,348

(22) Filed: Sep. 24, 2003

(65) Prior Publication Data

US 2004/0072097 A1 Apr. 15, 2004

(30) Foreign Application Priority Data

Sep. 25, 2002 (JP) .................................... P.2002-279273

(51) Int. Cl.
*G03C 1/73* (2006.01)
*G03F 7/038* (2006.01)
*G03F 7/039* (2006.01)
*G03F 7/30* (2006.01)
*C07D 335/00* (2006.01)
*C07D 409/00* (2006.01)

(52) U.S. Cl. .................... 430/270.1; 430/325; 430/326; 430/905; 430/907; 430/910; 430/914; 430/921; 430/922; 430/923; 430/927; 522/31; 549/13; 549/14; 549/29; 549/59; 549/60; 549/78; 568/18; 568/74; 568/75; 568/77

(58) Field of Classification Search .............. 430/270.1, 430/326, 905, 907, 910, 914, 921, 922, 923, 430/924, 927, 325; 522/31; 549/13, 14, 29, 549/59, 60, 78; 568/18, 74, 75, 77
See application file for complete search history.

(56) References Cited

U.S. PATENT DOCUMENTS

| | | | |
|---|---|---|---|
| 6,031,014 A | 2/2000 | Crivello | |
| 6,326,131 B1 * | 12/2001 | Schell et al. ................. | 430/505 |
| 2003/0077540 A1 | 4/2003 | Kodama et al. | |

FOREIGN PATENT DOCUMENTS

| | | |
|---|---|---|
| EP | 1 113 334 A1 | 7/2001 |
| EP | 1 167 349 A1 | 1/2002 |
| EP | 1 260 864 A1 | 11/2002 |
| JP | 10-73919 A | 3/1998 |
| JP | 10-133371 A | 5/1998 |
| JP | 2002-187780 A | 7/2001 |
| JP | 2002-116546 A | 4/2002 |

OTHER PUBLICATIONS

European Search Report dated Feb. 11, 2004.

* cited by examiner

*Primary Examiner*—Cynthia H. Kelly
*Assistant Examiner*—Sin J. Lee
(74) *Attorney, Agent, or Firm*—Sughrue Mion, PLLC

(57) ABSTRACT

A photosensitive composition of the present invention has excellent sensitivity and pattern profile, which comprises an acid generator having a specific structure.

15 Claims, No Drawings

PHOTOSENSITIVE COMPOSITION AND ACID GENERATOR

BACKGROUND OF THE INVENTION

1. Field of the Invention

The present invention relates to a photosensitive composition that is used in the production step of semiconductors such as IC, the production of circuit boards of liquid crystals, thermal heads, etc., and other photo-fabrication steps and for lithographic printing plates, acid curable compositions, radical curable compositions, etc.

2. Description of Related Art

Photosensitive compositions are a composition that generates an acid or radical by external stimulations such as actinic rays and changes physical properties of a site to be stimulated by its reaction. More preferably, photosensitive compositions are a pattern forming material that changes dissolution of irradiated areas and non-irradiated areas by actinic rays in a developer to form a pattern on a substrate.

As such photosensitive compositions are enumerated chemical amplification resist compositions containing an acid generator capable of generating an acid upon irradiation with actinic rays.

With respect to such chemical amplification resist compositions, JP-A-2002-116546 discloses a composition containing a mixed acid generator of an oxoalkylsulfonium salt having no substituent in a methylene moiety and a triarylsulfonium salt or a diphenyliodonium salt; JP-A-2001-187780 and EP-1113334 disclose oxoalkyl group-containing sulfonium salts; and JP-A-10-133371 and JP-A-10-73919 disclose 2-oxo cyclic alkyl group-containing sulfonium salts. However, though these oxoalkylsulfonium salts have high transparency against rays of not longer than 220 nm, they have a low ability to generate an acid. Therefore, there was involved a problem such that sensitivity is lowered.

SUMMARY OF THE INVENTION

Accordingly, an object of the invention is to provide an acid generator that has a high transparency against rays of not longer than 220 nm, has an enhanced photodegradation ability as compared with conventionally known acid generators, thereby revealing high sensitivity, and has a good resist profile.

The invention has the following constructions, on a basis of which has been attained the foregoing object of the invention.

1. A photosensitive composition comprising a compound capable of generating an acid upon irradiation with an actinic ray, the compound being represented by the following general formula (I):

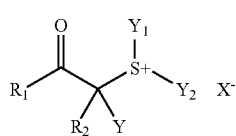

wherein $R_1$ represents an alkyl group;

$R_2$ represents a hydrogen atom, an alkyl group, or an aryl group;

Y represents an alkyl group;

$Y_1$ and $Y_2$ may be the same or different and each represents an alkyl group, an aryl group, an aralkyl group, or a hetero atom-containing aromatic group;

$R_1$ and $R_2$ may be bonded to each other to form a ring;

$R_2$ and Y may be bonded to each other to form a ring;

$Y_1$ and $Y_2$ may be bonded to each other to form a ring;

two or more structures of the general formula (I) may be bonded to each other at any position of $R_1$, $R_2$ or Y, or $Y_1$ or $Y_2$ via a connecting group; and $X^-$ represents a non-nucleophilic anion.

2. A positive photosensitive composition comprising:

(A) a compound capable of generating an acid upon irradiation with an actinic ray, the compound being represented by the following general formula (I); and (B) a resin that is decomposed by the action of an acid to increase its solubility in an alkaline developer:

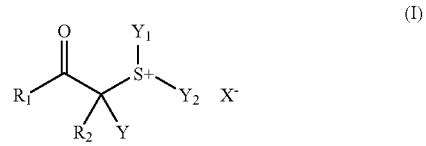

wherein $R_1$ represents an alkyl group;

$R_2$ represents a hydrogen atom, an alkyl group, or an aryl group;

Y represents an alkyl group;

$Y_1$ and $Y_2$ may be the same or different and each represents an alkyl group, an aryl group, an aralkyl group, or a hetero atom-containing aromatic group;

$R_1$ and $R_2$ may be bonded to each other to form a ring;

$R_2$ and Y may be bonded to each other to form a ring;

$Y_1$ and $Y_2$ may be bonded to each other to form a ring;

two or more structures of the general formula (I) may be bonded to each other at any position of $R_1$, $R_2$ or Y, or $Y_1$ or $Y_2$ via a connecting group; and $X^-$ represents a non-nucleophilic anion.

3. The positive photosensitive composition as described in the item 2, wherein the resin (B) contains a hydroxystyrene structural unit.

4. The positive photosensitive composition as described in the item 2 or 3, wherein the resin (B) contains a monocyclic or polycyclic alicyclic hydrocarbon structure.

5. The positive photosensitive composition as described in the item 4, wherein the resin (B) further contains a repeating unit having a lactone structure.

6. The positive photosensitive composition as described in any one of the items 2 to 5, wherein the resin (B) contains a fluorine atom.

7. The positive photosensitive composition as described in any one of the items 2 to 6, which further comprises (C) a dissolution inhibiting compound having a molecular weight of not more than 3,000, which is decomposed by the action of an acid to increase its solubility in an alkaline developer.

8. A positive photosensitive composition comprising:

(A) a compound capable of generating an acid upon irradiation with an actinic ray, the compound being represented by the following general formula (I);

(D) an alkaline developer-soluble resin; and (C) a dissolution inhibiting compound having a molecular weight of not more than 3,000, which is decomposed by the action of an acid to increase its solubility in an alkaline developer:

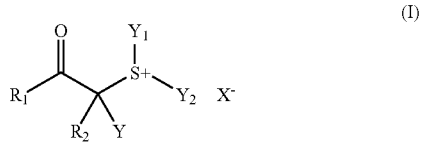

wherein $R_1$ represents an alkyl group;

$R_2$ represents a hydrogen atom, an alkyl group, or an aryl group;

Y represents an alkyl group;

$Y_1$ and $Y_2$ may be the same or different and each represents an alkyl group, an aryl group, an aralkyl group, or a hetero atom-containing aromatic group;

$R_1$ and $R_2$ may be bonded to each other to form a ring;

$R_2$ and Y may be bonded to each other to form a ring;

$Y_1$ and $Y_2$ may be bonded to each other to form a ring;

two or more structures of the general formula (I) may be bonded to each other at any position of $R_1$, $R_2$ or Y, or $Y_1$ or $Y_2$ via a connecting group; and $X^-$ represents a non-nucleophilic anion.

9. A negative photosensitive composition comprising:

(A) a compound capable of generating an acid upon irradiation with an actinic ray, the compound being represented by the following general formula (I);

(D) an alkaline developer-soluble resin; and (E) an acid crosslinking agent capable of crosslinking with the alkaline developer-soluble resin by the action of an acid:

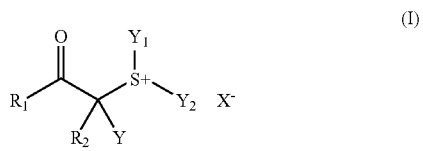

wherein $R_1$ represents an alkyl group;

$R_2$ represents a hydrogen atom, an alkyl group, or an aryl group;

Y represents an alkyl group;

$Y_1$ and $Y_2$ may be the same or different and each represents an alkyl group, an aryl group, an aralkyl group, or a hetero atom-containing aromatic group;

$R_1$ and $R_2$ may be bonded to each other to form a ring;

$R_2$ and Y may be bonded to each other to form a ring;

$Y_1$ and $Y_2$ may be bonded to each other to form a ring;

two or more structures of the general formula (I) may be bonded to each other at any position of $R_1$, $R_2$ or Y, or $Y_1$ or $Y_2$ via a connecting group; and $X^-$ represents a non-nucleophilic anion.

10. The photosensitive composition as described in any one of the items 1 to 9, which further comprises (F) a basic compound.

11. The photosensitive composition as described in any one of the items 1 to 10, which further comprises (G) a surfactant containing at least one of a fluorine atom and a silicon atom.

12. An acid generator represented by the following general formula (I):

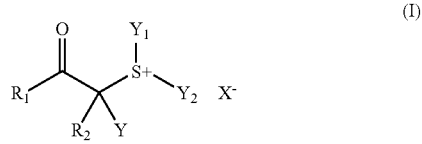

wherein $R_1$ represents an alkyl group;

$R_2$ represents a hydrogen atom, an alkyl group, or an aryl group;

Y represents an alkyl group;

$Y_1$ and $Y_2$ may be the same or different and each represents an alkyl group, an aryl group, an aralkyl group, or a hetero atom-containing aromatic group;

$R_1$ and $R_2$ may be bonded to each other to form a ring;

$R_2$ and Y may be bonded to each other to form a ring;

$Y_1$ and $Y_2$ may be bonded to each other to form a ring;

two or more structures of the general formula (I) may be bonded to each other at any position of $R_1$, $R_2$ or Y, or $Y_1$ or $Y_2$ via a connecting group; and $X^-$ represents a non-nucleophilic anion.

13. A method of forming a resist pattern, which comprises: forming a film including the photosensitive composition described in any one of the items 1 to 11; irradiating the film with an actinic ray; and developing the irradiated film.

14. The photosensitive composition as described in the item 10, wherein the basic compound (F) includes one of a compound having a structure selected from the group consisting of an imidazole structure, a diazabicyclo structure, an onium hydroxide structure, an onium carboxylate structure, a trialkylamine structure, an aniline structure and a pyridine structure, an alkylamine derivative containing at least one of a hydroxyl group and an ether bond, and an aniline derivative containing at least one of a hydroxyl group and an ether bond.

15. The photosensitive composition as described above, wherein each of the $R_2$ and Y in the formula (I) represents an alkyl group having 1 to 20 carbon atoms.

16. The photosensitive composition as described above, which further comprises at least one of an arylsulfonium compound and a compound having a phenacylsulfonium salt structure.

DETAILED DESCRIPTION OF THE INVENTION

As the photosensitive composition of the invention, can be enumerated positive photosensitive compositions and negative photosensitive compositions.

The positive photosensitive composition of the invention, and more preferably a positive resist composition, comprises (A) a compound capable of generating an acid upon irradiation with actinic rays, which is represented by the foregoing general formula (I), and (B) a resin that is decomposed by the action of an acid, whereby its solubility in an alkaline developer increases, and further comprises (C) a dissolution inhibiting compound having a molecular weight of not more than 3,000, which is decomposed by the action of an acid, whereby its solubility in an alkaline developer increases, if desired; or comprises (A) a compound capable of generating an acid upon irradiation with actinic rays, which is represented by the foregoing general formula (I), (D) an alkaline developer-soluble resin, and (C) a dissolution inhibiting compound having a molecular weight of not more than 3,000, which is decomposed by the action of an acid, whereby its solubility in an alkaline developer increases.

The negative photosensitive composition of the invention, and more preferably a negative resist composition, comprises (A) a compound capable of generating an acid upon irradiation with actinic rays, which is represented by the foregoing general formula (I), (D) an alkaline developer-soluble resin, and (E) an acid crosslinking agent capable of crosslinking with the alkaline developer-soluble resin by the action of an acid.

The invention will be described below in detail.

(1) (A) compound capable of generating an acid upon irradiation With actinic rays, which is represented by the general formula (I):

The photosensitive composition of the invention comprises a compound capable of generating an acid upon irradiation with actinic rays, which is represented by the general formula (I).

In the general formula (I), $R_1$ represents an alkyl group; $R_2$ represents a hydrogen atom, an alkyl group, or an aryl group; Y represents an alkyl group; $Y_1$ and $Y_2$ may be the same or different and each represents an alkyl group, an aryl group, an aralkyl group, or a hetero atom-containing aromatic group; $R_1$ and $R_2$ may be bonded to each other to form a ring; $R_2$ and Y may be bonded to each other to form a ring; $Y_1$ and $Y_2$ may be bonded to each other to form a ring; two or more structures of the general formula (I) may be bonded to each other at any position of $R_1$, $R_2$ or Y, or $Y_1$ or $Y_2$ via a connecting group; and $X^-$ represents a non-nucleophilic anion.

The alkyl group represented by $R_1$, $R_2$, Y, $Y_1$, and $Y_2$ is preferably an alkyl group having from 1 to 20 carbon atoms. Examples include linear, branched or cyclic alkyl groups such as a methyl group, an ethyl group, a propyl group, an n-butyl group, a sec-butyl group, a t-butyl group, a cyclobutyl group, a pentyl group, a neopentyl group, a cyclopentyl group, a hexyl group, a cyclohexyl group, a heptyl group, an octyl group, a nonyl group, and a decyl group.

The aryl group represented by $R_2$, $Y_1$ and $Y_2$ is preferably an aryl group having from 6 to 14 carbon atoms. Examples include a phenyl group, a tolyl group, and a naphthyl group.

The aralkyl group represented by $Y_1$ and $Y_2$ is preferably an aralkyl group having from 7 to 12 carbon atoms. Examples include a benzyl group, a phenethyl group, and a cumyl group.

The hetero atom-containing aromatic group represented by $Y_1$ and $Y_2$ is preferably a group in which an aromatic group (such as an aryl group having from 6 to 14 carbon atoms) contains a hetero atom such as a nitrogen atom, an oxygen atom, and a sulfur atom. Examples include heterocyclic aromatic hydrocarbon groups such as furan, thiophene, pyrrole, pyridine, and indole.

$R_1$ and $R_2$, or $R_2$ and Y may be bonded to each other to form a ring. The group formed when $R_1$ and $R_2$, or $R_2$ and Y are bonded to each other is preferably an alkylene group having from 2 to 10 carbon atoms. Examples include an ethylene group, a propylene group, a butylene group, a pentylene group, and a hexylene group. Further, the group formed when $R_1$ and $R_2$, or $R_2$ and Y are bonded to each other may contain a heteto atom.

$Y_1$ and $Y_2$ may be bonded to each other and taken together with $S^+$ in the general formula (I) to form a ring. Examples of groups formed when $Y_1$ and $Y_2$ are bonded to each other include alkylene groups having from 2 to 10 carbon atoms, preferably a butylene group, a pentylene group, and a hexylene group, and particularly preferably a butylene group and a pentylene group. Further, the ring formed when $Y_1$ and $Y_2$ are bonded to each other and taken together with $S^+$ in the general formula (I) may contain a hetero group.

Each of the alkyl group, aryl group, aralkyl group and hetero atom-containing aromatic group represented by $R_1$, $R_2$, Y, $Y_1$ and $Y_2$ may not have a substituent or may have a substituent. Examples of substituents which each of the alkyl group, aryl group, aralkyl group and hetero atom-containing aromatic group may have include a nitro group, a halogen atom, a carboxyl group, a hydroxyl group, an amino group, a cyano group, an alkoxy group (preferably those having from 1 to 5 carbon atoms), an alkyl group (preferably those having from 1 to 20 carbon atoms), an aryl group (preferably those having from 6 to 14 carbon atoms), and an alkoxycarbonyloxy group (preferably those having from 2 to 7 carbon atoms). Examples of substituents of the alkyl group represented by $R_1$ further include an —$S^+Q$ group. In the formula, $S^+Q$ represents a ring structure containing $S^+$ in the ring and having from 4 to 6 carbon atoms. $S^+Q$ may contain a hetero atom in the ring.

Two or more structures of the general formula (I) may be bonded to each other at any position of $R_1$, $R_2$ or Y, or $Y_1$ or $Y_2$ via a connecting group.

When Y represents an alkyl group, the component (A) has an enhanced photodegradation ability, thereby revealing high sensitivity and has a good profile. With respect to the component (A), in the case where $R_2$ represents a hydrogen atom, preferably, Y is an alkyl group having 2 or more carbon atoms, and most preferably, both $R_2$ and Y are an alkyl group having from 1 to 20 carbon atoms.

Examples of non-nucleophilic anions represented by $X^-$ include a sulfonic acid anion, a carboxylic acid anion, a sulfonylimide anion, a bis(alkylsulfonyl)imide anion, and a tris(alkylsulfonyl)methyl anion.

The non-nucleophilic anion as referred to herein means an anion whose ability to cause nucleophilic reaction is extremely low and capable of suppressing degradation with time due to intramolecular nucleophilic reaction. Thus, stability with time of resist is enhanced.

Examples of sulfonic acid anions include alkylsulfonic acid anions, arylsulfonic acid anions, and camphorsulfonic acid anions.

Examples of carboxylic acid anions include alkanecarboxylic acid anions, arylcarboxylic acid anions, and aralkylcarboxylic acid anions.

As the alkyl group in the alkylsulfonic acid anion are preferable alkyl groups having from 1 to 30 carbon atoms. Examples include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group.

As the aryl group in the arylsulfonic acid anion are preferable aryl groups having from 6 to 14 carbon atoms. Examples include a phenyl group, a tolyl group, and a naphthyl group.

The alkyl group and aryl group in the alkylsulfonic acid anion and arylsulfonic acid anion may have a substituent.

Examples of substituents include a halogen atom, an alkyl group, an alkoxy group, and an alkylthio group.

Examples of halogen atoms include a chlorine atom, a bromine atom, a fluorine atom, and an iodine atom.

As the alkyl group are preferable alkyl groups having from 1 to 20 carbon atoms. Examples include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group.

As the alkoxy group are preferable alkoxy groups having from 1 to 5 carbon atoms. Examples include a methoxy group, an ethoxy group, a propoxy group, and a butoxy group.

As the alkylthio group are preferable alkylthio groups having from 1 to 20 carbon atoms. Examples include a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, an undecylthio group, a dodecylthio group, a tridecylthio group, a tetradecylthio group, a pentadecylthio group, a hexadecylthio group, a heptadecylthio group, an octadecylthio group, a nonadecylthio group, and an eicosylthio group. Incidentally, the alkyl group, alkoxy group and alkylthio group may further be substituted with a halogen atom (preferably a fluorine atom).

As the alkyl group in the alkylcarboxylic acid anion, can be enumerated those the same as in the alkyl group in the alkylsulfonic acid anion.

As the aryl group in the arylcarboxylic acid anion, can be enumerated those the same as in the aryl group in the arylsulfonic acid anion.

As the aralkyl group in the aralkylcarboxylic acid anion are preferable aralkyl groups having from 6 to 12 carbon atoms. Examples include a benzyl group, a phenethyl group, a naphthylmethyl group, a naphthylethyl group, and a naphthylmethyl group.

The alkyl group, aryl group and aralkyl group in the alkylcarboxylic acid anion, arylcarboxylic acid anion and aralkylcarboxylic acid anion may have a substituent. Examples of substituents include those the same as in arylsulfonic acid anion, such as a halogen atom, an alkyl group, an alkoxy group, and an alkylthio group.

Examples of sulfonylimide anions include a saccharin anion.

As the alkyl group in the bis(alkylsulfonyl)imide anion and tris(alkylsulfonyl)methyl anion are preferable alkyl groups having from 1 to 5 carbon atoms. Examples include a methyl group, an ethyl group, a propyl group, an isopropyl group, an n-butyl group, an isobutyl group, a sec-butyl group, a pentyl group, and a neopentyl group. These alkyl groups may have a substituent. Examples of substituents include a halogen atom, an alkyl group substituted with a halogen atom, an alkoxy group, and an alkylthio group, with an alkyl group substituted with a fluorine atom being preferred.

Other examples of non-nucleophilic anions include fluorinated phosphorus, fluorinated boron, and fluorinated antimony.

As the non-nucleophilic anion represented by X⁻ are preferable an alkanesulfonic acid anion in which the α-position of sulfonic acid is substituted with a fluorine atom; an arylsulfonic acid anion substituted with a fluorine atom or a fluorine atom-containing group; an bis(alkylsulfonyl) imide anion in which an alkyl group thereof is substituted with a fluorine atom; and a tris(alkylsulfonyl) methyl anion in which an alkyl group thereof is substituted with a fluorine atom. As non-nucleophilic anions represented by X⁻ are particularly preferable perfluoroalkanesulfonic acid anions having from 1 to 8 carbon atoms, and most preferable a nonafluorobutane-sulfonic acid anion and a perfluorooctanesulfonic acid anion.

Preferred specific examples of compounds represented by the general formula (I) of the invention will be given below, but it should not be construed that the invention is limited thereto.

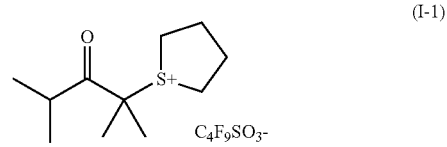

(I-1)

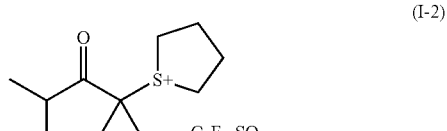

(I-2)

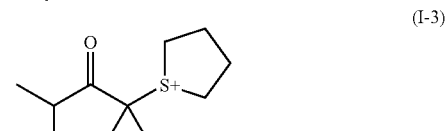

(I-3)

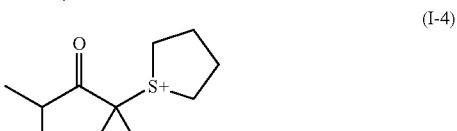

(I-4)

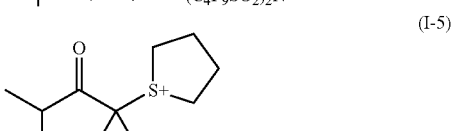

(I-5)

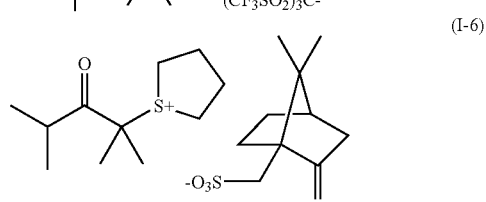

(I-6)

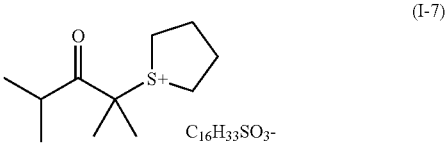

(I-7)

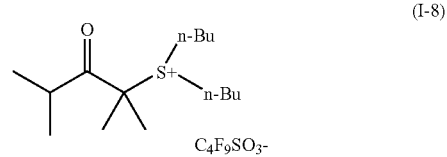

(I-8)

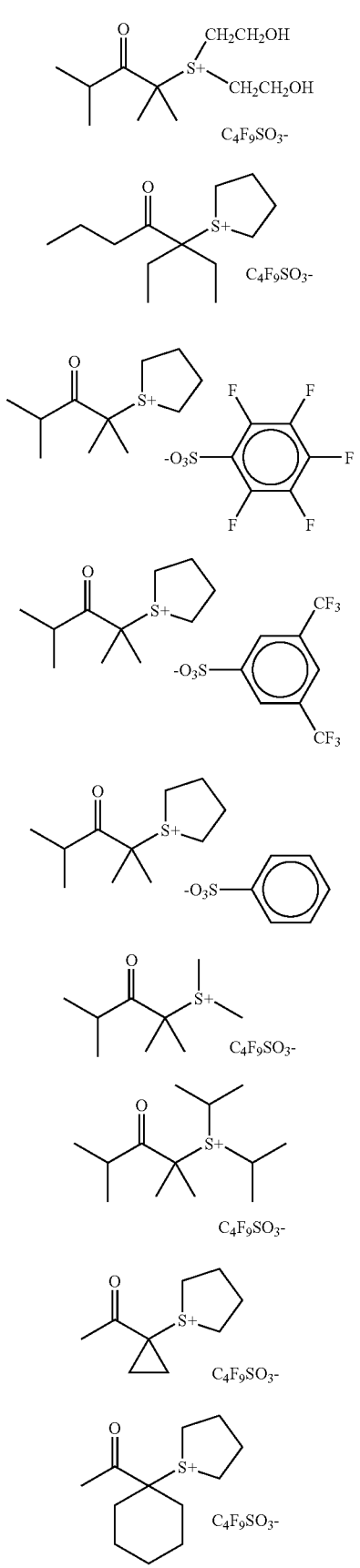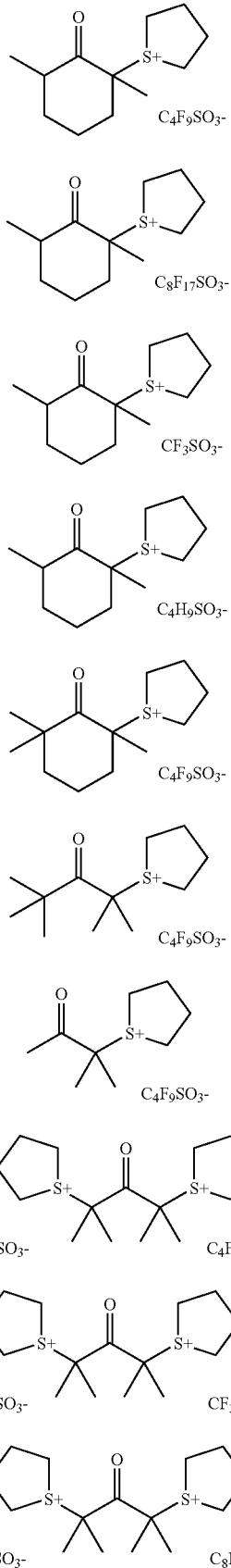

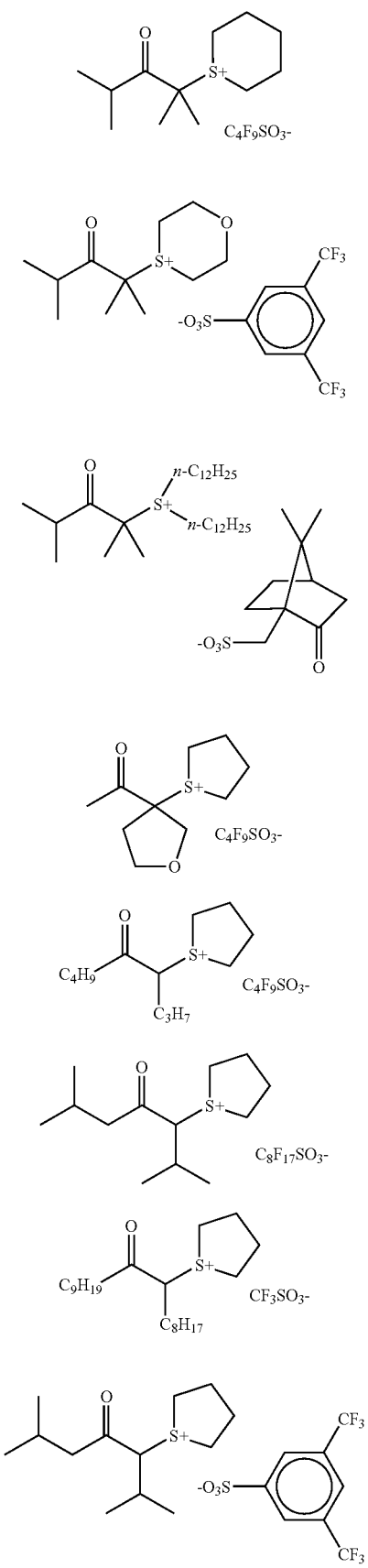

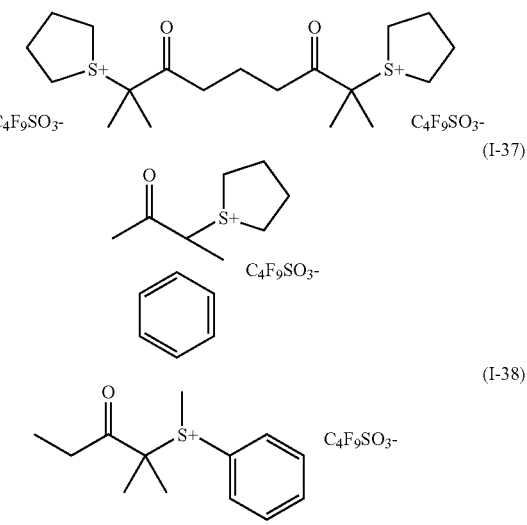

The compounds of the general formula (I) can be used singly or in combination of two or more thereof.

The compound represented by the general formula (I) can be obtained by reacting a corresponding ketone derivative with a trialkylsilyl halogenide under basic conditions to form a silyl enol ether, which is then reacted with sulfoxide to synthesize a sulfonium skeleton, followed by salt exchange with a corresponding anion. As another synthesis method can be enumerated a method of reacting a corresponding 2-halogen-substituted ketone with a sulfide compound in the absence of a catalyst or in the presence of a silver catalyst to synthesize a sulfonium skeleton, followed by salt exchange with a corresponding anion.

The content of the compound as the component (A) in the photosensitive composition of the invention is preferably from 0.1 to 20% by weight, more preferably from 0.5 to 10% by weight, and further preferably from 1 to 7% by weight on a basis of solids content of the composition.

Acid generating compounds that can be used jointly other than the component (A):

In the invention, compounds capable of generating an acid upon irradiation with actinic rays or radiations may further be used jointly, in addition to the component (A).

The content of the photo acid generator that can be used jointly with the component (A) of the invention is usually from 100/0 to 20/80, preferably from 100/0 to 40/60, and more preferably from 100/0 to 50/50 in terms of a molar ratio (component (A)/other acid generator).

As the photo acid generator that can be used jointly can be properly selected and used photo initiators of photo cationic polymerization, photo initiators of photo radical polymerization, photo color fading agents of coloring matters, photo discoloring agents, known compounds capable of generating an acid upon irradiation with actinic rays or radiations, which are used in micro resists, and mixtures thereof.

Examples include diazonium salts, phosphonium salts, sulfonium salts, iodonium slats, imidosulfonates, oxime sulfonates, diazosulfones, disulfones, and o-nitrobenzylsulfonates.

Further, compounds in which a group or compound capable of generating an acid upon irradiation with actinic rays or radiations is introduced into a main chain or side chains of polymer, such as compounds as described in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853, and JP-A-63-146029, can be used.

Moreover, compounds capable of generating an acid by light, as described in U.S. Pat. No. 3,779,778 and European Patent No. 126,712, can be used.

Among compounds capable of being decomposed upon irradiation with actinic rays or radiations to generate an acid, which may be used jointly, are particularly preferable compounds represented by the following general formulae (ZI), (ZII) and (ZIII).

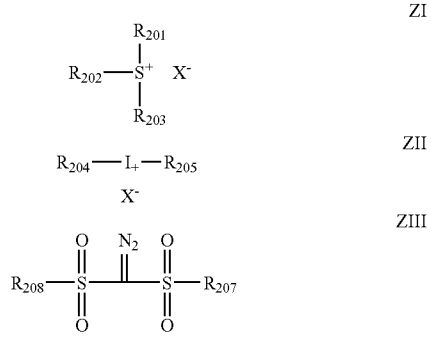

In the general formula (ZI), $R_{201}$, $R_{202}$ and $R_{203}$ each independently represents an organic group.

$X^-$ represents a non-nucleophilic anion, and examples include those the same as in $X^-$ in the general formula (I).

The number of carbon atoms of the organic group represented by $R_{201}$, $R_{202}$ and $R_{203}$ is in general from 1 to 30, and preferably from 1 to 20.

Further, two of $R_{201}$, $R_{202}$ and $R_{203}$ may be bonded to each other to form a ring structure, and the ring may contain an oxygen atom, a sulfur atom, an ester bond, an amide bond, or a carbonyl group.

Examples of groups formed when two of $R_{201}$, $R_{202}$ and $R_{203}$ are bonded to each other include an alkylene group (such as a butylene group and a pentylene group).

Specific examples of organic groups represented by $R_{201}$, $R_{202}$ and $R_{203}$ include corresponding groups in compounds (Z1-1), (Z1-2) and (Z1-3) as described later.

Incidentally, compounds having a plurality of structures represented by the general formula (ZI) may be used. For example, compounds in which at least one of $R_{201}$ to $R_{203}$ of a compound represented by the general formula (ZI) is bonded to at least one of $R_{201}$ to $R_{203}$ of another compound represented by the general formula (ZI) may be used.

In addition, the following compounds (Z1-1), (Z1-2) and (Z1-3) can be enumerated as preferred examples of the component (ZI).

The compound (Z1-1) is an arylsulfonium compound represented by the general formula (ZI) wherein at least one of $R_{201}$ to $R_{203}$ is an aryl group, i.e., a compound in which the arylsulfonium is a cation.

In the arylsulfonium compound, all of $R_{201}$ to $R_{203}$ may be an aryl group, or a part of $R_{201}$ to $R_{203}$ may be an aryl group, with the remainder being an alkyl group.

Examples of arylsulfonium compounds include triarylsulfonium compounds, diarylalkylsulfonium compounds, and aryldialkylsulfonium compounds.

As the aryl group of the arylsulfonium compound are preferable a phenyl group and a naphthyl group, and more preferable a phenyl group. In the case where the arylsulfonium compound contains two or more aryl groups, the two or more aryl groups may be the same or different.

As the alkyl group that the arylsulfonium compound contains as the need arises are preferable linear, branched or cyclic alkyl groups having from 1 to 15 carbon atoms. Examples include a methyl group, an ethyl group, a propyl group, an n-butyl group, a sec-butyl group, a t-butyl group, a cyclopropyl group, a cyclobutyl group, and a cyclohexyl group.

The aryl group and alkyl group represented by $R_{201}$ to $R_{203}$ may have a substituent such as an alkyl group (such as those having from 1 to 15 carbon atoms), an aryl group (such as those having from 6 to 14 carbon atoms), an alkoxy group (such as those having from 1 to 15 carbon atoms), a halogen atom, a hydroxyl group, and a phenylthio group. The substituent is preferably a linear, branched or cyclic alkyl group having from 1 to 12 carbon atoms or a linear, branched or cyclic alkoxy group having from 1 to 12 carbon atoms, and most preferably an alkyl group having from 1 to 4 carbon atoms or an alkoxy group having from 1 to 4 carbon atoms. The substituent may be substituted on any one of $R_{201}$ to $R_{203}$ or all of $R_{201}$ to $R_{203}$. Further, in the case where $R_{201}$ to $R_{203}$ are an aryl group, it is preferred that the substituent is substituted at the p-position of the aryl group.

Next, the compound (Z1-2) will be described below.

The compound (Z1-2) is a compound represented by the general formula (ZI) wherein $R_{201}$ to $R_{203}$ each independently represents an aromatic ring-free organic group. However, the compound (Z1-2) does not include compounds represented by the general formula (I). Here, the term "aromatic ring" also includes a hetero atom-containing aromatic ring.

The aromatic ring-free organic group represented by $R_{201}$ to $R_{203}$ generally has from 1 to 30 carbon atoms, and preferably from 1 to 20 carbon atoms.

$R_{201}$ to $R_{203}$ each independently preferably represents an alkyl group, a 2-oxoalkyl group, an alkoxycarbonylmethyl group, an allyl group, or a vinyl group, more preferably a linear, branched or cyclic 2-oxoalkyl group or an alkoxycarbonylmethyl group, and most preferably a linear, branched or cyclic 2-oxoalkyl group.

The alkyl group represented by $R_{201}$ to $R_{203}$ may be linear, branched or cyclic, and preferred examples include linear or branched alkyl groups having from 1 to 10 carbon atoms (such as a methyl group, an ethyl group, a propyl group, a butyl group, and a pentyl group) and cyclic alkyl groups having from 3 to 10 carbon atoms (such as a cyclopentyl group, a cyclohexyl group, and a norbornyl group).

The 2-oxoalkyl group represented by $R_{201}$ to $R_{203}$ may be linear, branched or cyclic, and preferred examples include groups having >C=O at the 2-position of the alkyl group thereof.

As the alkoxy group in the alkoxycarbonylmethyl group represented by $R_{201}$ to $R_{203}$ are preferable alkoxy groups having from 1 to 5 carbon atoms (such as a methoxy group, an ethoxy group, a propoxy group, a butoxy group, and a pentoxy group).

$R_{201}$ to $R_{203}$ may further be substituted with a halogen atom, an alkoxy group (such as those having from 1 to 5 carbon atoms), a hydroxyl group, a cyano group, or a nitro group.

Two of $R_{201}$ to $R_{203}$ may be bonded to each other to form a ring structure, and the ring may contain an oxygen atom, a sulfur atom, an ester bond, an amide bond, or a carbonyl group. Examples of groups formed when two of $R_{201}$ to $R_{203}$ are bonded to each other include alkylene groups (such as a butylene group and a pentylene group).

The compound (Z1-3) is a compound represented by the following general formula (Z1-3), which is compound having a phenacylsulfonium salt structure.

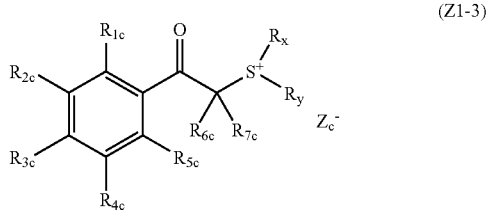

(Z1-3)

$R_{1c}$ to $R_{5c}$ each independently represents a hydrogen atom, an alkyl group, an alkoxy group, or a halogen atom.

$R_{6c}$ and $R_{7c}$ each independently represents a hydrogen atom or an alkyl group.

Rx and Ry each independently represents an alkyl group, a 2-oxoalkyl group, an alkoxycarbonylmethyl group, an allyl group, or a vinyl group.

Two of $R_{1c}$ to $R_{5c}$, or Rx and Ry may be bonded to each other to form a ring structure, and the ring structure may contain an oxygen atom, a sulfur atom, an ester bond, or an amide bond.

Zc⁻ represents a non-nucleophilic anion, and examples include those the same as in the non-nucleophilic anion in the general formula (I).

The alkyl group represented by $R_{1c}$ to $R_{5c}$ may be linear, branched or cyclic, and examples include alkyl groups having from 1 to 10 carbon atoms. Preferred examples include linear or branched alkyl groups having from 1 to 5 carbon atoms (such as a methyl group, an ethyl group, a linear or branched propyl group, a linear or branched butyl group, and a linear or branched pentyl group) and cyclic alkyl group groups having from 3 to 8 carbon atoms (such as a cyclopentyl group and a cyclohexyl group).

The alkoxy group represented by $R_{1c}$ to $R_{5c}$ may be linear, branched or cyclic, and examples include alkoxy groups having from 1 to 10 carbon atoms. Preferred examples include linear or branched alkoxy groups having from 1 to 5 carbon atoms (such as a methoxy group, an ethoxy group, a linear or branched propoxy group, a linear or branched butoxy group, and a linear or branched pentoxy group) and cyclic alkyl group groups having from 3 to 8 carbon atoms (such as a cyclopentyloxy group and a cyclohexyloxy group).

Examples of the alkyl group represented by $R_{6c}$ and $R_{7c}$ include those the same as in the alkyl group represented by $R_{1c}$ to $R_{5c}$.

Examples of the alkyl group represented by Rx and Ry include those the same as in the alkyl group represented by $R_{1c}$ to $R_{5c}$.

Examples of the 2-oxoalkyl group include groups having >C=O at the 2-position of the alkyl group represented by $R_{1c}$ to $R_{5c}$.

Examples of the alkoxy group in the alkoxycarbonylmethyl group include those the same as in the alkoxy group represented by $R_{1c}$ to $R_{5c}$.

Examples of groups formed when Rx and Ry are bonded to each other include a butylene group and a pentylene group.

In the general formulae (ZII) and (ZIII), $R_{204}$ to $R_{207}$ each independently represents an optionally substituted aryl group or an optionally substituted alkyl group.

As the aryl group represented by $R_{204}$ to $R_{207}$ are preferable a phenyl group and a naphthyl group, and more preferable a phenyl group.

The alkyl group represented by $R_{204}$ to $R_{207}$ may be linear, branched or cyclic, and preferred examples include linear or branched alkyl groups having from 1 to 10 carbon atoms (such as a methyl group, an ethyl group, a propyl group, a butyl group, and a pentyl group) and cyclic alkyl group groups having from 3 to 10 carbon atoms (such as a cyclopentyl group, a cyclohexyl group, and a norbornyl group).

Examples of substituents which each of $R_{204}$ to $R_{207}$ may have include an alkyl group (such as those having from 1 to 15 carbon atoms), an aryl group (such as those having from 6 to 15 carbon atoms), an alkoxy group (such as those having from 1 to 15 carbon atoms), a halogen atom, a hydroxyl group, and a phenylthio group.

X⁻ represents a non-nucleophilic anion, and examples include those the same as in the non-nucleophilic anion represented by X⁻ in the general formula (I).

Among compounds capable of being decomposed upon irradiation with actinic rays or radiations to generate an acid, which may be used jointly, particularly preferred examples are given below.

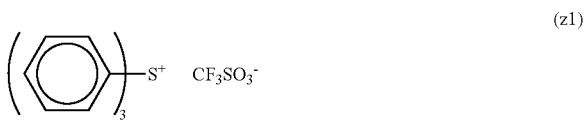

(z1)

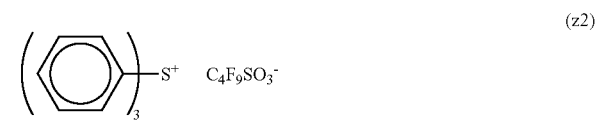

(z2)

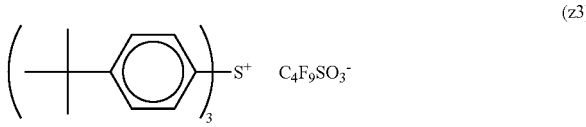

(z3)

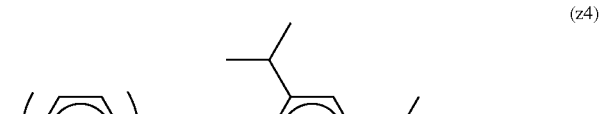

(z4)

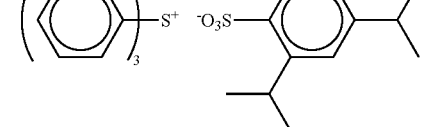

-continued
(z5)
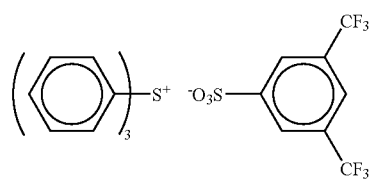
(z6)
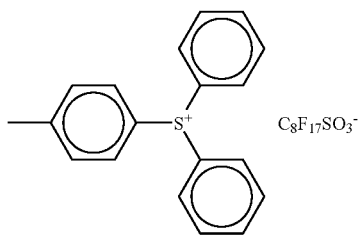
(z7)
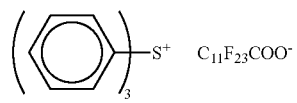
(z8)
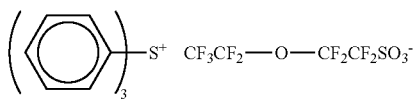
(z9)
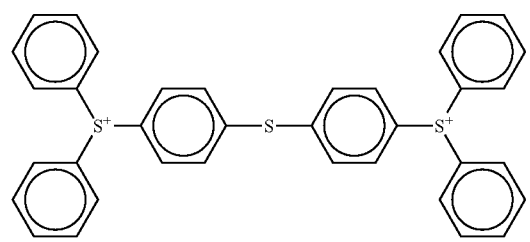
(z10)
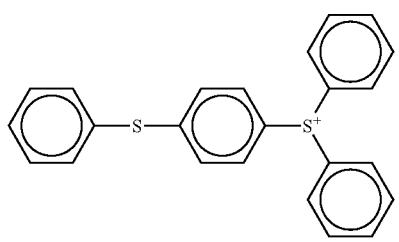
(z11)
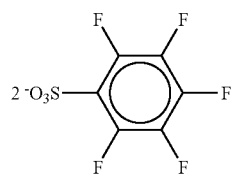
(z12)
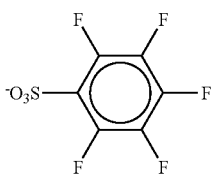
(z13)
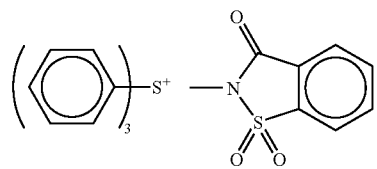
(z14)
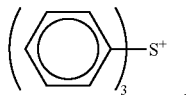
(z15)
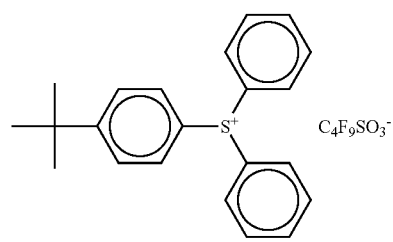
(z16)
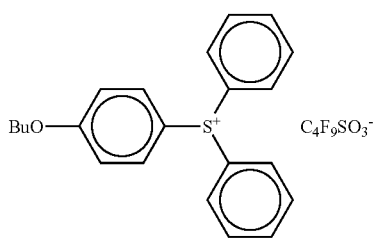
(z17)
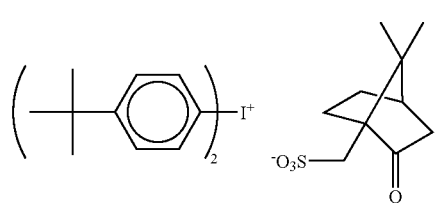
(z18)
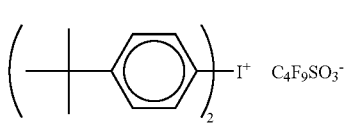

-continued
(z19) 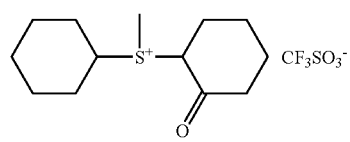
(z20) 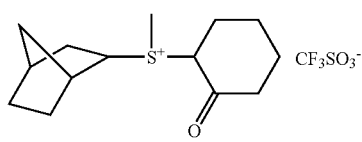
(z21) 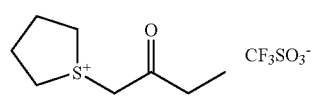
(z22) 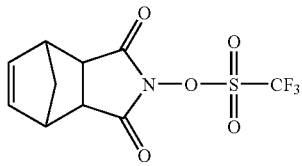
(z23) 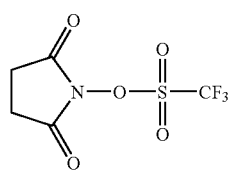
(z24) 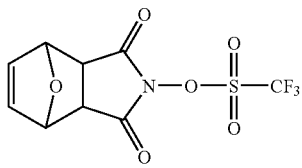
(z25) 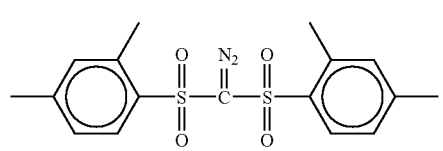
(z26) 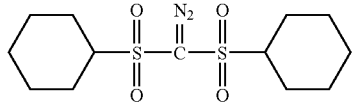
(z27) 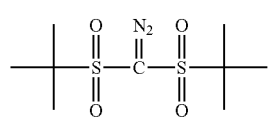
(z28) 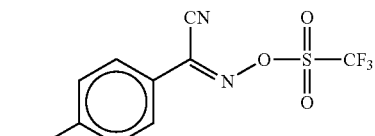
(z29) 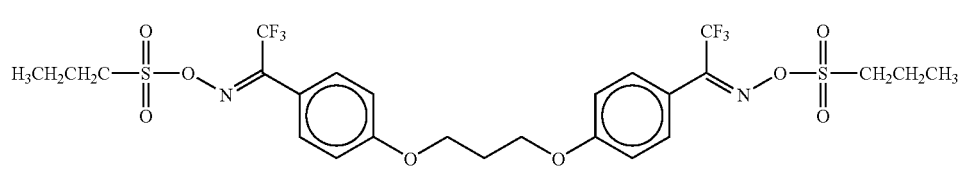
(z30) 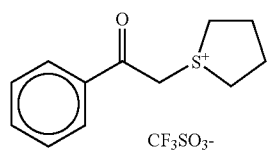
(z31) 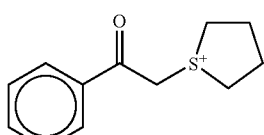
(z32) 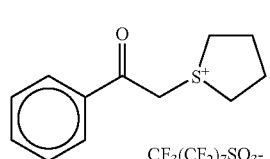
(z33) 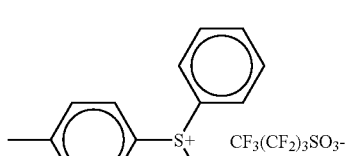
(z34) 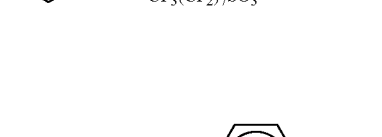
(z35) 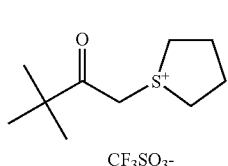

-continued

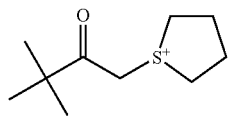
(z36)
CF₃(CF₂)₃SO₃⁻

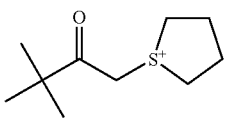
(z37)
CF₃(CF₂)₇SO₃⁻

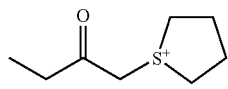
(z38)
CF₃(CF₂)₃SO₃⁻

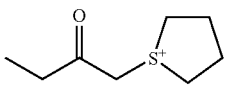
(z39)
CF₃(CF₂)₇SO₃⁻

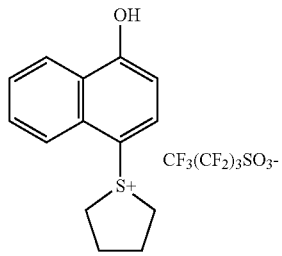
(z40)
CF₃(CF₂)₃SO₃⁻

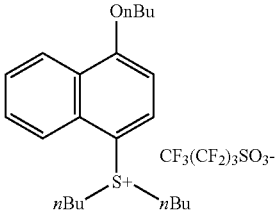
(z41)
CF₃(CF₂)₃SO₃⁻

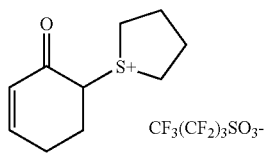
(z42)
CF₃(CF₂)₃SO₃⁻

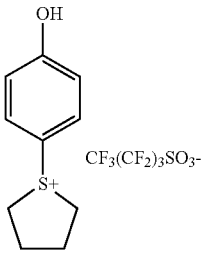
(z-43)
CF₃(CF₂)₃SO₃⁻

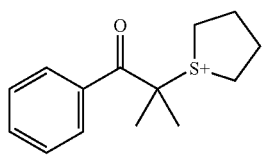
(z-44)
CF₃(CF₂)₃SO₃⁻

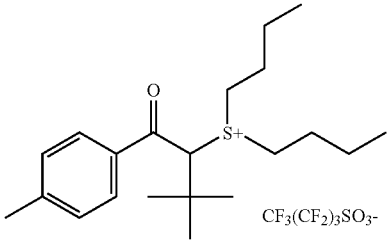
(z-45)
CF₃(CF₂)₃SO₃⁻

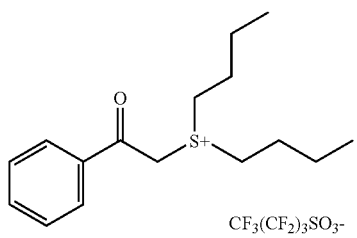
(z-46)
CF₃(CF₂)₃SO₃⁻

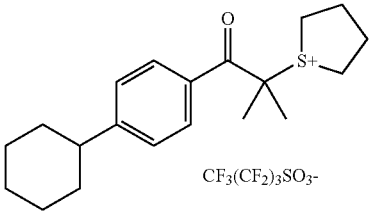
(z-47)
CF₃(CF₂)₃SO₃⁻

(2) (B) resin that is decomposed by the action of an acid, whereby its solubility in an alkaline developer increases (Hereinafter Often Referred to as "Component (B)"):

The resin that is decomposed by the action of an acid, whereby its solubility in an alkaline developer increases, which is used in the positive photosensitive composition of the invention, is a resin having a group capable of being decomposed by an acid (hereinafter often referred to as "acid decomposable group") in the main chain or side chains thereof, or in both the main chain and side chains thereof. Among such resins are more preferable those having a group capable of being decomposed by an acid in the side chains thereof.

The group capable of being decomposed by an acid is preferably a group substituted with a group obtained by splitting off a hydrogen atom of —COOH group or —OH group by an acid.

As the acid decomposable group are preferable a silyl ether group, a cumyl ester group, an acetal group, a tetrahydropyranyl ether group, an enol ether group, an enol ester group, a tertiary alkyl ether group, a tertiary alkyl ester group, and a tertiary alkyl carbonate group, and more preferable a tertiary alkyl ester group, a tertiary alkyl carbonate group, a cumyl ester group, an acetal group, and a tetrahydropyranyl ether group.

A matrix resin to which such a group capable of being decomposed by an acid is bonded as a side chain is an alkali-soluble resin having an —OH or —COOH group in the side chains thereof. Examples include alkali-soluble resins as described later.

Such alkali-soluble resins preferably have an alkali dissolution speed, as measured in 0.261 N tetramethylammonium hydroxide (TMAH) (at 23° C.), of 170 angstroms/sec or more, and more preferably 330 angstroms/sec or more.

From such a point of view, are particularly preferable alkali-soluble resins having a hydroxystyrene structural unit, such as o-, m- or p-poly(hydroxystyrenes) and copolymers thereof, hydrogenated poly(hydroxystyrenes), halogen- or alkyl-substituted poly(hydroxystyrenes), part or O-alkylated or O-acylated compounds of poly(hydroxystyrenes), styrene-hydroxystyrene copolymers, α-methylstyrene-hydroxystyrene copolymers, and hydrogenated novolak resins.

In the invention, preferred examples of repeating units having an acid decomposable group include t-butoxycarbonyloxystyrene, 1-alkoxyethoxystyrenes, and (meth) acrylic acid tertiary alkyl esters.

The component (B) to be used in the invention can be obtained by reacting an alkali-soluble resin with a precursor of a group capable of being decomposed by an acid, or copolymerizing an alkali-soluble resin monomer having a group capable of being decomposed by an acid bonded thereto with various monomers, as described in European Patent No. 254,853, JP-A-2-25850, JP-A-3-223860, and JP-A-4-251259.

Specific examples of the component (B) that is used in the invention will be given below, but it should not be construed that the invention is limited thereto.

p-t-Butoxystyrene/p-hydroxystyrene copolymer
p-(t-Butoxycarbonyloxy)styrene/p-hydroxystyrene copolymer
p-(t-Butoxycarbonylmethyloxy)styrene/p-hydroxystyrene copolymer
p-(t-Butoxycarbonylmethyloxy)-3-methylstyrene/4-hydroxy-3-methylstyrene copolymer
p-(t-Butoxycarbonylmethyloxy)styrene/p-hydroxystyrene (10% hydrogenation compound) copolymer
m-(t-Butoxycarbonylmethyloxy)styrene/m-hydroxystyrene copolymer
o-(t-Butoxycarbonylmethyloxy)styrene/o-hydroxystyrene copolymer
p-(Cumyloxycarbonylmethyloxy)styrene/p-hydroxystyrene copolymer
Cumyl methacrylate/methyl methacrylate copolymer
4-t-Butoxycarbonylstyrene/dimethyl maleate copolymer
Benzyl methacrylate/tetrahydropyranyl methacrylate copolymer
p-(t-Butoxycarbonylmethyloxy)styrene/p-hydroxystyrene/styrene copolymer
p-t-Butoxystyene/p-hydroxystyrene/fumaronitrile copolymer
t-Butoxystyrene/hydroxyethyl methacrylate copolymer
Styrene/N-(4-hydroxyphenyl) maleimide/N-(4-t-butoxycarbonyloxyphenyl) maleimide copolymer
p-Hydroxystyrene/t-butyl methacrylate copolymer
Styrene/p-hydroxystyrene/t-butyl methacrylate copolymer
p-Hydroxystyrene/t-butyl acrylate copolymer
Styrene/p-hydroxystyrene/t-butyl acrylate copolymer
p-(t-Butoxycarbonylmethyloxy)styrene/p-hydroxystyrene/N-methyl maleimide copolymer
t-Butyl methacrylate/1-adamantylmethyl methacrylate copolymer
p-Hydroxystyrene/t-butyl acrylate/p-acetoxystyrene copolymer
p-Hydroxystyrene/t-butyl acrylate/p-(t-butoxycarbonyloxy)styrene copolymer
p-Hydroxystyrene/t-butyl acrylate/p-(t-butoxycarbonylmethyloxy)styrene copolymer

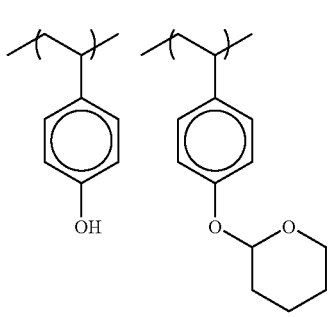

(R-1)

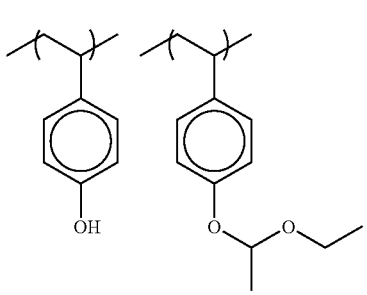

(R-2)

-continued
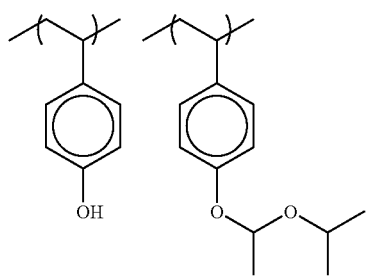 (R-3)
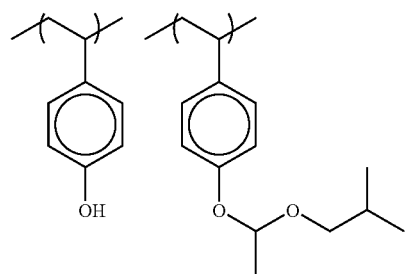 (R-4)
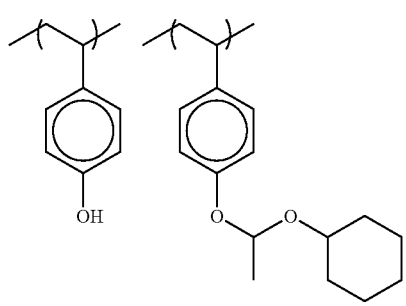 (R-5)
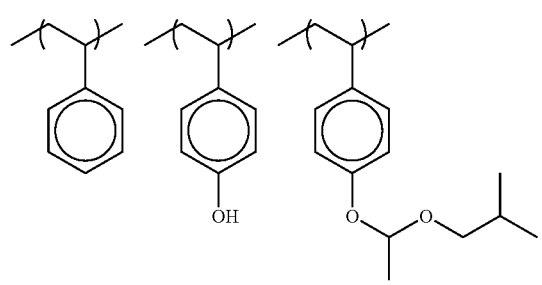 (R-6)
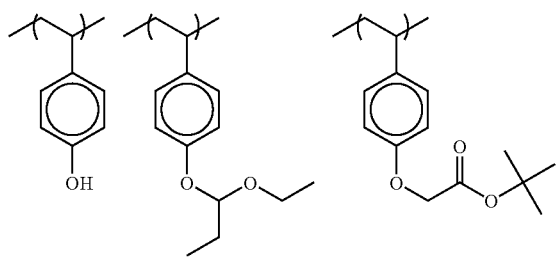 (R-7)
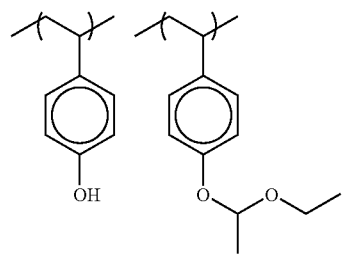 (R-8)
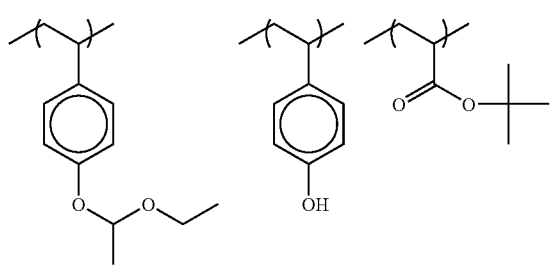 (R-9)
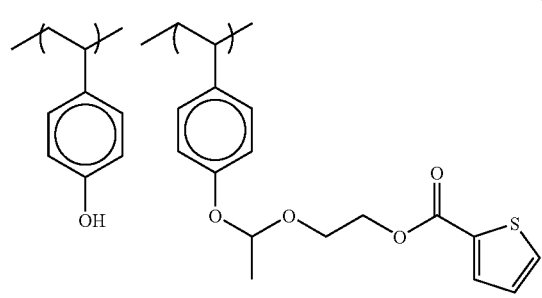 (R-10)

-continued
(R-11)
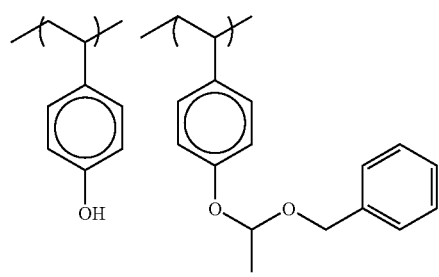
(R-12)
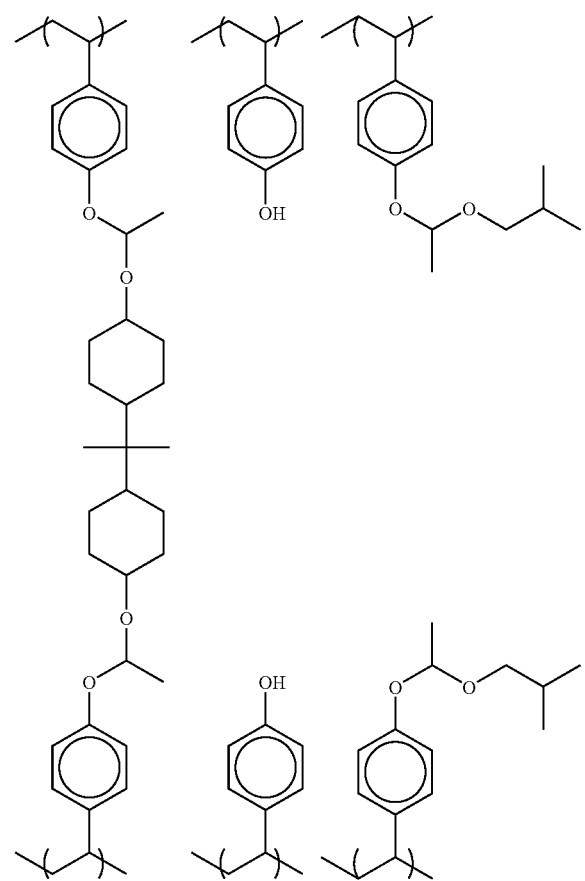
(R-13)
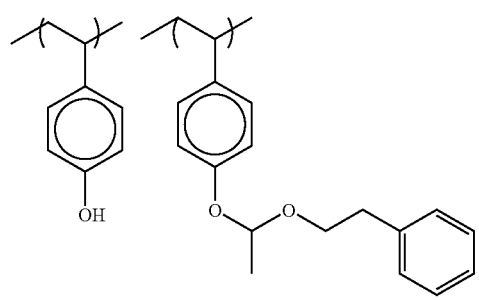
(R-14)
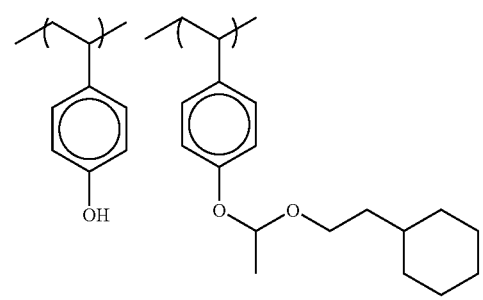
(R-15)
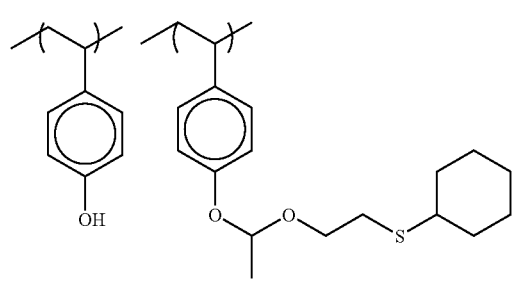
(R-16)
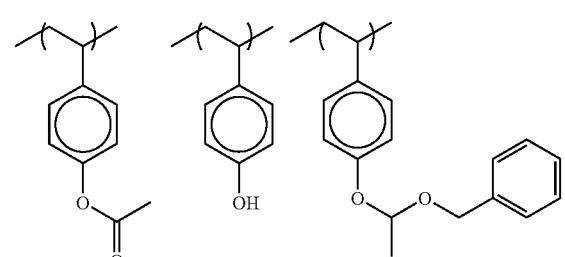

-continued
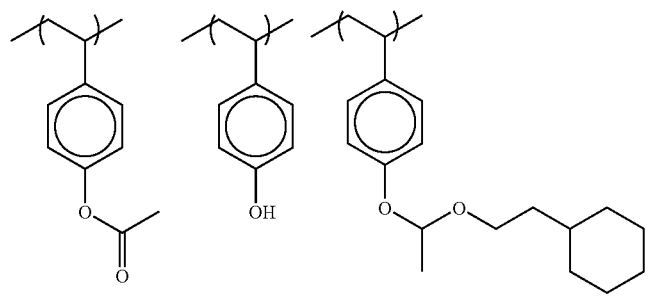
(R-17)
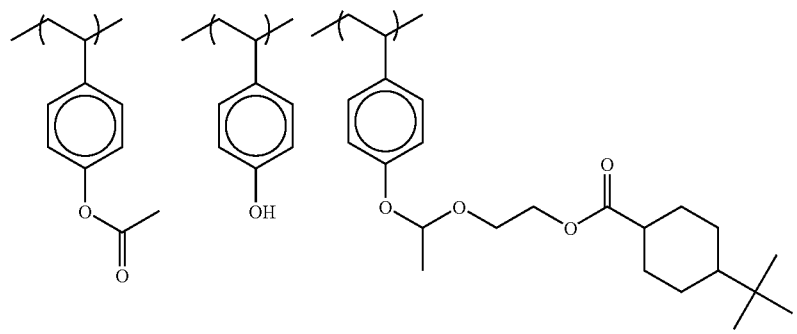
(R-18)
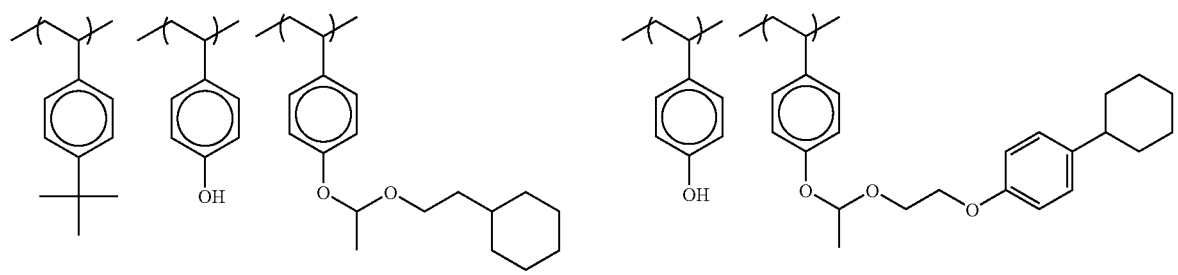
(R-19) (R-20)
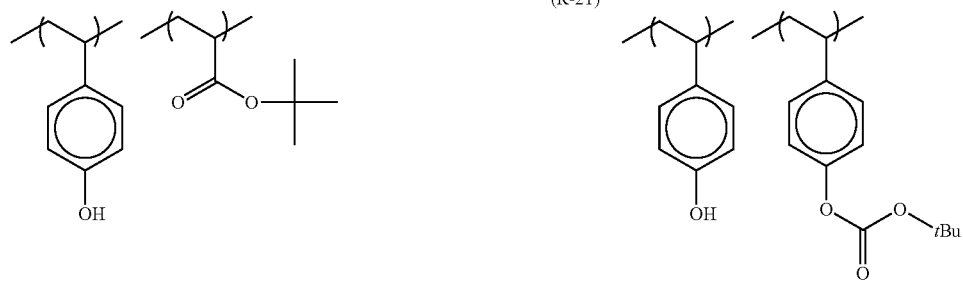
(R-21) (R-22)
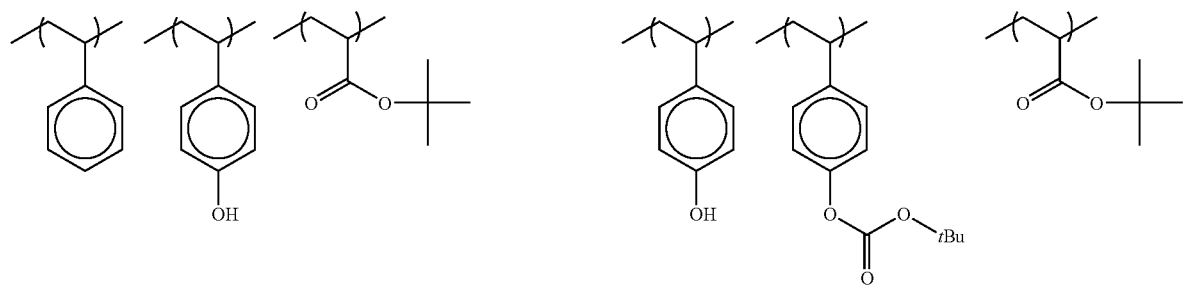
(R-23) (R-24)

In the foregoing specific examples, tBu represents a t-butyl group.

The content of the group capable of being decomposed by an acid is expressed by B/(B+S) wherein B represents a number of groups capable of being decomposed by an acid in the resin, and S represents a number of alkali-soluble groups not protected by a group capable of being split off by an acid. The content is preferably from 0.01 to 0.7, more preferably from 0.05 to 0.50, and further preferably from 0.05 to 0.40.

In the case where the positive photosensitive composition of the invention is irradiated with ArF excimer laser, it is preferred that the resin of the component (B) is a resin having a monocyclic or polycyclic alicyclic hydrocarbon structure, which is decomposed by the action of an acid, whereby its solubility in an alkaline developer increases.

As the resin having a monocyclic or polycyclic alicyclic hydrocarbon structure, which is decomposed by the action of an acid, whereby its solubility in an alkaline developer increases (the resin being hereinafter often referred to as "alicyclic hydrocarbon based acid decomposable resin"), are preferable resins containing at least one member selected from the group consisting of repeating units each having a partial structure containing an alicyclic hydrocarbon represented by any of the following general formulae (pI) to (pVI) and a repeating unit represented by the following general formula (II-AB).

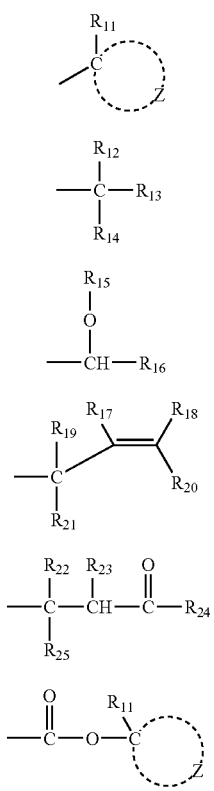

In the foregoing general formulae, $R_{11}$ represents a methyl group, an ethyl group, an n-propyl group, an isopropyl group, an n-butyl, an isobutyl group, or a sec-butyl group; and Z represents an atomic group necessary for forming an alicyclic hydrocarbon group together with the carbon atom.

$R_{12}$ to $R_{16}$ each independently represents a linear or branched alkyl group having from 1 to 4 carbon atoms or an alicyclic hydrocarbon group, provided that at least one of $R_{12}$ to $R_{14}$, or any one of $R_{15}$ and $R_{16}$ represents an alicyclic hydrocarbon group.

$R_{17}$ to $R_{21}$ each independently represents a hydrogen atom, a linear or branched alkyl group having from 1 to 4 carbon atoms, or an alicyclic hydrocarbon group, provided that at least one of $R_{17}$ to $R_{21}$ represents an alicyclic hydrocarbon group and that any one of $R_{19}$ and $R_{21}$ represents a linear or branched alkyl group having from 1 to 4 carbon atoms or an alicyclic hydrocarbon group.

$R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group and that any one of $R_{23}$ and $R_{24}$ may be bonded to each other to form a ring.

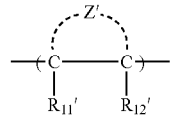

(II-AB)

In the general formula (II-AB), $R_{11}'$ and $R_{12}'$ each independently represents a hydrogen atom, a cyano group, a halogen atom, or an optionally substituted alkyl group; and Z' represents an atomic group necessary for forming an optionally substituted alicyclic structure, containing bonded two carbon atoms (C—C).

The general formula (II-AB) is further preferably the following general formula (II-A) or (II-B).

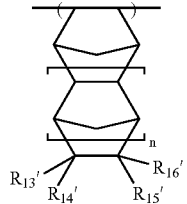

(II-A)

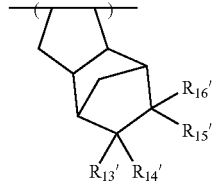

(II-B)

In the general formulae (II-A) and (II-B):

$R_{13}'$ to $R_{16}'$ each independently represents a hydrogen atom, a halogen atom, a cyano group, —COOH, —COOR$_5$, a group that is decomposed by the action of an acid, —C(=O)—X—A'—$R_{17}'$, or an optionally substituted alkyl group or cyclic hydrocarbon group.

Here, $R_5$ represents an optionally substituted alkyl group or cyclic hydrocarbon group, or a —Y group as described below.

X represents an oxygen atom, a sulfur atom, —NH—, —NHSO$_2$—, or —NHSO$_2$NH—.

A' represents a single bond or a divalent connecting group.

At least two of $R_{13}'$ to $R_{16}'$ may be bonded to each other to form a ring, and n is 0 or 1.

$R_{17}'$ represents —COOH, —COOR$_5$, —CN, a hydroxyl group, an optionally substituted alkoxy group, —CO—NH—R$_6$, —CO—NH—SO$_2$—R$_6$, or a —Y group as described below.

$R_6$ represents an optionally substituted alkyl group or cyclic hydrocarbon group.

—Y group:

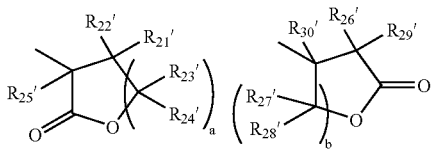

In the —Y group, $R_{21}'$ to $R_{30}'$ each independently represents a hydrogen atom or an optionally substituted alkyl group; and a and b are each 1 or 2.

In the general formulae (pI) to (pVI), the alkyl group represented by $R_{12}$ to $R_{25}$ represents a substituted or unsubstituted, linear or branched alkyl group having from 1 to 4 carbon atoms. Examples of alkyl groups include a methyl group, an ethyl group, an n-propyl group, an isopropyl group, an n-butyl group, an isobutyl group, a sec-butyl group, and a t-butyl group.

Examples of substituents that may be further substituted on the foregoing alkyl group include an alkoxy group having from 1 to 4 carbon atoms, a halogen atom (such as a fluorine atom, a chlorine atom, a bromine atom, and an iodine atom), an acyl group, an acyloxy group, a cyano group, a hydroxyl group, a carboxy group, an alkoxycarbonyl group, and a nitro group.

The alicyclic hydrocarbon group represented by $R_{11}$ to $R_{25}$ or the alicyclic hydrocarbon group formed by Z and the carbon atom may be monocyclic or polycyclic. Specific examples include groups having a structure of 5 or more carbon atoms, such as monocyclo, bicyclo, tricyclo, and tetracyclo structures, preferably those having from 6 to 30 carbon atoms, and particularly preferably those having from 7 to 25 carbon atoms. These alicyclic hydrocarbon groups may have a substituent.

As the alicyclic hydrocarbon group are preferable an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group, and more preferable an adamantyl group, a decalin residue, a norbornyl group, a cedrol group, a cyclohexyl group, a cycloheptyl group, a cyclooctyl group, a cyclodecanyl group, and a cyclodecanyl group.

Examples of substituents of these alicyclic hydrocarbon groups include an alkyl group, a substituted alkyl group, a halogen atom, a hydroxyl group, an alkoxy group, a carboxyl group, and an alkoxycarbonyl group. The alkyl group is preferably a lower alkyl group such as a methyl group, an ethyl group, a propyl group, an isopropyl group, and a butyl group, and more preferably a substituent selected from the group consisting of a methyl group, an ethyl group, a propyl group, and an isopropyl group. Examples of the substituent of the substituted alkyl group include a hydroxyl group, a halogen atom, and an alkoxy group. Examples of alkoxy groups include those having from 1 to 4 carbon atoms such as a methoxy group, an ethoxy group, a propoxy group, and a butoxy group.

In the foregoing resin, the structures represented by the general formulae (pI) to (pVI) can be used for protecting the alkali-soluble group. As the alkali-soluble soluble, various groups that are known in this technical field can be enumerated.

Specific examples include a carboxylic acid group, a sulfonic acid group, a phenol group, and a thiol group, with a carboxylic acid group and a sulfonic acid group being preferred.

In the foregoing resins, as the alkali-soluble groups protected by the structures represented by the general formulae (pI) to (pVI) are preferable structures in which the hydrogen atom of carboxyl group is substituted with a structure represented by any of the general formulae (pI) to (pVI).

As the repeating unit having an alkali-soluble group protected by the structure of any of the general formulae (pI) to (pVI) is preferable a repeating unit represented by the following general formula (pA).

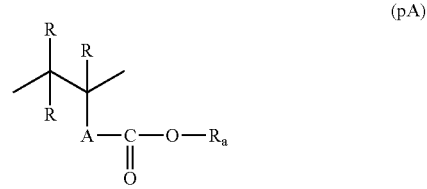

(pA)

Here, R represents a hydrogen atom, a halogen atom, or a substituted or unsubstituted, linear or branched alkyl group having from 1 to 4 carbon atoms. A plurality of Rs' may be the same or different.

A represents a single group or a combination of two or more groups selected from the group consisting of a single bond, an alkylene group, a substituted alkylene group, an ether group, a thioether group, a carbonyl group, an ester group, an amide group, a sulfonamide group, a urethane group, and a urea group.

Ra represents a group of any of the foregoing general formulae (pI) to (pVI).

The repeating unit represented by the general formula (pA) is most preferably a repeating unit by a 2-alkyl-2-adamantyl (meth)acrylate or a dialkyl (1-adamantyl)methyl (meth)acrylate.

Specific examples of the repeating unit represented by the general formula (pA) will be given below.

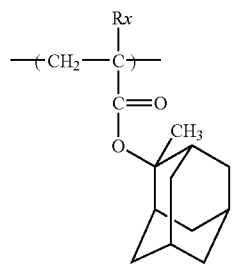

1

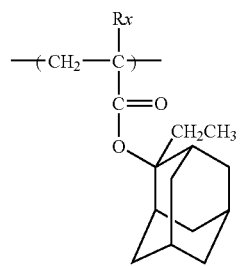
2
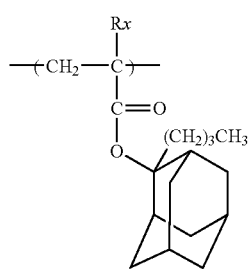
3
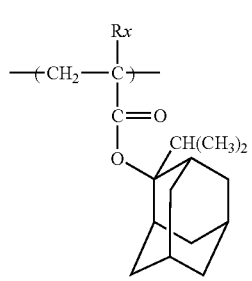
4
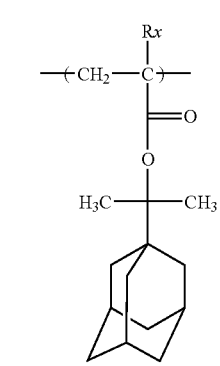
5
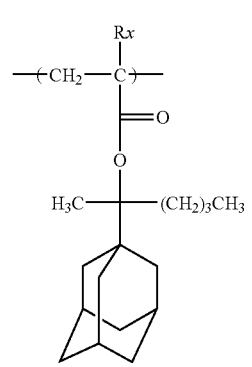
6
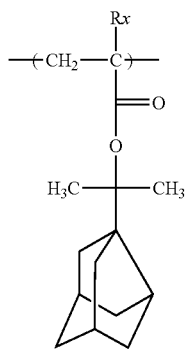
7
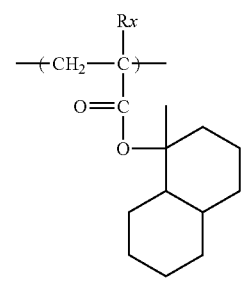
8
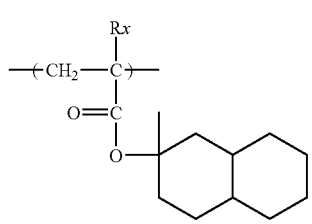
9
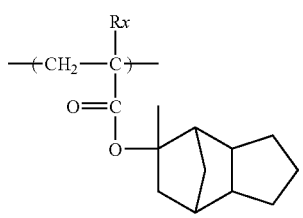
10
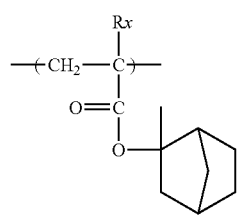
11
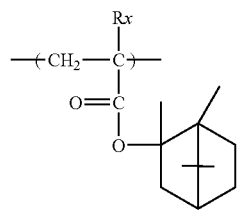
12

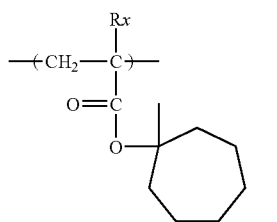

13

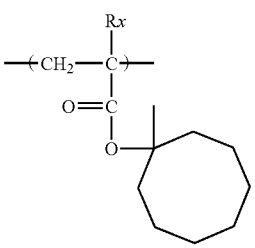

14

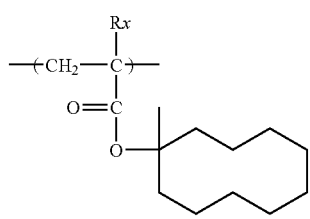

15

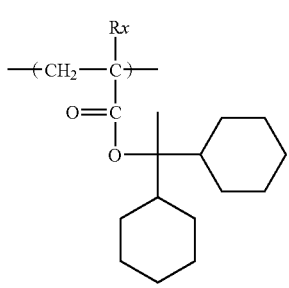

16

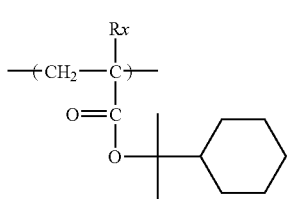

17

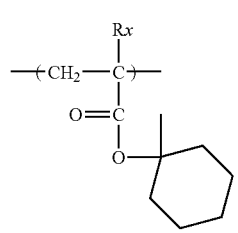

18

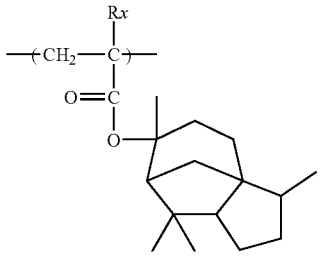

19

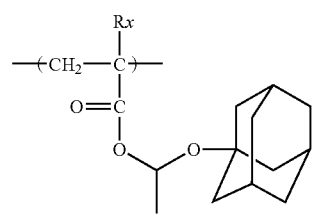

20

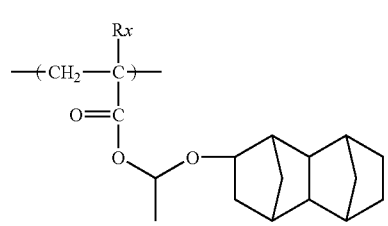

21

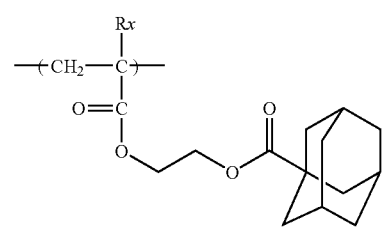

22

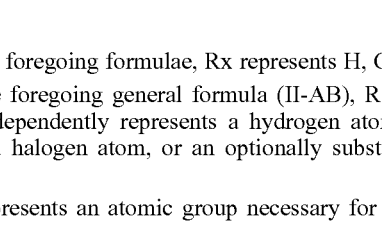

23

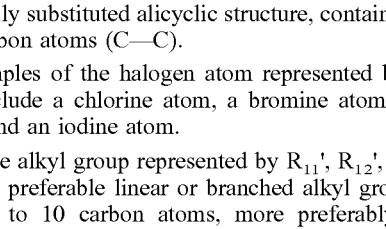

In the foregoing formulae, Rx represents H, $CH_3$ or $CF_3$.

In the foregoing general formula (II-AB), $R_{11}'$ and $R_{12}'$ each independently represents a hydrogen atom, a cyano group, a halogen atom, or an optionally substituted alkyl group.

Z' represents an atomic group necessary for forming an optionally substituted alicyclic structure, containing bonded two carbon atoms (C—C).

Examples of the halogen atom represented by $R_{11}'$ and $R_{12}'$ include a chlorine atom, a bromine atom, a fluorine atom, and an iodine atom.

As the alkyl group represented by $R_{11}'$, $R_{12}'$, and $R_{21}'$ to $R_{30}'$ are preferable linear or branched alkyl groups having from 1 to 10 carbon atoms, more preferably linear or branched alkyl groups having from 1 to 6 carbon atoms, and further preferable a methyl group, an ethyl group, a propyl group, an isopropyl group, an n-butyl group, an isobutyl group, a sec-butyl group, or a t-butyl group.

Examples of substituents that may be further substituted on the foregoing alkyl group a hydroxyl group, a halogen atom, a carboxyl group, an alkoxy group, an acyl group, a cyano group, and an acyloxy group. Examples of halogen atoms include a chlorine atom, a bromine atom, a fluorine atom, and an iodine atom; examples of alkoxy groups include those having from 1 to 4 carbon atoms such as a methoxy group, an ethoxy group, a propoxy group, and a butoxy group; examples of acyl groups include a formyl group and an acetyl group; and examples of acyloxy groups include an acetoxy group.

The atomic group for forming the alicyclic structure of Z' is an atomic group for forming a repeating unit of an optionally substituted alicyclic hydrocarbon in a resin. Among such atomic groups are preferable those for forming a bridged alicyclic structure to form a repeating unit of a bridged alicyclic hydrocarbon.

Examples of skeletons of alicyclic hydrocarbons to be formed include those the same as in the alicyclic hydrocarbon group represented by $R_{11}$ to $R_{25}$ in the general formulae (pI) to (pVI).

The skeleton of the alicyclic hydrocarbon may have a substituent. Examples of such substituents include $R_{13}'$ to $R_{16}'$ in the general formula (II-A) or (II-B).

Of the repeating units having a bridged alicyclic hydrocarbon are more preferable repeating units represented by the general formula (II-A) or (II-B).

In the alicyclic hydrocarbon based acid decomposable resin according to the invention, the acid decomposable group may be contained in the foregoing —C(=O)—X-A'-$R_{17}'$, or may be contained as a substituent of Z' of the general formula (II-AB).

The structure of the acid decomposable group is represented by —C(=O)—$X_1$—$R_0$.

In the formula, as $R_0$ are enumerated a tertiary alkyl group (such as a t-butyl group and a t-amyl group), an isoboronyl group, a 1-alkoxyethyl group (such as a 1-ethoxyethyl group, a 1-butoxyethyl group, a 1-isobutoxyethyl group, and a 1-cyclohexyloxyethyl group), an alkoxymethyl group (such as a 1-methoxymethyl group and a 1-ethoxymethyl group), a 3-oxoalkyl group, a tetrahydropyranyl group, a tetrahydrofuranyl group, a trialkylsilyl ester group, a 3-oxocyclohexyl ester group, a 2-methyl-2-adamantyl group, and a mevalonic lactone residue. $X_1$ is synonymous with X.

Examples of the halogen atom represented by $R_{13}'$ to $R_{16}'$ include a chlorine atom, a bromine atom, a fluorine atom, and an iodine atom.

As the alkyl group represented by $R_5$, $R_6$, and $R_{13}'$ to $R_{16}'$ are preferable linear or branched alkyl groups having from 1 to 10 carbon atoms, more preferable linear or branched alkyl groups having from 1 to 6 carbon atoms, and further preferable a methyl group, an ethyl group, a propyl group, an isopropyl group, an n-butyl group, an isobutyl group, a sec-butyl group, or a t-butyl group.

Examples of the cyclic hydrocarbon group represented by $R_5$, $R_6$, and $R_{13}'$ to $R_{16}'$ include cyclic alkyl groups and bridged hydrocarbons, such as a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

Examples of the ring formed when at least two of $R_{13}'$ to $R_{16}'$ are bonded to each other include rings having from 5 to 12 carbon atoms such as cyclopentene, cyclohexene, cycloheptane, and cyclooctane.

Examples of the alkoxy group represented by $R_{17}'$ include those having from 1 to 4 carbon atoms such as a methoxy group, an ethoxy group, a propoxy group, and a butoxy group.

Examples of substituents that may be further substituted on the foregoing alkyl group, cyclic hydrocarbon group and alkoxy group include a hydroxyl group, a halogen atom, a carboxyl group, an alkoxy group, an acyl group, a cyano group, an acyloxy group, an alkyl group, and a cyclic hydrocarbon group. Examples of halogen atoms include a chlorine atom, a bromine atom, a fluorine atom, and an iodine atom; examples of alkoxy groups include those having from 1 to 4 carbon atoms such as a methoxy group, an ethoxy group, a propoxy group, and a butoxy group; examples of acyl groups include a formyl group and an acetyl group; and examples of acyloxy groups include an acetoxy group.

Examples of alkyl groups and cyclic hydrocarbon groups include those as enumerated above.

As the divalent connecting group of A' is enumerated a single group or a combination of two or more groups selected from the group consisting of an alkylene group, a substituted alkylene group, an ether group, a thioether group, a carbonyl group, an ester group, an amide group, a sulfonamide group, a urethane group, and a urea group.

In the alicyclic hydrocarbon based acid decomposable resin according to the invention, the group that is decomposed by the action of an acid can contain at least one repeating unit of repeating units having a partial structure containing an alicyclic hydrocarbon represented by any of the foregoing general formulae (pI) to (pVI), repeating units represented by the general formula (II-AB), and repeating units of copolymerization components as described later.

Various substituents of $R_{13}'$ to $R_{16}'$ in the general formula (II-A) or (II-B) may be a substituent of the atomic group for forming the alicyclic structure in the general formula (II-AB) or the atomic group Z for forming the bridged alicyclic structure.

Specific examples of the repeating unit represented by the general formula (II-A) or (II-B) will be given below, but it should not be construed that the invention is limited thereto.

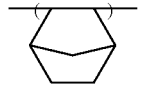

[II-1]

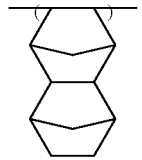

[II-2]

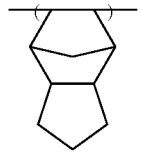

[II-3]

-continued
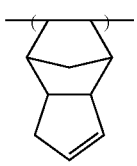 [II-4]
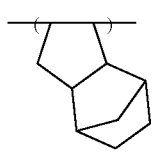 [II-5]
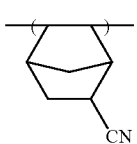 [II-6]
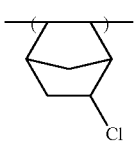 [II-7]
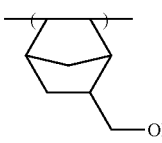 [II-8]
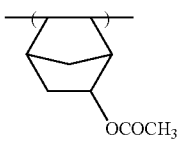 [II-9]
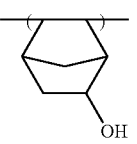 [II-10]
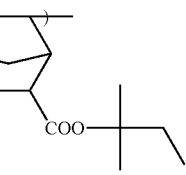 [II-11]
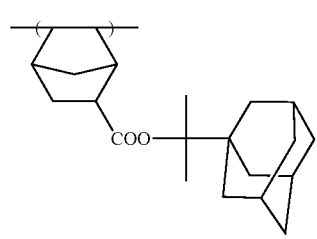 [II-12]
-continued
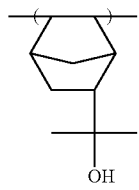 [II-13]
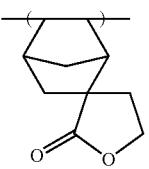 [II-14]
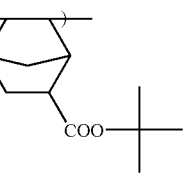 [II-15]
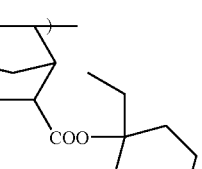 [II-16]
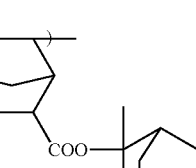 [II-17]
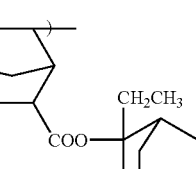 [II-18]
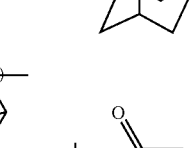 [II-19]
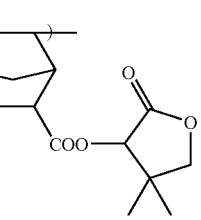 [II-20]

[II-21] 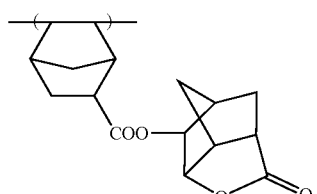

[II-22] 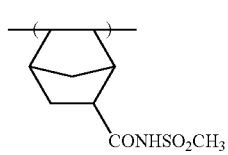

[II-23] 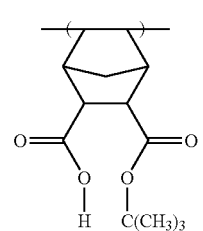

[II-24] 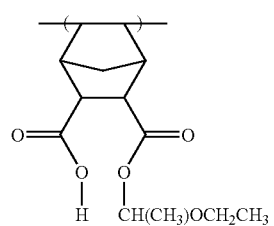

[II-25] 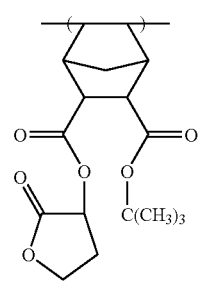

[II-26] 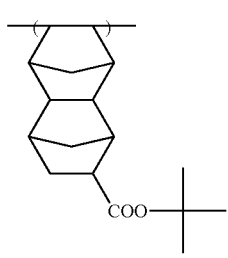

[II-27] 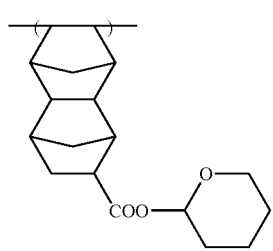

[II-28] 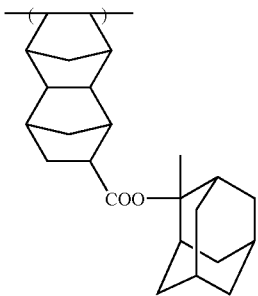

[II-29] 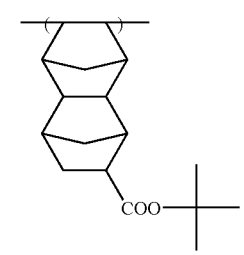

[II-30] 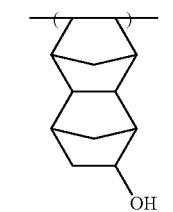

[II-31] 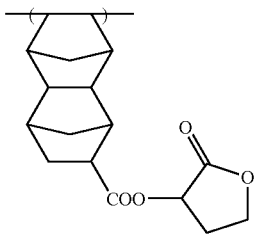

[II-32] 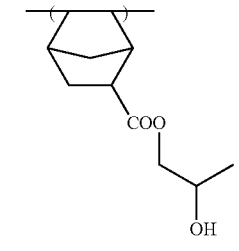

The alicyclic hydrocarbon based acid decomposable resin of the invention preferably contains a lactone group, and more preferably a repeating unit having a lactone structure represented by the following general formula (Lc) or any of the following general formulae (V-1) to (V-5). The group containing a lactone structure may be bonded directly to the main chain.

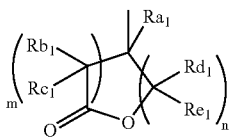
(Lc)

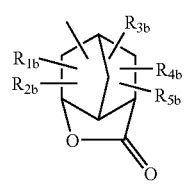
(V-1)

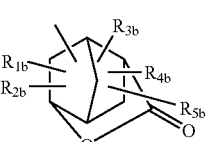
(V-2)

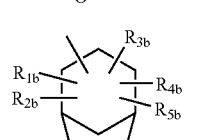
(V-3)

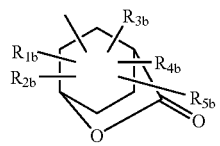
(V-4)

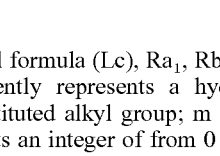
(V-5)

In the general formula (Lc), $Ra_1$, $Rb_1$, $Rc_1$, $Rd_1$, and $Re_1$ each independently represents a hydrogen atom or an optionally substituted alkyl group; m and n each independently represents an integer of from 0 to 3; and (m+n) is 2 or more and 6 or less.

In the general formulae (V-1) to (V-5), $R_{1b}$ to $R_{5b}$ each independently represents a hydrogen atom or an optionally substituted alkyl group, cycloalkyl group, alkoxy group, alkoxycarbonyl, alkylsulfonylimino or alkenyl group; and two of $R_{1b}$ to $R_{5b}$ may be bonded to each other to form a ring.

As the alkyl group represented by $Ra_1$ to $Re_1$ in the general formula (Lc) and the alkyl group in the alkyl group, alkoxy group, alkoxycarbonyl group or alkylsulfonylimino group represented by $R_{1b}$ to $R_{5b}$ in the general formulae (V-1) to (V-5) are enumerated optionally substituted linear or branched alkyl groups.

Examples of repeating units having a lactone structure represented by the general formula (Lc) or any of the following general formulae (V-1) to (V-5) include repeating units represented by the general formula (II-A) or (II-B) wherein at least one of $R_{13}'$ to $R_{16}'$ has a group represented by the general formula (Lc) or any of the following general formulae (V-1) to (V-5) (such as —COOR$_5$ wherein R$_5$ represents a group represented by the general formula (Lc) or any of the general formulae (V-1) to (V-5)) and repeating units represented by the following general formula (AI).

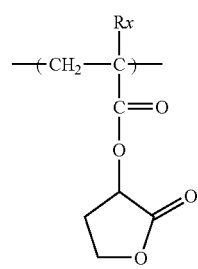
(AI)

In the general formula (AI), $R_{b0}$ represents a hydrogen atom, a halogen atom, or an optionally substituted alkyl group having from 1 to 4 carbon atoms. Examples of substituents which the alkyl group represented by $R_{b0}$ may have include those enumerated previously as preferred substituents which the alkyl group represented by $R_{1b}$ in the general formulae (V-1) to (V-5) may have.

Examples of the halogen atom represented by $R_{b0}$ include a fluorine atom, a chlorine atom, a bromine atom, and an iodine atom. $R_{b0}$ preferably represents a hydrogen atom.

A' represents a single bon, an ether group, an ester group, a carbonyl group, an alkylene group, or a divalent group comprising a combination thereof.

$B_2$ represents a group represented by the general formula (Lc) or any of the general formulae (V-1) to (V-5).

Specific examples of repeating units having a group having a lactone structure will be given below, but it should not be construed that the invention is limited thereto.

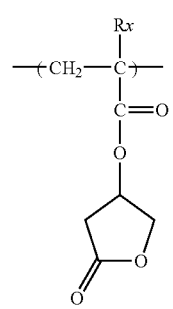
(IV-1)

(IV-2)

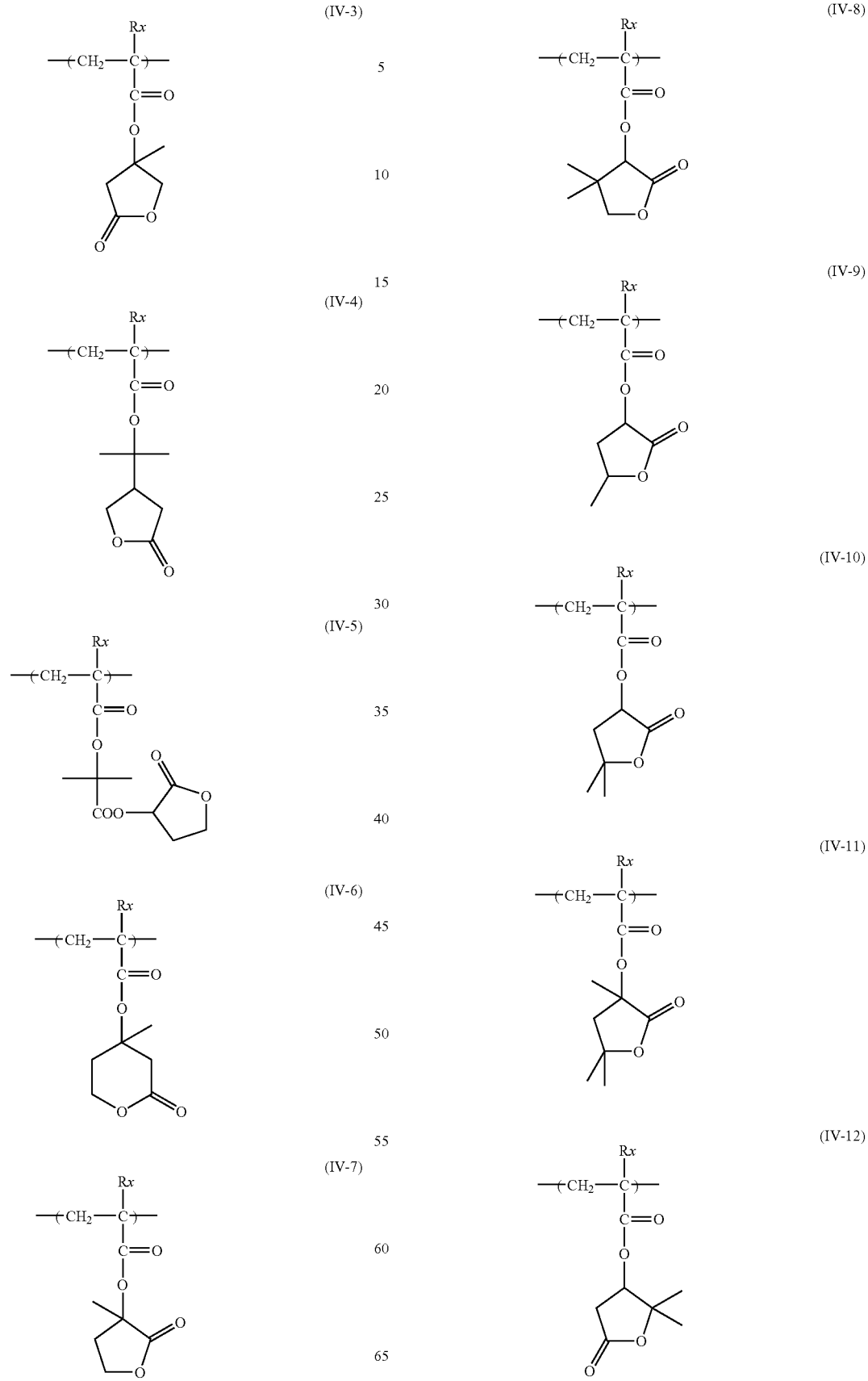

(IV-13)
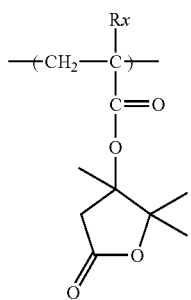
(IV-14)
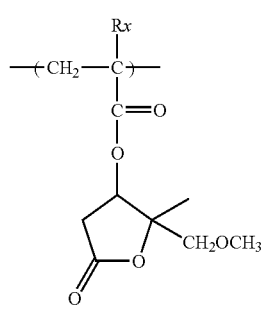
(IV-15)
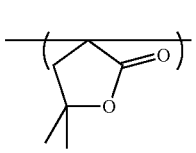
(IV-16)
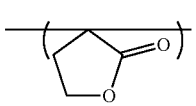
(Ib-1)
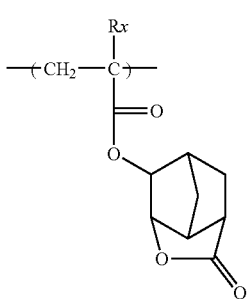
(Ib-2)
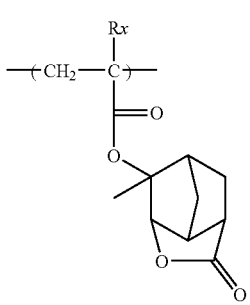
(Ib-3)
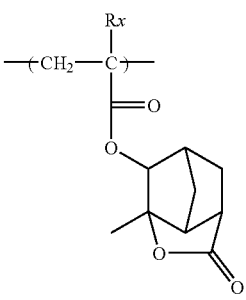
(Ib-4)
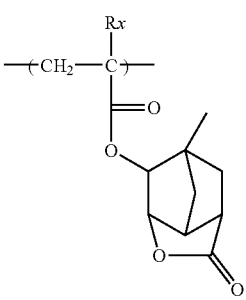
(Ib-5)
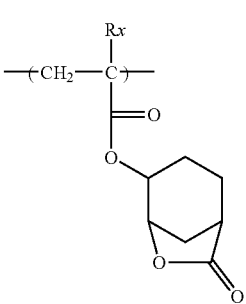
(Ib-6)
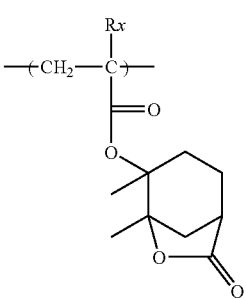
(Ib-7)
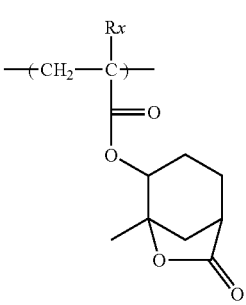

(Ib-8) 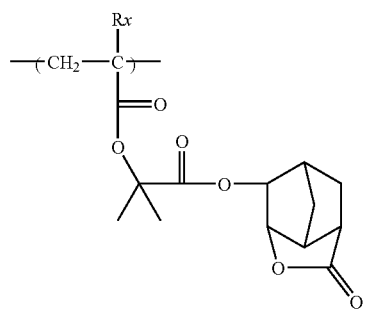
(Ib-9) 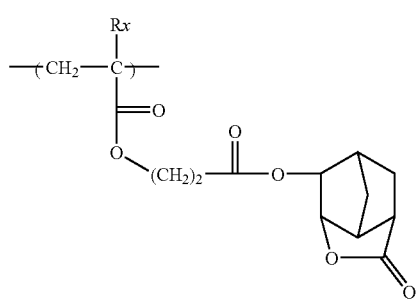
(Ib-10) 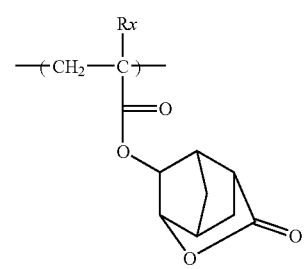
(Ib-11) 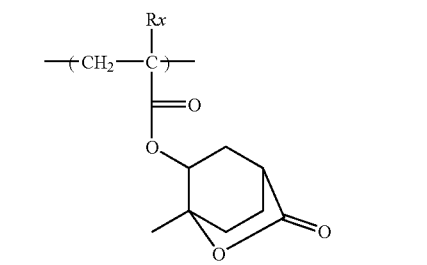
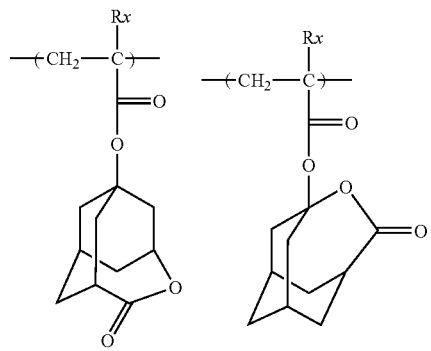
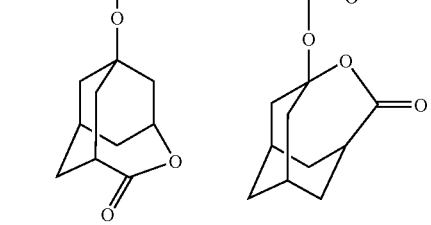
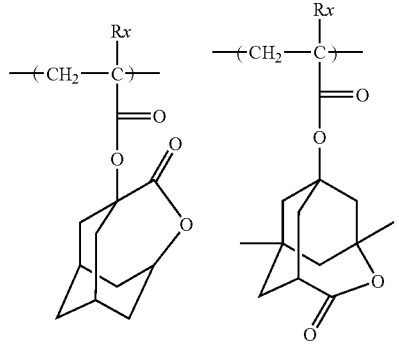
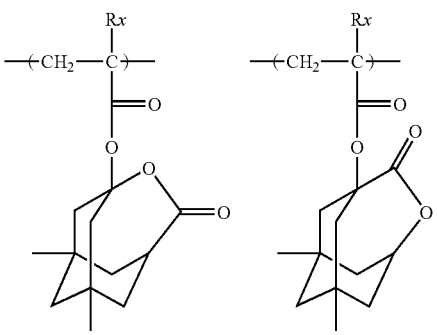
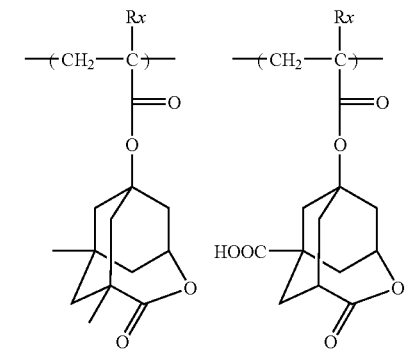
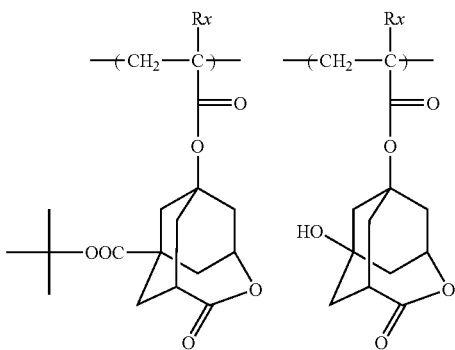
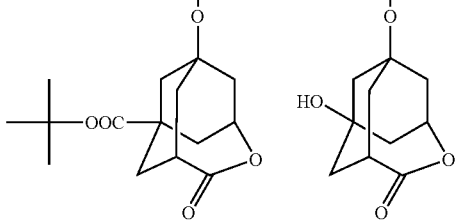

-continued

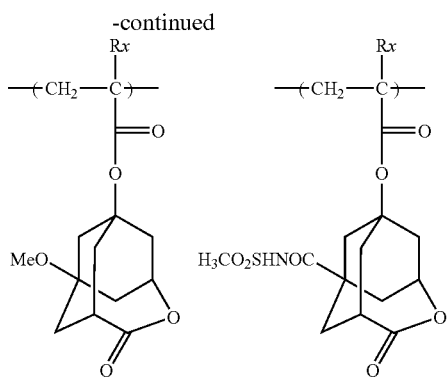

In the foregoing formulae, Rx represents H, CH$_3$ or CF$_3$.

The alicyclic hydrocarbon based acid decomposable resin of the invention may have a repeating unit having a group represented by the following general formula (VII).

(VII)

[Structure with R$_{2c}$, R$_{3c}$, R$_{4c}$ on adamantane]

In the general formula (VII), R$_{2c}$ to R$_{4c}$ each independently represents a hydrogen atom or a hydroxyl group, provided that at least one of R$_{2c}$ to R$_{4c}$ represents a hydroxyl group.

The group represented by the general formula (VII) is preferably a dihydroxy body or a monohydroxy body, and more preferably a dihydroxy body.

Examples of repeating units having a group represented by the general formula (VII) include repeating units represented by the general formula (II-A) or (II-B) wherein at least one of R$_{13}'$ to R$_{16}'$ has a group represented by the general formula (VII) (such as —COOR$_5$ wherein R$_5$ represents a group represented by the general formula (VII)) and repeating units represented by the following general formula (AII).

(AII)

[Structure with R$_{1c}$, R$_{2c}$, R$_{3c}$, R$_{4c}$]

In the general formula (AII), R$_{1c}$ represents a hydrogen atom or a methyl group.

R$_{2c}$ to R$_{4c}$ each independently represents a hydrogen atom or a hydroxyl group, provided that at least one of R$_{2c}$ to R$_{4c}$ represents a hydroxyl group.

Specific examples of repeating units having a structure represented by the general formula (AII) will be given below, but it should not be construed that the invention is limited thereto.

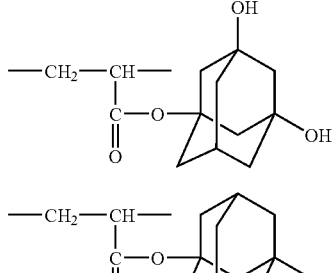

(1)

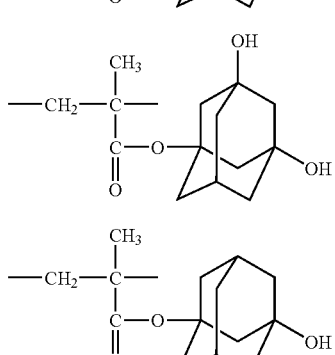

(2)

(3)

(4)

The alicyclic hydrocarbon based acid decomposable resin of the invention may have a repeating unit having a group represented by the following general formula (VIII).

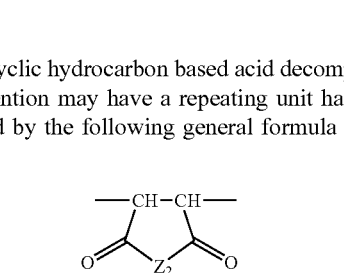

(VIII)

In the general formula (VIII), Z$_2$ represents —O— or —N(R$_{41}$)—; R$_{41}$, represents a hydrogen atom, a hydroxyl group, an alkyl group, a haloalkyl group, or —OSO$_2$—R$_{42}$—; and R$_{42}$ represents an alkyl group, a haloalkyl group, a cycloalkyl group, or a camphor residue.

Specific examples of the repeating unit represented by the general formula (VIII) include the following [I'-1] to [I'-7], but is should not be construed that the invention is limited thereto.

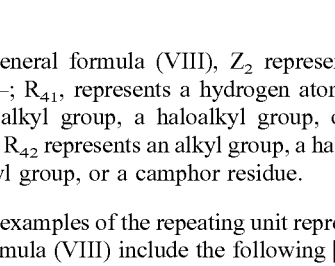

[I'-1]

[I'-2]

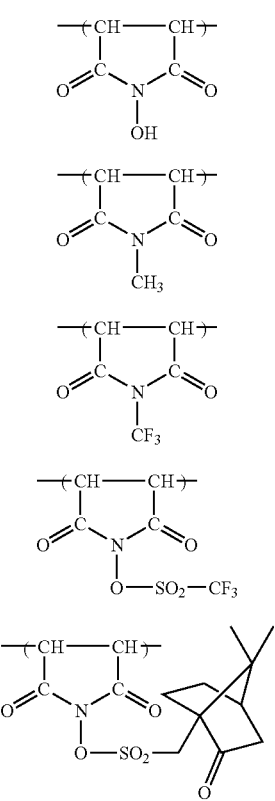

The alicyclic hydrocarbon based acid decomposable resin of the invention can contain various repeating units for the purposes of adjusting dry etching resistance, standard developer adaptability, substrate adhesion, resist profile, and characteristics generally required for resists, such as resolution, heat resistance, and sensitivity, in addition to the foregoing repeating units.

As such repeating units can be enumerated repeating structural units corresponding to the following monomers, but it should not be construed that the invention is limited thereto.

Thus, it is possible to finely control performances required for alicyclic hydrocarbon based acid decomposable resins, especially the following properties:

(1) solubility in coating solvent,
(2) film forming property (glass transition point),
(3) alkali developability,
(4) film diminishment (hydrophilicity and selection of alkali-soluble group),
(5) adhesion to substrate in unexposed areas, and
(6) dry etching resistance.

Examples of such monomers include compounds having at least one addition polymerizable unsaturated bond selected from acrylic acid esters, methacrylic acid esters, acrylamides, methacrylamides, allyl compounds, vinyl ethers, and vinyl esters.

Besides, addition polymerizable unsaturated compounds that are copolymerizable with monomers corresponding the foregoing various repeating structural units may be copolymerized.

In the alicyclic hydrocarbon based acid decomposable resin, the molar ratio of the respective repeating structural units to be contained is properly set up for adjusting dry etching resistance and standard developer adaptability of resist, substrate adhesion, resist profile, and characteristics generally required for resists, such as resolution, heat resistance, and sensitivity.

Preferred embodiments of the alicyclic hydrocarbon based acid decomposable resin of the invention are given below.

(1) Those containing a repeating unit having a partial structure containing an alicyclic hydrocarbon represented by any of the general formulae (pI) to (pVI) (side chain type)

(2) Those containing a repeating unit represented by the general formula (II-AB) (main chain type)

As to (2), the following can further be enumerated below.

(3) Those containing a repeating unit represented by the general formula (II-AB), a maleic anhydride derivative and a (meth)acrylate structure (hybrid type)

In the alicyclic hydrocarbon based acid decomposable resin, the content of the repeating unit having a partial structure containing an alicyclic hydrocarbon represented by any of the general formulae (pI) to (pVI) is preferably from 30 to 70% by mole, more preferably from 35 to 65% by mole, and further preferably from 40 to 60% by mole in the whole of repeating structural units.

In the alicyclic hydrocarbon based acid decomposable resin, the content of the repeating unit represented by the general formula (II-AB) is preferably from 10 to 60% by mole, more preferably from 15 to 55% by mole, and further preferably from 20 to 50% by mole in the whole of repeating structural units.

Further, though the content of repeating structural units based on the monomers to be further copolymerized can be properly set up according to the desired performance of resist, it is in general preferably not more than 99% by mole, more preferably not more than 90% by mole, and further preferably not more than 80% by mole based on the total molar number of the sum of the repeating structural unit having a partial structure containing an alicyclic hydrocarbon represented by any of the general formulae (pI) to (pVI) and the repeating unit represented by the general formula (II-AB).

When the composition of the invention is used for ArF exposure, aromatic group-free resins are preferred from the viewpoint of transparency to ArF rays.

The alicyclic hydrocarbon based acid decomposable resin that is used in the invention can be synthesized according to customary methods (such as radical polymerization). Examples of general synthesis methods include a method in which a monomer seed is charged in a reaction vessel collectively or on the way of reaction and optionally dissolved in a reaction solvent such as an ether (such as tetrahydrofuran, 1,4-dioxane, and diisopropyl ether), a ketone (such as methyl ethyl ketone and methyl isobutyl ketone), an ester solvent (such as ethyl acetate), and a solvent capable of dissolving the composition of the invention therein (such as propylene glycol monomethyl ether acetate) to prepare a uniform solution, which is then started for polymerization using a commercially available radical initiator (such as azo based initiators and peroxides) in an inert gas atmosphere (such as nitrogen and argon) optionally under heating. If desired, the initiator is supplemented or added dividedly, and after completion of the reaction, the reaction mixture is added to a solvent to recover a desired polymer by powder or solid recovery. The reaction concentration is 20% by weight or more, preferably 30% by weight or more, and more preferably 40% by weight or more.

The reaction temperature is from 10° C. to 150° C., preferably from 30° C. to 120° C., and more preferably from 50° C. to 100° C.

In the case where the positive photosensitive composition of the invention is irradiated with $F_2$ excimer laser, the resin of the component (B) is preferably a resin having a structure wherein a fluorine atom is substituted in the main chain and/or side chains of the polymer skeleton, which is decomposed by the action of an acid, whereby its solubility in an alkaline developer increases (this resin being often referred to as "fluorine-containing resin"); more preferably a resin containing a hydroxyl group substituted with a fluorine atom or a fluroalkyl group at the 1-position thereof, or a group in which a hydroxyl group substituted with a fluorine atom or a fluoroalkyl group at the 1-position thereof is protected by an acid decomposable group; and most preferably a resin containing a hexafluoro-2-propanol structure or a structure in which a hydroxyl group of hexafluoro-2-propanol is protected by an acid decomposable group. By introducing a fluorine atom, it is possible to enhance transparency against far ultraviolet rays, especially an $F_2$ laser (157 nm).

As the fluorine-containing resin in the acid decomposable resin (B) are preferable resins having at least one of repeating units represented by the following general formulae (FA) to (FG).

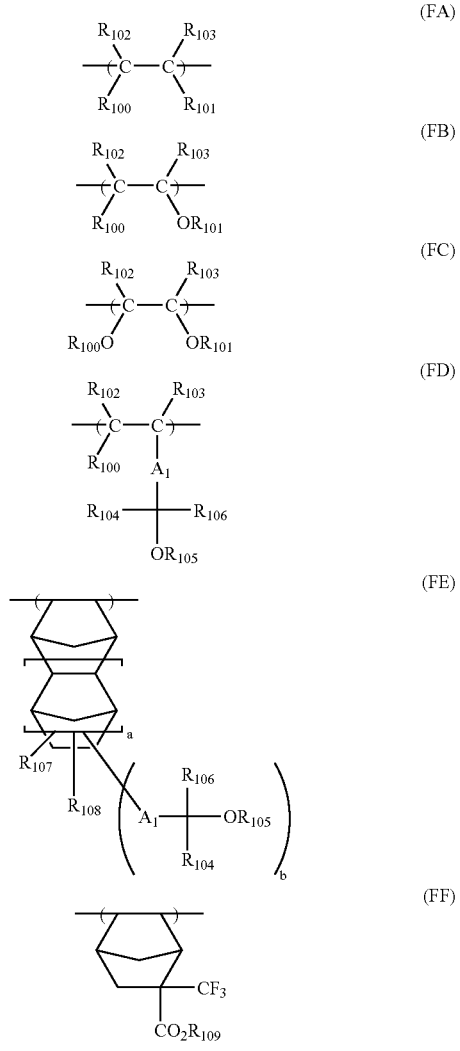

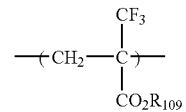

In the foregoing general formulae, $R_{100}$ to $R_{103}$ each represents a hydrogen atom, a fluorine atom, an alkyl group, a cycloalkyl group, a fluoroalkyl group, or an aryl group.

$R_{104}$ and $R_{106}$ each represents a hydrogen atom, a fluorine atom, or a fluoroalkyl group, and at least one of $R_{104}$ and $R_{106}$ represents a fluorine atom or a fluoroalkyl group. Preferably, both $R_{104}$ and $R_{106}$ represent a trifluoromethyl group.

$R_{105}$ represents a hydrogen atom, an alkyl group, a cycloalkyl group, a fluoroalkyl group, an acyl group, an alkoxycarbonyl group, or a group that is decomposed by the action of an acid.

$A_1$ represents a single bond or a divalent connecting group (such as a linear, branched or cyclic alkylene group or alkenylene group, an arylene group, —OCO—, —COO—, —CON($R_{24}$)—, and connecting groups containing a plurality of these groups). $R_{24}$ represents a hydrogen atom or an alkyl group.

$R_{107}$ and $R_{108}$ each represents a hydrogen atom, a halogen atom, an alkyl group, a cycloalkyl group, a fluoroalkyl group, an alkoxy group, an alkoxycarbonyl group, or a group that is decomposed by the action of an acid.

$R_{109}$ represents a hydrogen atom, an alkyl group, a cycloalkyl group, a fluoroalkyl group, or a group that is decomposed by the action of an acid.

b is 0, 1 or 2.

The repeating units represented by the general formulae (FA) to (FG) contain at least one fluorine atom, and preferably three or more fluorine atoms per repeating unit.

In the general formulae (FA) to (FG), as the alkyl group are enumerated alkyl groups having from 1 to 8 carbon atoms, and preferred specific examples include a methyl group, an ethyl group, a propyl group, an n-butyl group, a sec-butyl group, a hexyl group, a 2-ethylhexyl group, and an octyl group.

The cycloalkyl group may be monocyclic or polycyclic. As the monocyclic type are enumerated those having from 3 to 8 carbon atoms, and preferred specific examples include a cyclopropyl group, a cyclopentyl group, a cyclohexyl group, a cycloheptyl group, and a cyclooctyl group. As the polycyclic type are enumerated those having from 6 to 20 carbon atoms, and preferred specific examples include an adamantyl group, a norbornyl group, an isoboronyl group, a camphanyl group, a dicyclopentyl group, an α-pinel group, a tricyclodecanyl group, a tetracyclododecyl group, and an androstanyl group. Carbon atoms in the monocyclic or polycyclic cycloalkyl group may be substituted with a hetero atom such as an oxygen atom.

As the fluoroalkyl group are enumerated those having from 4 to 12 carbon atoms, and preferred specific examples include a perfluorobutyl group, a perfluorohexyl group, a perfluorooctyl group, a perfluorooctylethyl group, and a perfluorododecyl group.

As the aryl group are enumerated those having from 6 to 15 carbon atoms, and preferred specific examples include a phenyl group, a tolyl group, a dimethylphenyl group, a 2,4,6-trimethylphenyl group, a naphthyl group, an anthryl group, and a 9,10-dimethoxyanthryl group.

As the alkoxy group are enumerated those having from 1 to 8 carbon atoms, and preferred specific examples include a methoxy group, an ethoxy group, an n-propoxy group, an isopropoxy group, a butoxy group, a pentoxy group, an allyloxy group, and an octoxy group.

As the acyl group are enumerated those having from 1 to 10 carbon atoms, and preferred specific examples a formyl group, an acetyl group, a propanoyl group, a butanoyl group, a pivaloyl group, an octanoyl group, and a benzoyl group.

Examples of the alkoxycarbonyl group include an isopropoxycarbonyl group, a t-butoxycarbonyl group, a t-amyloxycarbonyl group, and a 1-methyl-1-cyclohexyloxycarbonyl group. Of these are preferable secondary alkoxycarbonyl groups, and more preferable tertiary alkoxycarbonyl groups.

Examples of the halogen atom include a fluorine atom, a chlorine atom, a bromine atom, and an iodine atom.

As the alkylene group are preferable optionally substituted alkylene groups having from 1 to 8 carbon atoms such as a methylene group, an ethylene group, a propylene group, a butylene group, a hexylene group, and an octylene group.

As the alkenylene groups are preferable optionally substituted alkenylene groups having from 2 to 6 carbon atoms such as an ethenylene group, a propenylene group, and a butenylene group.

As the cycloalkylene group are preferable optionally substituted cycloalkylene groups having from 5 to 8 carbon atoms such as a cyclopentylene group and a cyclohexylene group.

As the arylene group are preferable optionally substituted arylene groups having from 6 to 15 carbon atoms such as a phenylene group, a tolylene group, and a naphthylene group.

These groups may have a substituent. Examples of substituents include an alkyl group, a cycloalkyl group, an aryl group, an amino group, an amide group, a ureido group, a urethane group, a hydroxyl group, a group having active hydrogen such as a carboxyl group, a halogen atom (such as a fluorine atom, a chlorine atom, a bromide atom, and an iodine atom), an alkoxy group (such as a methoxy group, an ethoxy group, a propoxy group, and a butoxy group), a thioether group, an acyl group (such as an acetyl group, a propanoyl group, and a benzoyl group), an acyloxy group (such as an acetoxy group, a propanoyloxy group, and a benzoyloxy group), an alkoxycarbonyl group (such as a methoxycarbonyl group, an ethoxycarbonyl group, and a propoxycarbonyl group), a cyano group, and a nitro group.

Examples of the alkyl group, cycloalkyl group and aryl group include those as enumerated previously. The alkyl group may further be substituted with a fluorine atom or a cycloalkyl group.

Examples of the group that is decomposed by the action of an acid to exhibit alkali solubility, which is contained in the fluorine-containing resin of the invention, include —O—C($R_{36}$)($R_{37}$)($R_{38}$), —O—C($R_{36}$)($R_{37}$)(O$R_{39}$), —O—COO—C($R_{36}$)($R_{37}$)—($R_{38}$), —O—C($R_{01}$)($R_{02}$)COO—C($R_{36}$)($R_{37}$)($R_{38}$), —COO—C($R_{36}$)($R_{37}$)($R_{38}$), and —COO—C($R_{36}$)($R_{37}$)(O$R_{39}$).

$R_{36}$ to $R_{39}$ each represents an optionally substituted alkyl group, cycloalkyl group, aryl group, aralkyl group or alkenyl group; and $R_{01}$ and $R_{02}$ each represents a hydrogen atom or an optionally substituted alkyl group, cycloalkyl group, alkenyl group, aralkyl group or aryl group.

Preferred specific examples include ether groups or ester groups of tertiary alkyl groups such as a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group; acetal groups or acetal ester groups such as a 1-alkoxy-1-ethoxy group and a tetrahydropyranyl group; t-alkyl carbonate groups; and t-alkylcarbonylmethoxy groups.

Specific examples of repeating units represented by the general formulae (FA) to (FG) will be given below, but it should not be construed that the invention is limited thereto.

(F-1)

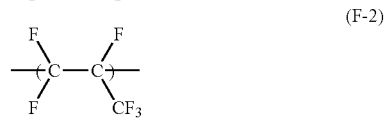

(F-2)

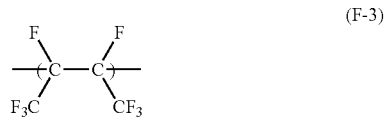

(F-3)

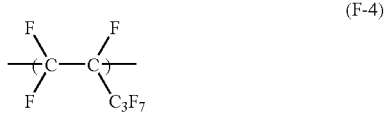

(F-4)

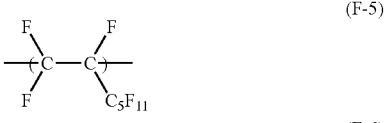

(F-5)

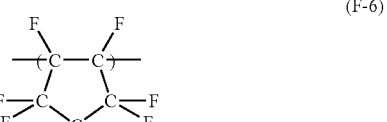

(F-6)

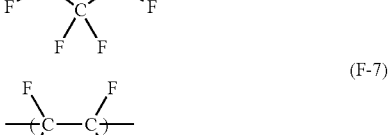

(F-7)

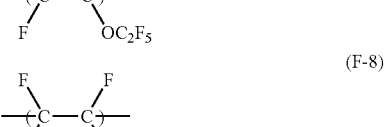

(F-8)

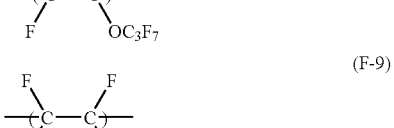

(F-9)

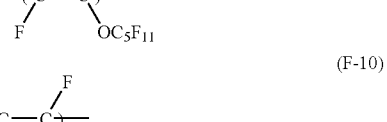

(F-10)

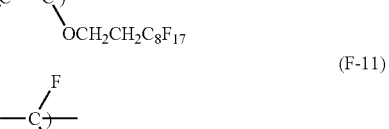

(F-11)

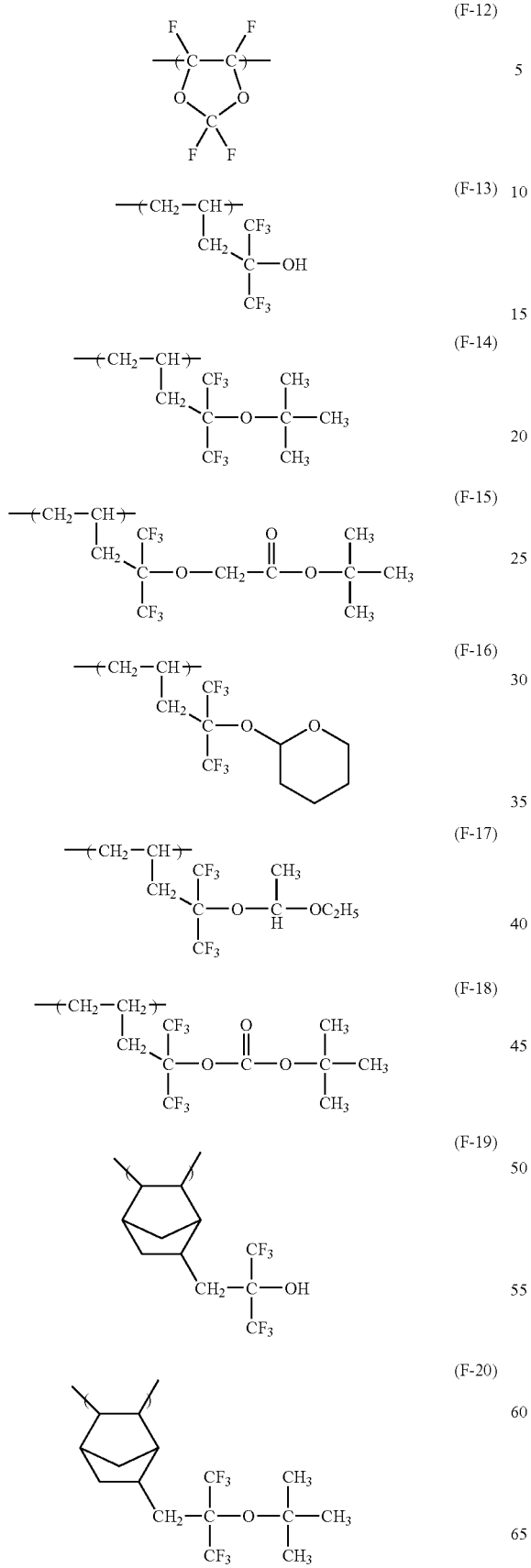
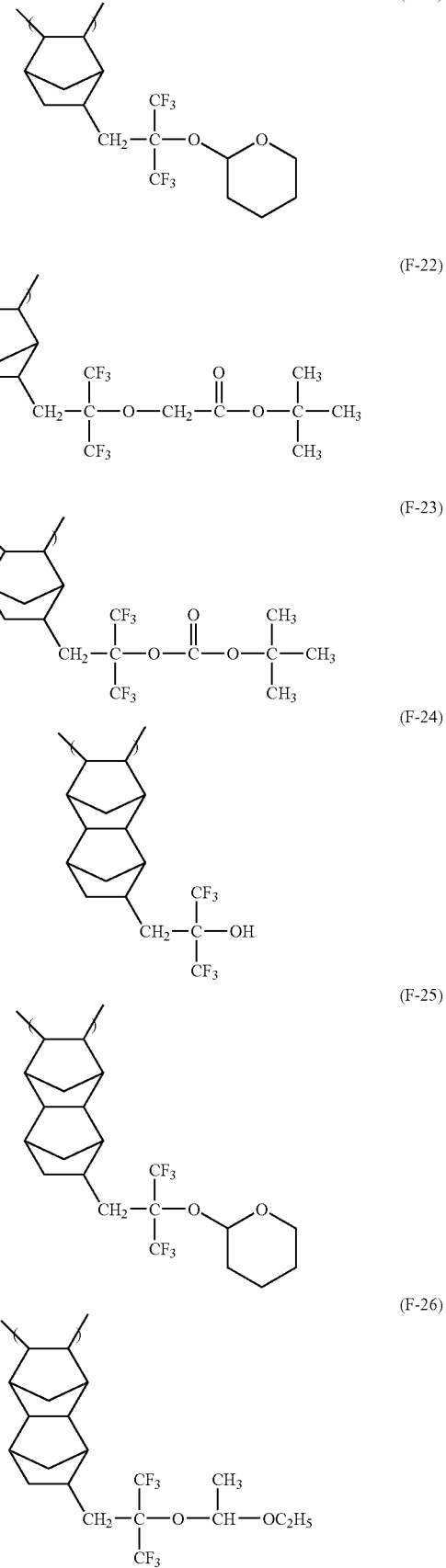

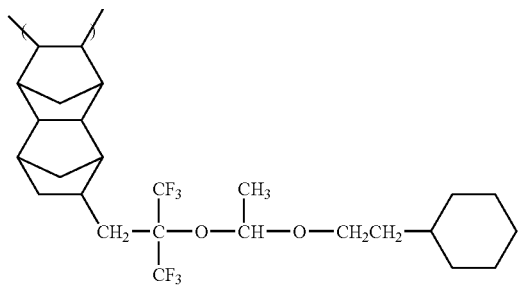
(F-27)
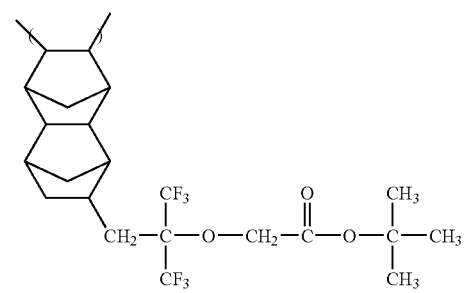
(F-28)
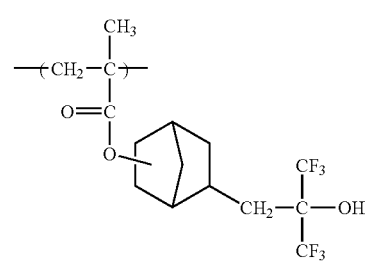
(F-29)
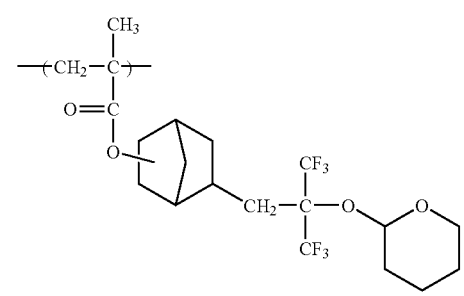
(F-30)
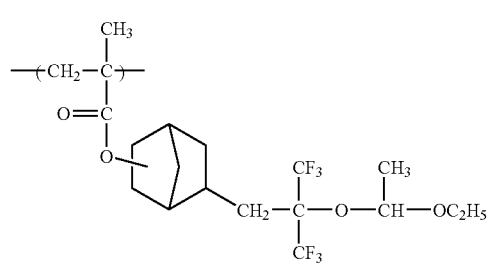
(F-31)
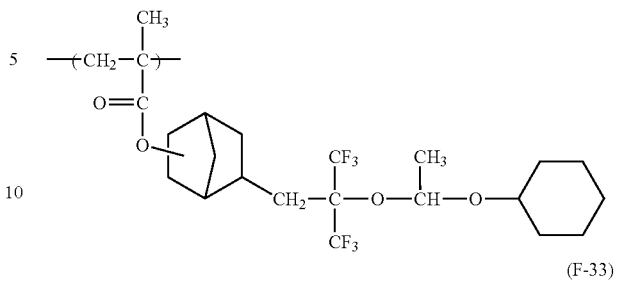
(F-32)
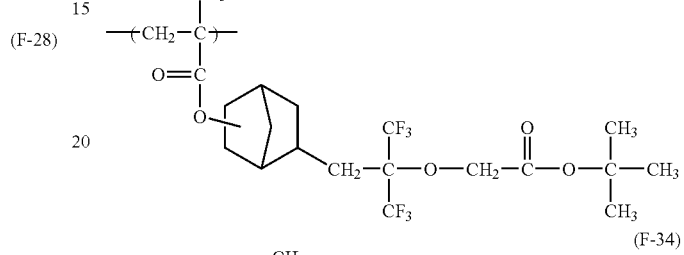
(F-33)
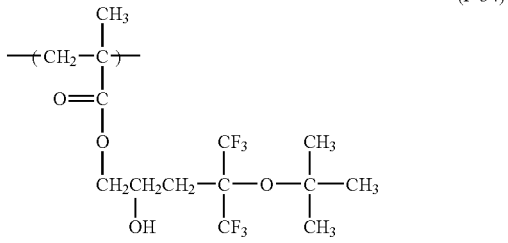
(F-34)
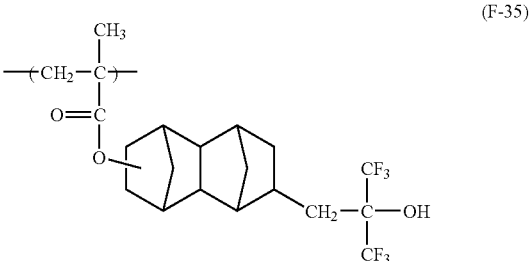
(F-35)
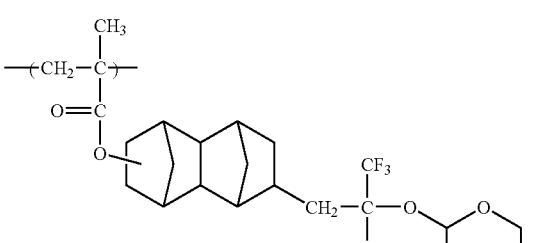
(F-36)
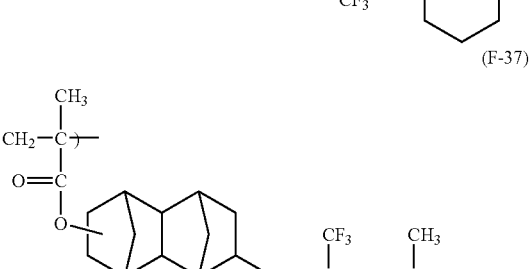
(F-37)

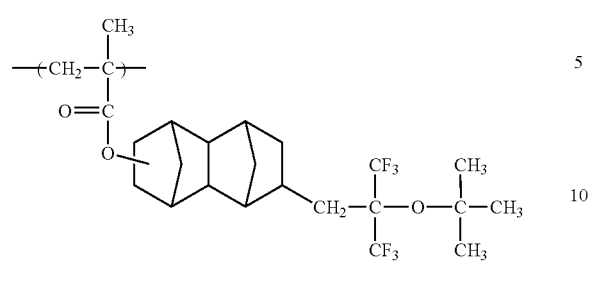
(F-38)
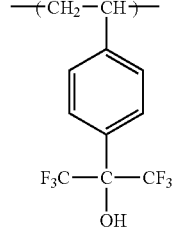
(F-39)
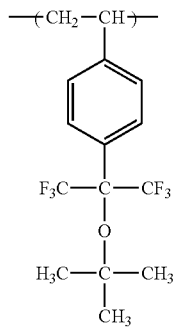
(F-40)
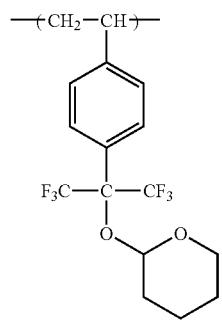
(F-41)
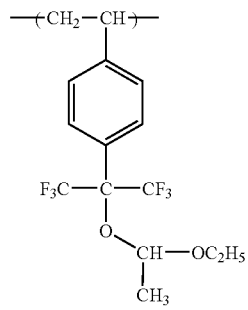
(F-42)
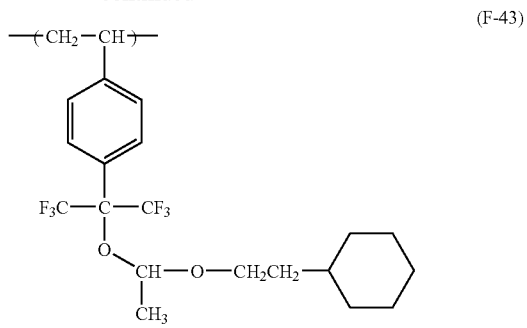
(F-43)
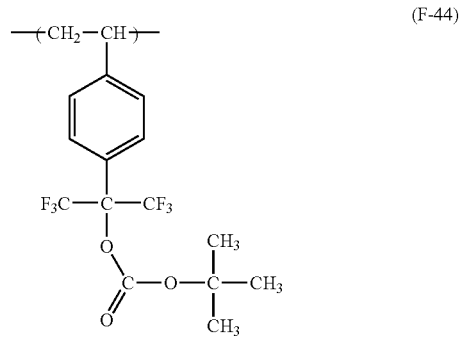
(F-44)
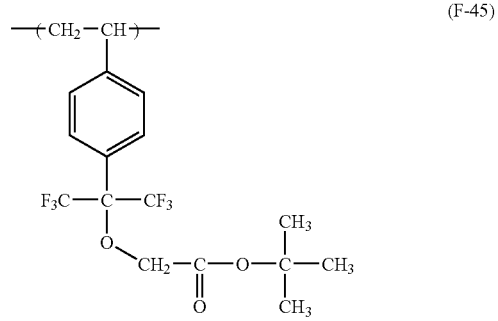
(F-45)
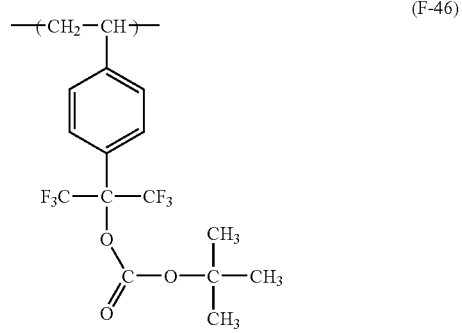
(F-46)
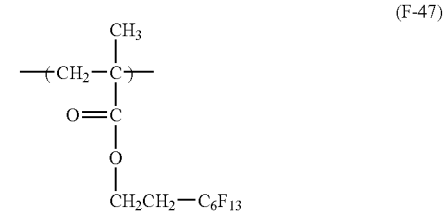
(F-47)

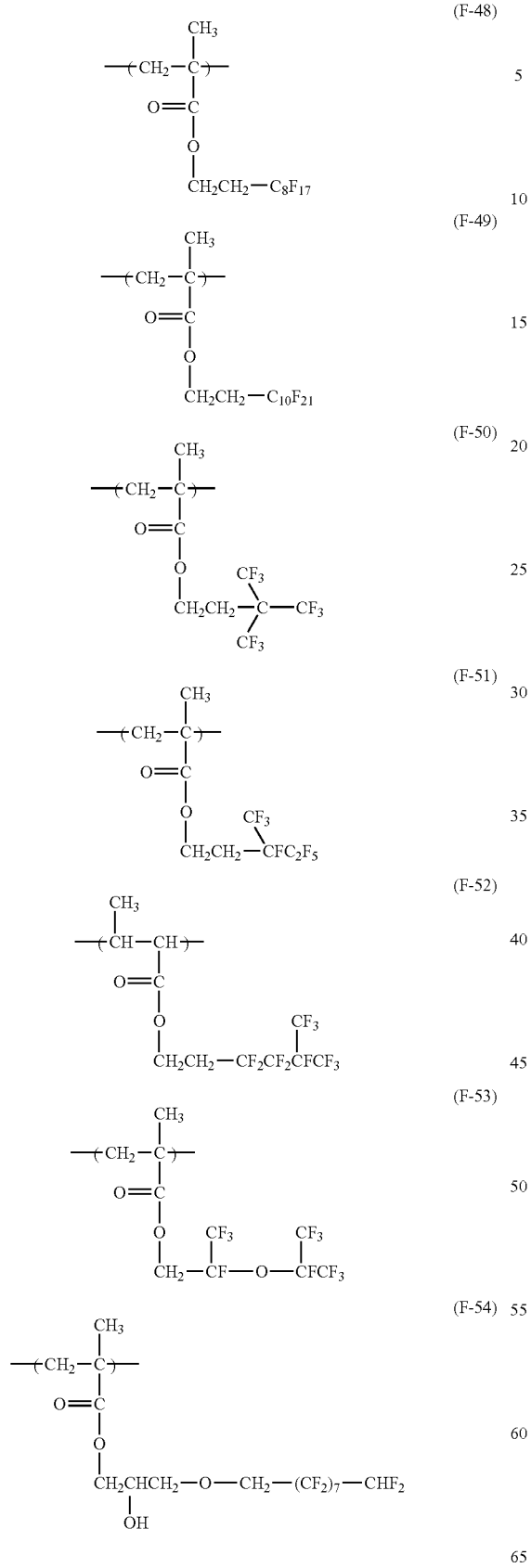
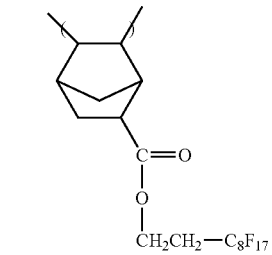
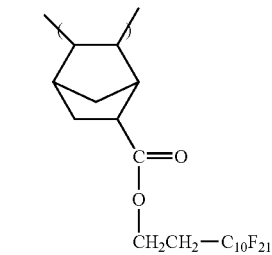
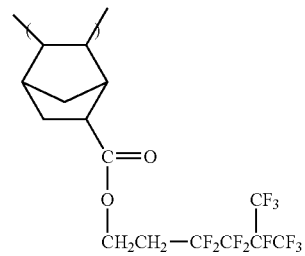
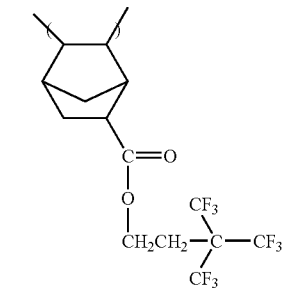
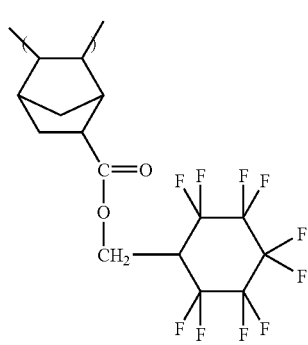

-continued (F-60)
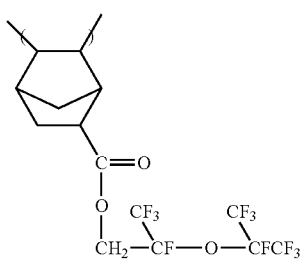

(F-61)
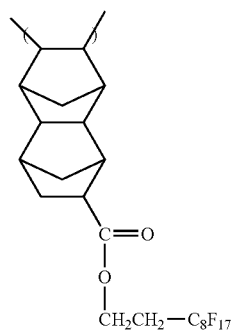

(F-62)
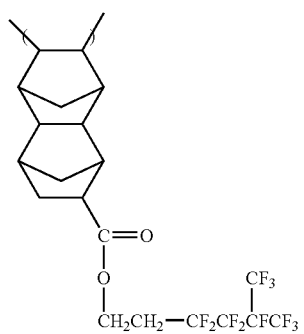

(F-63)

n = 8

(F-64)
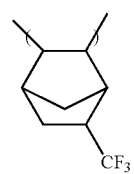

(F-65)
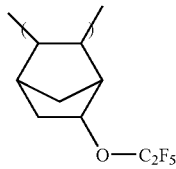

The sum of the contents of repeating units represented by the general formulae (FA) to (FG) is in general in the range of from 10 to 80% by mole, preferably from 30 to 70% by mole, and more preferably from 35 to 65% by mole based on the whole of repeating units constituting the resin.

For the purpose of further enhancing the performance of the resist of the invention, the resin (B) of the invention may be copolymerized with other polymerizable monomers in addition to the foregoing repeating structural units.

Examples of copolymerizable monomers that can be used include compounds having one addition polymerizable unsaturated bond, which are selected from acrylic acid esters, acrylamides, methacrylic acid esters, methacrylamides, allyl compounds, vinyl ethers, vinyl esters, styrenes, and crotonic acid esters other than those described previously.

It is preferred that such a fluorine-containing resin contains other repeating units as copolymerization components in addition to the foregoing fluorine atom-containing repeating units from the viewpoints of enhancement of dry etching resistance, adjustment of alkali solubility, and enhancement of substrate adhesion. Preferred examples of such other repeating units are given below.

1) Repeating units having an alicyclic hydrocarbon structure represented by any of the general formulae (pI) to (pVI) or the general formula (II-AB), concretely, the foregoing repeating units 1 to 23 and repeating units [II-1] to [II-32], and preferably, the repeating units 1 to 23 wherein Rx is $CF_3$.

2) Repeating units having a lactone structure represented by the general formula (Lc) or any of the general formulae (V-1) to (V-5), and concretely, the foregoing repeating units (IV-1) to (IV-16) and repeating units (Ib-1) to (Ib-11).

3) Repeating units represented by any of the following general formulae (XV), (XVI) and (XVII), which are derived from maleic anhydride or vinyl compounds having a vinyl ether group or a cyano group, and concretely, the following repeating units (C-1) to (C-15).

These other repeating units may or may not contain a fluorine atom.

(XV)
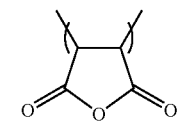

(XVI)
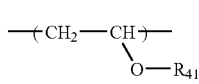

(XVII)
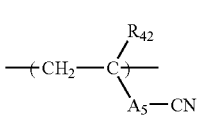

In the foregoing general formulae, $R_{41}$ represents an alkyl group, a cycloalkyl group, an aralkyl group, or an aryl group.

$R_{42}$ represents a hydrogen atom, a halogen atom, a cyano group, an alkyl group, or a haloalkyl group.

$A_5$ represents a single bond, a divalent alkylene group, alkenylene group, cycloalkylene group or arylene group, $-O-CO-R_{22}-$, $-CO-O-R_{23}-$, or $-CO-N(R_{24})-R_{25}-$.

$R_{22}$, $R_{23}$ and $R_{25}$ may be the same or different and each represents a single bond or a divalent alkylene group, alkenylene group, cycloalkylene group or arylene group, each of which may have an ether group, an ester group, an amide group, a urethane group, or an ureido group.

$R_{24}$ represents a hydrogen atom or an optionally substituted alkyl group, cycloalkyl group, aralkyl group or aryl group.

n is 0 or 1; and x, y and z each represents an integer of from 0 to 4.

Here, examples of the respective substituents include those the same as in the substituents of the general formulae (FA) to (FG).

Specific examples of repeating units represented by the general formulae (XVI) to (XVII) will be given below, but it should not be construed that the invention is limited thereto.

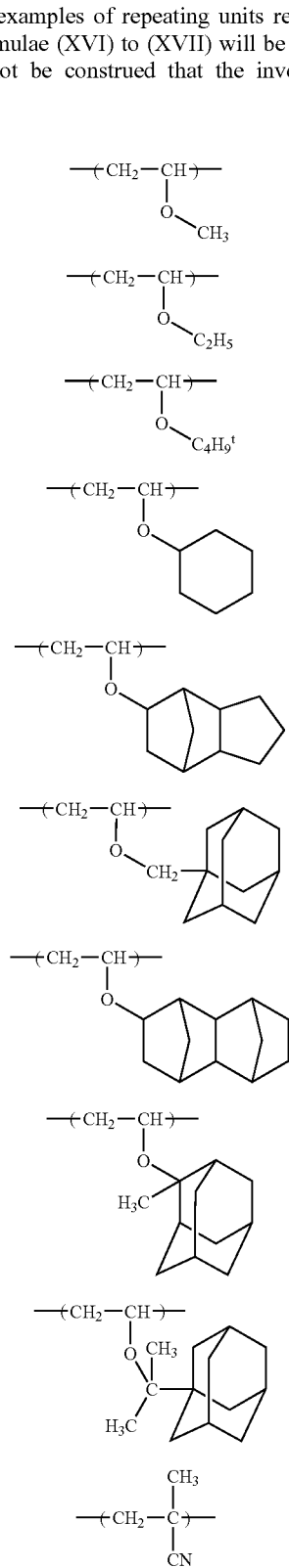

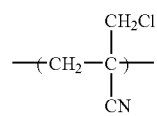

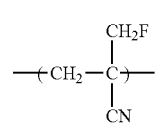

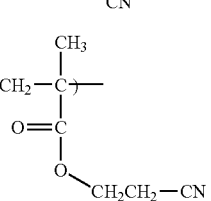

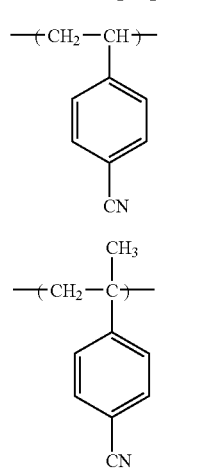

The content of other repeating units such as the repeating units represented by the general formulae (XV) to (XVII) is in general in the range of from 0 to 70% by mole, preferably from 10 to 60% by mole, and more preferably from 20 to 50% by mole based on the whole of repeating units constituting the resin.

The fluorine-containing resin as the acid decomposable resin (B) may contain the acid decomposable group in any repeating unit.

The content of the acid decomposable group-containing repeating unit is preferably from 30 to 70% by mole, more preferably from 35 to 65% by mole, and further preferably from 40 to 60% by mole on the base of the whole of repeating units.

The fluorine-containing resin can be synthesized by radical polymerization in a manner substantially the same as in the alicyclic hydrocarbon based acid decomposable resin.

The resin as the component (B) according to the invention preferably has a weight average molecular weight, as reduced into polystyrene by the GPC method, of from 1,000 to 200,000. When the weight average molecular weight is less than 1,000, heat resistance and dry etching resistance are deteriorated, and therefore, such is not so preferable. On the other hand, when it exceeds 200,000, developability is deteriorated, or viscosity becomes extremely high, leading to not so desirable results such as deterioration of film forming property.

In the photosensitive composition of the invention, the compounding amount of the component (B) according to the invention in the whole of the composition is preferably from 40 to 99.99% by weight, and more preferably from 50 to 99.97% by weight in the whole of solid contents.

(3) (C) dissolution inhibiting compound that is decomposed by the action of an acid, whereby its solubility in an alkaline developer increases (hereinafter often referred to as "component (C)" or "dissolution inhibiting compound"):

As the dissolution inhibiting compound (C) having a molecular weight of not more than 3,000, which is decomposed by the action of an acid, whereby its solubility in an alkaline developer increases, are preferable acid decomposable group-containing alicyclic or aliphatic compound such as acid decomposable group-containing cholic acid derivatives as described in *Proceeding of SPIE*, 2724, 355 (1996), because they do not lower transparency against rays of not longer than 220 nm. Examples of the acid decomposable group and the alicyclic structure include those the same as described previously for the alicyclic hydrocarbon based acid decomposable resin.

In the case where the photosensitive composition of the invention is exposed to KrF excimer laser or irradiated with electron beams, those having a structure in which a phenolic hydroxyl group of a phenol compound is substituted with an acid decomposable group are preferable. As the phenol compound are preferable those having from 1 to 9 phenol skeletons, and more preferably from 2 to 6 phenol skeletons.

In the invention, the dissolution inhibiting compound has a molecule weight of not more than 3,000, preferably from 300 to 3,000, and more preferably from 500 to 2,500.

The addition amount of the dissolution inhibiting compound is preferable from 3 to 50% by weight, and more preferably from 5 to 40% by weight based on the solids content of the photosensitive composition.

Specific examples of dissolution inhibiting compounds will be described below, but it should not be construed that the invention is limited thereto.

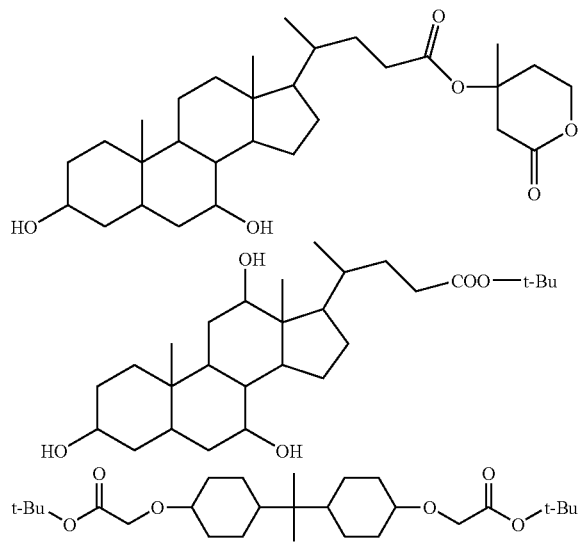

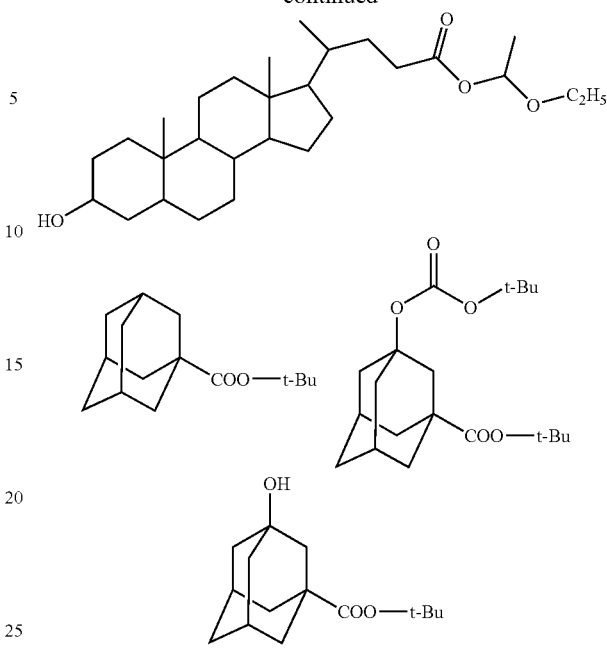

(4) (D) Alkaline developer-soluble resin (hereinafter often referred to as "component (D)" or "alkali-soluble resin"):

The alkali-soluble resin preferably has an alkali dissolution speed, as measured in 0.261 N tetramethylammonium hydroxide (TMAH) (at 23° C.), of 20 angstroms/sec or more, and particularly preferably 200 angstroms/sec or more.

Examples of alkali-soluble resins that are used in the invention include novolak resins, hydrogenated novolak resins, acetone-pyrogallol reins, o-polyhydroxystyrenes, m-polyhydroxystyrenes, p-polyhydroxystyrenes, hydrogenated polyhydroxystyrenes, halogen- or alkyl-substituted polyhydroxystyrenes, hydroxystyrene-N-substituted maleimide copolymers, o/p- and m/p-hydroxystyrene copolymers, partially O-alkylated compounds against hydroxyl groups of polyhydroxystyrene (such as from 5 to 30% by mole O-methylated compounds, O-(1-methoxy) ethylated compounds, O-(1-ethyl)-ethylated compounds, O-2-tetrahydropyranylated compounds and O-(t-butoxycarbonyl)methylated compounds), partially O-acylated compounds against hydroxyl groups of polyhydroxystyrene (such as from 5 to 30% by mole O-acetylated compounds and O-(t-butoxy)carbonylated compounds), styrene-maleic anhydride copolymers, styrene-hydroxystyrene copolymers, α-methylstyrene-hydroxystyrene copolymers, carboxyl group-containing methacrylic resins and derivatives thereof, and polyvinyl alcohol derivatives. However, it should not be construed that the invention is limited thereto.

Of these alkali-soluble resins are particularly preferable novolak resins; o-polyhydroxystyrenes, m-polyhydroxystyrenes, p-polyhydroxystyrenes, and copolymers thereof; alkyl-substituted polyhydroxystyrenes; partially O-alkylated or O-acylated compounds of polyhydrostyrenes; styrene-hydroxystyrene copolymers; and α-methylstyrene-hydroxystyrene copolymers.

The novolak resins are obtained by subjecting prescribed monomers as major components to addition condensation with an aldehyde in the presence of an acid catalyst.

The alkali-soluble resin has a weight average molecular weight of 2,000 or more, preferably from 5,000 to 200,000, and more preferably from 5,000 to 100,000.

Here, the weight average molecular weight is defined as a value reduced into polystyrene by gel permeation chromatography.

In the invention, the alkali-soluble resin (D) may be used in combination of two or more thereof.

The amount of the alkali-soluble resin to be used is from 40 to 97% by weight, and preferably from 60 to 90% by weight based on the solids content of whole of the composition of the photosensitive composition.

(5) (E) acid crosslinking agent capable of crosslinking with the alkaline developer-soluble resin by the action of an acid (hereinafter often referred to as "component (E)" or "crosslinking agent"):

In the negative photosensitive composition of the invention, a crosslinking agent is used.

As the crosslinking agent, any compounds capable of crosslinking with the alkaline developer by the action of an acid can be used, but the following compounds (1) to (3) are preferable.

(1) Hydroxymethyl compounds, alkoxymethyl compounds and acyloxymethyl compounds of phenol derivatives (2) Compounds having an N-hydroxymethyl group, an N-alkoxymethyl group, or an N-acyloxymethyl group (3) Compounds having an epoxy group As the alkoxymethyl group are preferable those having not more than 6 carbon atoms; and as the acyloxymethyl group are preferably those having not more than 6 carbon atoms.

Of these crosslinking agents, particularly preferred examples are enumerated below.

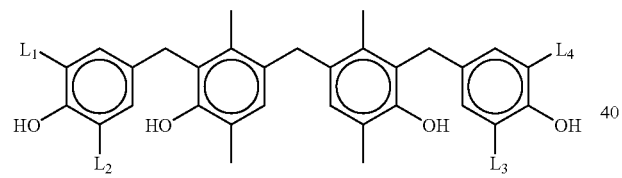

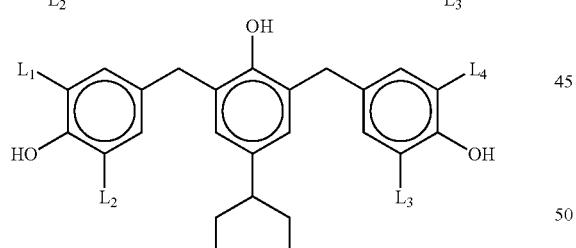

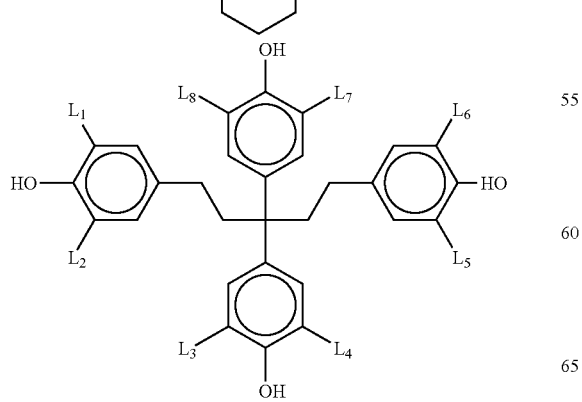

-continued

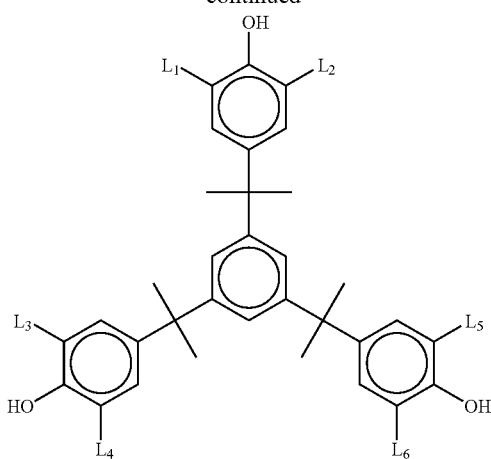

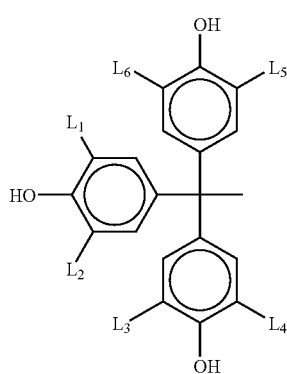

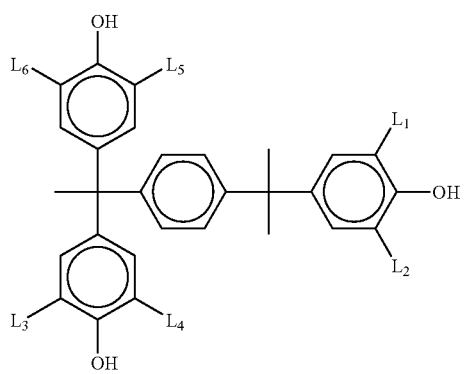

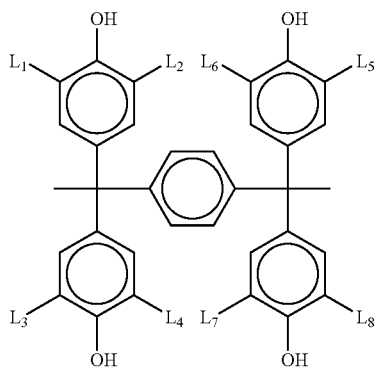

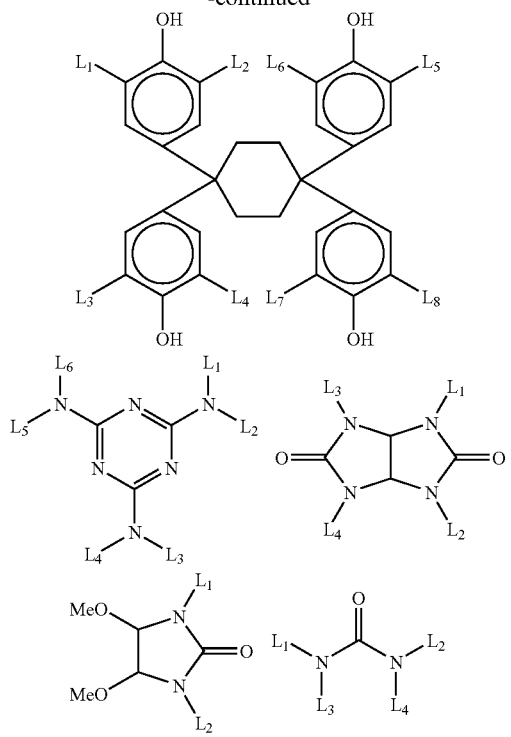

In the foregoing general formulae, $L_1$ to $L_8$ may be the same or different and each represents a hydrogen atom, a hydroxymethyl group, a methoxymethyl group, an ethoxymethyl group, or an alkyl group having from 1 to 6 carbon atoms.

The crosslinking agent is used in an addition amount of from 3 to 70% by weight, and preferably from 5 to 50% by weight in the solids content of the photosensitive composition.

When the addition amount of the crosslinking agent is less than 3% by weight, film retention rate is lowered. On the other hand, when it exceeds 70% by weight, resolution is lowered, and such is not so preferable from the standpoint of stability of the composition during storage.

<Other Components to be Used in the Photosensitive Composition of the Invention>

(6) (F) Basic Compound:

For reducing changes of performance with time from exposure until heating, it is preferred that the photosensitive composition of the invention contains (F) a basic compound.

As the structure are preferable structures represented by the following formulae (A) to (E).

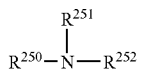 (A)

Here, $R^{250}$, $R^{251}$ and $R^{252}$ each independently represents a hydrogen atom, an alkyl group having from 1 to 20 carbon atoms, an aminoalkyl group having from 1 to 20 carbon atoms, a hydroxyalkyl group having from 1 to 20 carbon atoms, or a substituted or unsubstituted aryl group having from 6 to 20 carbon atoms; and $R^{250}$ and $R^{251}$ may be bonded to each other to form a ring.

These groups may contain an oxygen atom, a sulfur atom, or a nitrogen atom in the alkyl chains thereof.

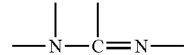 (B)

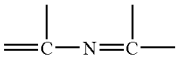 (C)

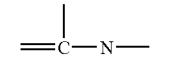 (D)

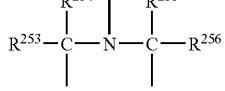 (E)

In the foregoing general formula, $R^{253}$, $R^{254}$, $R^{255}$ and $R^{256}$ each independently represents an alkyl group having from 1 to 6 carbon atoms.

Preferred examples of such compounds include substituted or unsubstituted guanidines, substituted or unsubstituted aminopyrrolidines, substituted or unsubstituted pyrazoles, substituted or unsubstituted pyrazolines, substituted or unsubstituted piperazines, substituted or unsubstituted aminomorpholines, substituted or unsubstituted amino-alkylmorpholines, and substituted or unsubstituted piperidines. More preferred examples of compounds include compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, and aniline derivatives having a hydroxyl group and/or an ether bond.

Examples of compounds having an imidazole structure include imidazole, 2,4,5-triphenyl imidazole, and benzimidazole. Examples of compounds having a diazabicyclo structure include 1,4-diazabicyclo[2,2,2]octane, 1,5-diazabicyclo[4,3,0]nona-5-ene, and 1,8-diazabicyclo[5,4,0]-undeca-7-ene. Examples of compounds having an onium hydroxide structure include triarylsulfonium hydroxides, phenacylsulfonium hydroxides, and 2-oxoalkyl group-containing sulfonium hydroxides, and specific examples include triphenylsulfonium hydroxide, tris(t-butylphenyl) sulfonium hydroxide, bis(t-butylphenyl)iodonium hydroxide, phenacyl-thiophenium hydroxide, and 2-oxopropylthiophenium hydroxide. Examples of compounds having an onium carboxylate structure include compounds having an onium hydroxide compound in which an anion segment is a carboxylate, such as acetates, adamantane-1-carboxylates, and perfluoroalkyl carboxylates. Examples of compounds having a trialkylamine structure include tri(n-butyl)amine and tri(n-octyl)amine. Examples of aniline compounds include 2,6-diisopropylaniline and N,N-dimethylaniline. Examples of alkylamine derivatives having a hydroxyl group and/or an ether bond include ethanolamine, diethanolamine, triethanolamine, and tris-(methoxyethoxyethyl)amine. Examples of aniline derivatives having a hydroxyl group and/or an ether bond include N,N-bis(hydroxyethyl)aniline.

These basic compounds may be used singly or in admixture of two or more thereof. The amount of the basic compound to be used is usually from 0.001 to 10% by weight, and preferably from 0.01 to 5% by weight based on the solids content of the photosensitive composition.

When the amount of the basic compound is less than 0.001% by weight, the effect to be brought by the addition of the basic compound is not obtained. On the other hand, when it exceeds 10% by weight, sensitive is liable to be lowered, or developability in non-exposed areas is liable to be deteriorated.

(7) (G) Surfactant containing at least one of a fluorine atom and a silicon atom (fluorine and/or silicon based surfactant):

It is preferred that the photosensitive composition of the invention contains any one of fluorine and/or silicon based surfactants (such as fluorine based surfactants, silicon based surfactants, and surfactants containing both a fluorine atom and a silicon atom), or a combination of two or more thereof.

By containing a fluorine and/or silicon based surfactant in the photosensitive composition of the invention, it is possible to give resist patterns having good sensitivity and resolution and less adhesion and development failure during use of an exposure source of not longer than 250 nm, and especially not longer than 220 nm.

Examples of such fluorine and/or silicon based surfactants include surfactants as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. The following commercially available surfactants can also be used as they are.

Examples of commercially available surfactants that can be used include fluorine based surfactants or silicon based surfactants such as Eftop EF301 and Eftop EF303 (manufactured by Shin Akita Chemical), Fluorad FC430 and Fluorad FC431 (manufactured by Sumitomo 3M), Megaface F171, Megaface F173, Megaface F176, Megaface F189 and Megaface R08 (manufactured by Dainippon Ink and Chemicals, Incorporated), Surflon S-382, Surflon SC101, Surflon 102, Surflon 103, Surflon 104, Surflon 105 and Surflon 106 (manufactured by Asahi Glass Co., Ltd.), and Troy Sol S-366 (manufactured by Troy Chemical Industries, Inc.). Further, a polysiloxane polymer, KP-341 (manufactured by Shin-Etsu Chemical Co., Ltd.) can also be used as a silicon based surfactant.

Besides the foregoing known surfactants, surfactants using fluoro aliphatic group-containing polymers derived from fluoro aliphatic compounds produced by telomerization (often called as "telomer method") or oligomerization (often called as "oligomer method") can also be used as the surfactant. Such fluoro aliphatic compounds can be synthesized by the method described in JP-A-2002-90991.

As the fluoro aliphatic group-containing polymer are preferable copolymers of a fluoro aliphatic group-containing monomer and a (poly(oxyalkylene)) acrylate and/or a (poly(oxyalkylene)) methacrylate, which may be irregularly distributed or block copolymerized. As the poly(oxyalkylene) group, a poly(oxyethylene) group, a poly(oxypropylene) group, and a poly(oxybutylene) group can be enumerated, and units containing alkylenes having a different chain length in the same chain, such as a poly(oxyethylene/oxypropylene/oxyethylene block connected body) group and a poly(oxyethylene/oxypropylene block connected body) group can also be enumerated. Moreover, the copolymers of a fluoro aliphatic group-containing monomer and a (poly(oxyalkylene)) acrylate (or methacrylate) include not only binary copolymers but also ternary copolymers or multiple-component polymers obtained by simultaneously copolymerizing two or more different kinds of fluoro aliphatic group-containing monomers and two or more different kinds of (poly(oxyalkylene)) acrylates (or methacrylates).

Examples of commercially available surfactants include Megaface F178, Megaface F-470, Megaface F-473, Megaface F-475, Megaface F-476, and Megaface F-472 (manufactured by Dainippon Ink and Chemicals, Incorproated). Other examples include copolymers of a $C_6F_{13}$ group-containing acrylate (or methacrylate) and a (poly(oxyalkylene)) acrylate (or methacrylate), copolymers of a $C_6F_{13}$ group-containing acrylate (or methacrylate), a (poly(oxyethylene)) acrylate (or methacrylate) and a (poly(oxypropylene) acrylate (or methacrylate), copolymers of a $C_8F_{17}$ group-containing acrylate (or methacrylate) and a (poly(oxyalkylene)) acrylate (or methacrylate), and copolymers of a $C_8F_{17}$ group-containing acrylate (or methacrylate), a (poly(oxyethylene)) acrylate (or methacrylate) and a (poly(oxypropylene) acrylate (or methacrylate).

The amount of the fluorine and/or silicon based surfactant to be used is preferably from 0.0001 to 2% by weight, and more preferably from 0.001 to 1% by weight based on the total amount of the photosensitive composition (exclusive of the solvent).

(8) (H) Organic Solvent:

The photosensitive composition of the invention is used after dissolving the foregoing components in a prescribed solvent.

Examples of solvents that can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran.

In the invention, though the organic solvent may be used singly or in admixture, it is preferred to use a mixed solvent of a solvent containing a hydroxyl group in the structure thereof and a hydroxyl group-free solvent. Thus, it is possible reduce the generation of particles during preservation of resists.

Examples of hydroxyl group-containing solvents include ethylene glycol, ethylene glycol monomethyl ether, ethylene glycol monoethyl ether, propylene glycol, propylene glycol monomethyl ether, propylene glycol monoethyl ether, and ethyl lactate. Of these are particularly preferable propylene glycol monomethyl ether and ethyl lactate.

Examples of hydroxyl group-free solvents include propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide. Of these are particularly preferable propylene glycol monomethyl ether acetate, ethylethoxy propionate, 2-heptanone, γ-butyrolactone, cyclohexanone, and butyl acetate, and most preferable propylene glycol monomethyl ether acetate, ethylethoxy propionate, and 2-heptanone.

A mixing ratio (by weight) of the hydroxyl group-containing solvent to the hydroxyl group-free solvent is from 1/99 to 99/1, preferably from 10/90 to 90/10, and more preferably from 20/80 to 60/40. A mixed solvent containing 50% by weight or more of the hydroxyl group-free solvent is particularly preferable from the viewpoint of coating uniformity.

<Other Additives>

The photosensitive composition of the invention can further contain dyes, plasticizers, surfactants other the foregoing component (G), photo-sensitizers, and compounds for accelerating dissolution in a developer, as the need arises.

The compounds for accelerating dissolution in a developer, which can be used in the invention, are a low-molecular compound containing two or more phenolic OH groups or one or more carboxyl groups and having a molecular weight of not more than 1,000. In the case where a carboxyl group is contained, alicyclic or aliphatic compounds are preferable.

The content of such a compound for accelerating dissolution in a developer is preferably from 2 to 50% by weight, and more preferably from 5 to 30% by weight on a basis of the resin (B) or resin (D). When the content of such a compound for accelerating dissolution in a developer exceeds 50% by weight, development residue is deteriorated, and a new defect such that a pattern is deformed during development arises, therefore, such is not preferred.

Such phenol compounds having a molecular weight of not more than 1,000 can easily be synthesized by those skilled in the art while referring to methods as described in JP-A-4-122938, JP-A-2-28531, U.S. Pat. No. 4,916,210, and European Patent No. 219,294.

Specific examples of carboxyl group-containing alicyclic or aliphatic compounds include carboxylic acid derivatives having a steroid structure such as cholic acid, deoxycholic acid, and lithocholic acid, adamantanecarboxylic acid derivatives, adamantanedicarboxylic acid, cyclohexanecarboxylic acid, and cyclohexanedicarboxylic acid, but it should not be construed that the invention is limited thereto.

In the invention, other surfactants than the foregoing fluorine and/or silicon based surfactant (G) can also be added. Specific examples include nonionic surfactants such as polyoxyethylene alkyl ethers, polyoxyethylene alkylaryl ethers, polyoxyethylene/polyoxypropylene block copolymers, sorbitan aliphatic esters, and polyoxyethylene sorbitan aliphatic esters.

These surfactants may be added singly or in combination of two or more thereof.

<<Use Method>>

The photosensitive composition of the invention is used by dissolving the foregoing components in a prescribed organic solvent, and preferably the foregoing mixed solvent and then coating the solution on a prescribed support in the following manner.

For example, the photosensitive composition is coated on a substrate as used for fabrication of large scale integration circuits (such as silicon/silicon dioxide-coated substrates) in an appropriate coating method using a spinner, a coater, etc.

After coating, the photosensitive composition is irradiated with actinic rays through a prescribed mask and baked to undergo development. There can be thus obtained a good pattern. Examples of actinic rays include infrared rays, visible rays, ultraviolet rays, far ultraviolet rays, X rays, and electron beams. Of these are preferable far ultraviolet rays of not longer than 250 nm, and more preferably not loner than 220 nm. Specific examples include KrF excimer laser (248 nm), ArF excimer laser (193 nm), $F_2$ excimer laser (157 nm), X rays, and electron beams, with ArF excimer layer and $F_2$ excimer laser being particularly preferred. Incidentally, in the invention, it should be construed that X rays and electron beams are included within the scope of the actinic rays.

In the development step, the developer is used in the following manner. Examples of developers for resist composition include alkaline aqueous solutions such as inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide and tetraethylammonium hydroxide; and cyclic amines such as pyrrole and piperidine.

Additionally, suitable amounts of alcohols and surfactants can be added to the foregoing alkaline developer.

The alkali concentration of the alkaline developer is usually from 0.1 to 20% by weight, preferably from 0.2 to 15% by weight, and more preferably from 0.5 to 10% by weight.

The pH of the alkaline developer is usually from 10.0 to 15.0, preferably from 10.5 to 14.5, and more preferably from 11.0 to 14.0.

The invention will be described below in more detail with reference to the following Examples, but it should not be construed that the invention is limited thereto.

<Synthesis of Acid Generator (A)>

SYNTHESIS EXAMPLE 1

Synthesis of Compound (I-1)

Acetonitrile (300 mL) was mixed with 20.3 g of diisopropyl ketone, 32 g of sodium iodide, and 21.6 g of triethylamine, to which was gradually added 23.1 g of chlorotrimethylsilane. The mixed solution was reacted at 50° C. for 4 hours and then allowed to stand for cooling. The reaction mixture was poured into ice and extracted with hexane. An organic phase was rinsed with a sodium hydrogencarbonate solution, dried, and then concentrated. The resultant was purified by distillation in vacuo to obtain 32 g of 2,4-dimethyl-3-trimethylsilyloxy-2-pentene (silylenol ether of diisopropyl ketone). The resulting silylenol ether (15 g) and 8.8 g of tetramethylene sulfoxide were dissolved in 150 mL of chloroform under a nitrogen gas stream. The solution was cooled to −30° C. or lower, and 17.7 g of trifluoroacetic anhydride was added dropwise thereto over 30 minutes. The mixture was reacted at room temperature for 1 hour, and a solution of potassium nonafluorobutanesulfonate in acetonitrile/water was added to the reaction mixture. The mixture was extracted with chloroform, and an organic phase was subjected to alkali rinsing with a 5% by weight tetramethylammonium hydroxide aqueous solution, followed by rinsing with distilled water until aqueous phases had become neutral. An organic phase was concentrated, and diisopropyl ether was added to the resulting crude product to deposit a powder. The powder was collected by filtration to obtain 17 g of Compound (I-1).

300 MHz $^1$H-NMR (CDCl$_3$) δ1.18 (d, 6H), δ1.85 (s, 6H), δ2.2 to 2.4 (m, 4H), δ3.1 (m, 1H), δ3.4 to 3.7 (m, 4H)

<Synthesis of Resin (B)>

SYNTHESIS EXAMPLE 1

Synthesis of Resin (1) (Side-Chain Type)

2-Ethyl-2-adamantyl methacrylate and butyrolactone methacrylate were charged in a ratio of 55/45 and dissolved in methyl ethyl ketone/tetrahydrofuran (5/5) to prepare 100 mL of a solution having a concentration of solid contents of 20%. To this solution was added 2% by mole of V-65 (manufactured by Wako Pure Chemical Industries, Ltd.), and the mixture was added dropwise to 10 mL of methyl ethyl ketone heated at 60° C. in a nitrogen atmosphere over 4 hours. After completion of the dropwise addition, the reaction mixture was heated for 4 hours, to which was added again 1% by mole of V-65, and the mixture was stirred for 4 hours. After completion of the reaction, the reaction mixture was cooled to room temperature and crystallized from 3 L of a mixed solvent of distilled water/isopropyl alcohol (1/1) to recover Resin (1) as a deposited white powder.

Resin (1) had a polymer composition ratio, as determined by $C^{13}$ NMR, of 46/54. Further, Resin (1) had a weight average molecular weight, as reduced into standard polystyrene by the GPC measurement, of 10,700.

Resins (2) to (12), (26) and (27) were synthesized in the same manner as in Synthesis Example 1.

Structures and molecular weights of Resins (1) to (12), (26) and (27) will be given below.

-continued

| | Molecular weight |
|---|---|
| (5) structures | 8900 |
| (6) structures | 11300 |
| (7) structures | 8900 |
| (8) structures | 11700 |

-continued

| | Molecular weight |
|---|---|
| (9) chemical structures | 9800 |
| (10) chemical structures | 8700 |
| (11) chemical structures | 13400 |
| (12) chemical structures | 10900 |
| (26) chemical structures | 9300 |

-continued

|  | Molecular weight |
|---|---|
| (27) [structure: copolymer with 2-(1-adamantyl)propan-2-yl ester unit (40), hydroxy-adamantyl ester unit (50), and butyrolactone unit (10)] | 7600 |

SYNTHESIS EXAMPLE 2

Synthesis of Resin (13) (Main Chain Type)

Into a separable flask were charged norbornenecarboxylic acid t-butyl ester, norbornenecarboxylic acid butyrolactone ester and maleic anhydride (molar ratio: 40/10/50) and THF (reaction concentration: 60% by weight), and the mixture was heated at 60° C. in a nitrogen gas stream. When the reaction temperature became stable, 2% by mole of a radical initiator, V-601 (manufactured by Wako Pure Chemical Industries, Ltd.) was added thereto to start reaction. The mixture was heated for 12 hours. The resulting reaction mixture was diluted two times with tetrahydrofuran and added to a mixed solution of hexane/isopropyl alcohol (1/1) to deposit a white powder. The deposited powder was collected by filtration and dried to obtain desired Resin (13).

The obtained Resin (13) was analyzed for molecular weight by GPC and found to have a weight average molecular weight, as reduced into polystyrene, of 8,300. Further, it was confirmed from NMR spectrum that Resin (13) had a molar ratio of repeating units of norbornenecarboxylic acid t-butyl ester to norbornenecarboxylic acid butyrolactone ester to maleic anhydride of 42/8/50.

Resins (14) to (19) were synthesized in the same manner as in Synthesis Example 2.

Structures and molecular weights of Resins (13) and (19) will be given below.

|  | Molecular weight |
|---|---|
| (13) [norbornene-COO-tBu (42) / norbornene-COO-butyrolactone (8) / maleic anhydride (50)] | 8300 |
| (14) [norbornene-COO-tBu-ethyl (35) / norbornene-COO-hydroxyadamantyl (15) / maleic anhydride (50)] | 8200 |
| (15) [norbornene-spiro-butyrolactone (60) / norbornene-CH(OH)CH2-COO-tBu (40)] | 9600 |

-continued

|     |     |     |     | Molecular weight |
| --- | --- | --- | --- | --- |
| (16) | [structure: norbornene-spirolactone, 20] | [structure: norbornene-COO-t-butyl, 70] | [structure: norbornene-COOH, 10] | 5800 |
| (17) | [structure: norbornene-COO-methylcyclohexyl-ethyl, 30] | [structure: norbornene-COO-CH2-CH(OH)-CH3, 20] | [maleic anhydride, 50] | 4700 |
| (18) | [structure: tetracyclic-COO-t-amyl, 33] | [structure: norbornene-COO-lactone bicyclic, 17] | [maleic anhydride, 50] | 8500 |
| (19) | [structure: norbornene-COO-methylcyclohexyl-ethyl, 38] | [structure: norbornene-COO-(methylcyclohexanone), 12] | [maleic anhydride, 50] | 8900 |

SYNTHESIS EXAMPLE 3

Synthesis of Resin (20) (Hybrid Type)

In a reaction vessel were charged norbornene, maleic anhydride, t-butyl acrylate, and 2-methylcyclohexyl-2-propyl acrylate in a molar ratio of 35/35/20/10 and dissolved in tetrahydrofuran to prepare a solution having a solids content of 60%. This solution was heated at 65° C. under a nitrogen gas stream. When the reaction temperature became stable, 1% by mole of a radical initiator, V-601 (manufactured by Wako Pure Chemical Industries, Ltd.) was added thereto to start reaction. The mixture was heated for 8 hours, and the reaction mixture was diluted two times with tetrahydrofuran. Thereafter, the reaction mixture was added to 5 times by volume of hexane to deposit a white powder. The deposited powder was collected by filtration and dissolved in methyl ethyl ketone. The solution was re-precipitated in 5 times by volume of a mixed solvent of hexane/t-butyl methyl ether (1/1). A deposited white powder was collected by filtration and dried to obtain desired Resin (20).

The obtained Resin (20) was analyzed for molecular weight by GPC and found to have a weight average molecular weight, as reduced into polystyrene, of 12,100. Further, it was confirmed from NMR spectrum that Resin (20) had a composition of norbornene to maleic anhydride to t-butyl acrylate to 2-methylcyclohexyl-2-propyl acrylate of 32/39/19/10 in terms of molar ratio.

Resins (21) to (25) were synthesized in the same manner as in Synthesis Example 3.

Structures and molecular weights of Resins (20) and (25) will be given below.

| | | | | Molecular weight |
|---|---|---|---|---|
| (20) 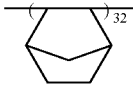 | 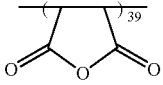 | 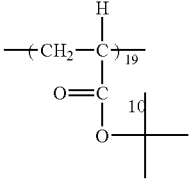 | 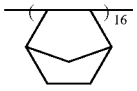 | 12100 |
| (21) 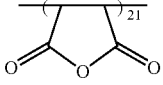 | 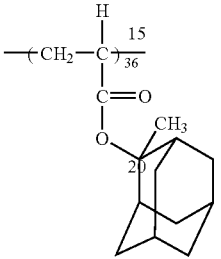 | 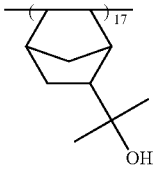 | 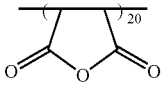 | 13900 |
| (22) 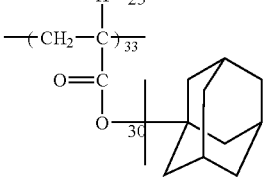 |  | 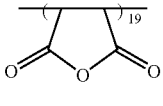 | 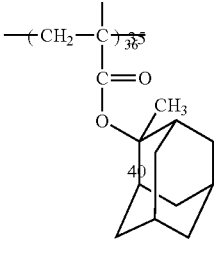 | 12400 |
| (23) 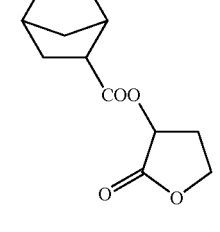 | 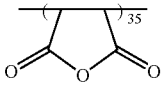 | 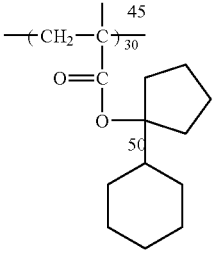 | 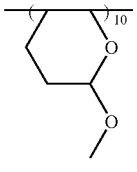 | 12700 |
| (24)  | | | | 10800 |
| (25) 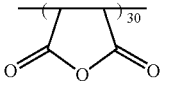 | | | | 9300 |

SYNTHESIS EXAMPLE 4

Synthesis of Resin (FII-1)

t-Butyl α-trifluoromethylacrylate (20 g) and 20 g of 3-(2-hydroxymethyl-2,2-bistrifluoromethylethyl)norbornene were dissolved in 40 g of THF, and the solution was heated to 70° C. under a nitrogen gas stream. Thereafter, 2.0 g of a polymerization initiator, V-65 (manufactured by Wako Pure Chemical Industries, Ltd.) was added thereto, and the mixture was stirred for 6 hours as it was. After allowing the reaction mixture to stand for cooling to room temperature, 300 mL of hexane was added to the reaction mixture to recover a deposited resin. The obtained resin was dissolved in acetone, and hexane was again added to the solution to remove unreacted monomers and oligomer components. There was thus obtained Resin (FII-1) to be used in the invention.

Resins (FII-2) to (FII-26) were synthesized in the same manner as in Synthesis Example 4.

Structures of Resins (FII-1) to (FII-26) will be given below.

Further, weight average molecular weights of Resins (FII-1) to (FII-26) will be shown in Tables 1 to 2.

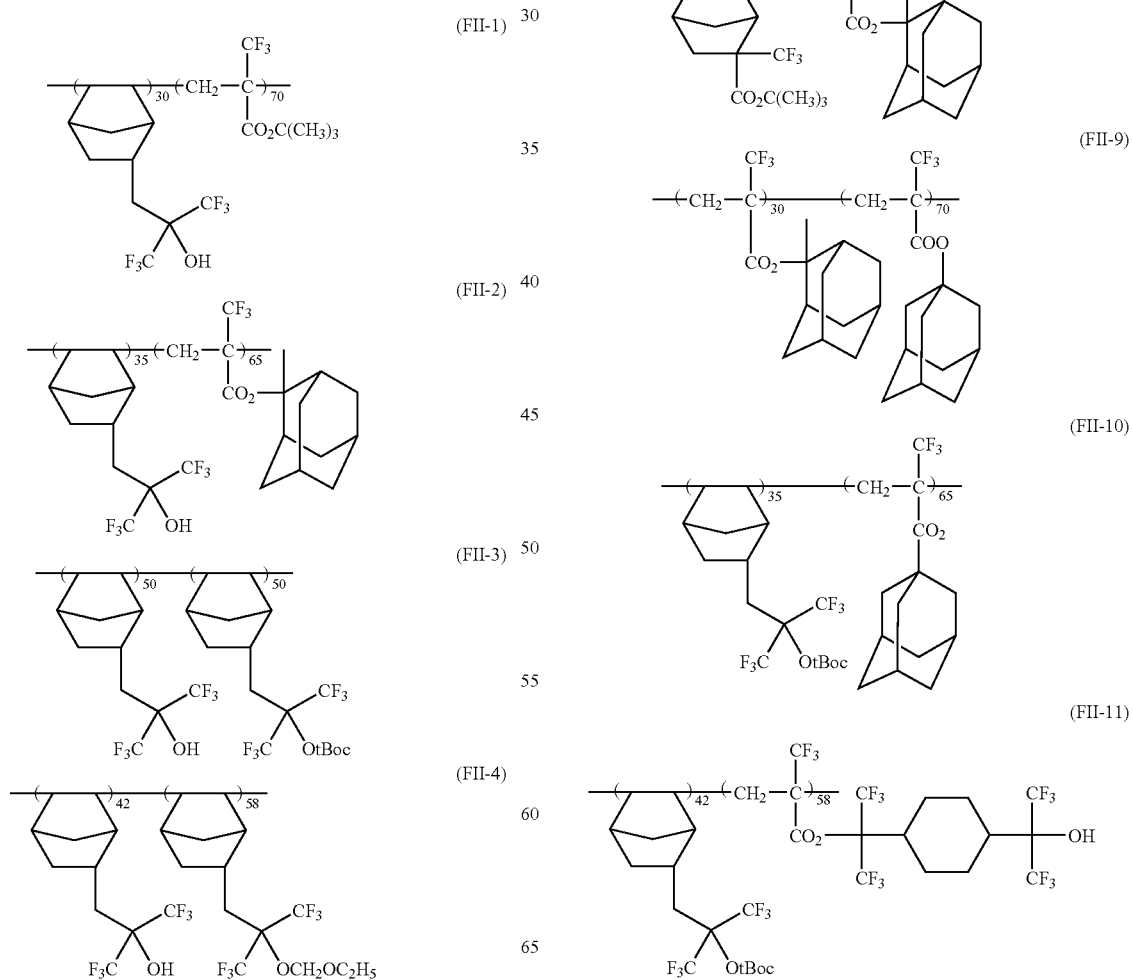

(FII-12) 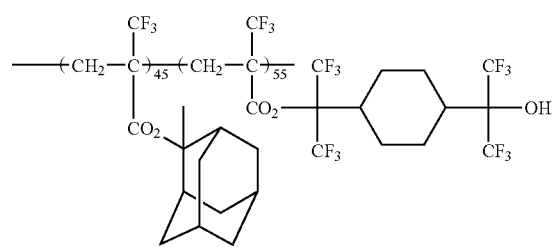
(FII-13) 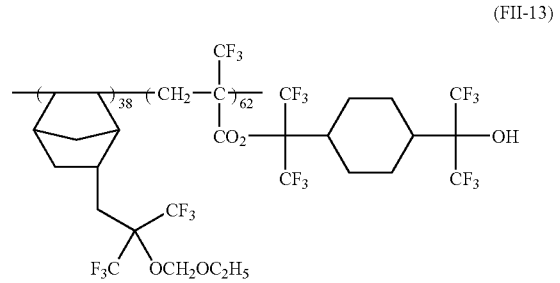
(FII-14) 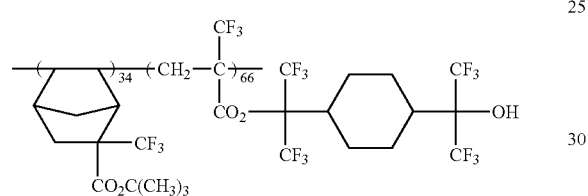
(FII-15) 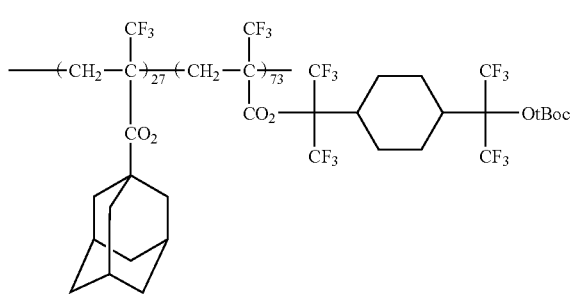
(FII-16) 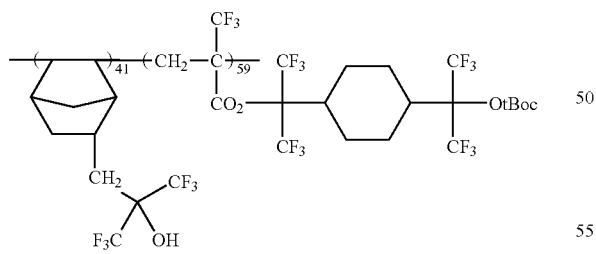
(FII-17) 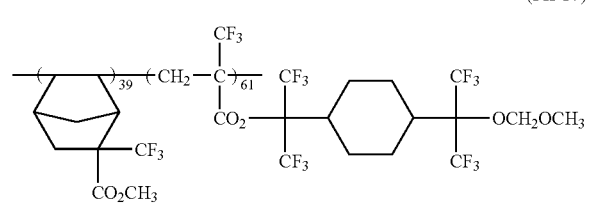
(FII-18) 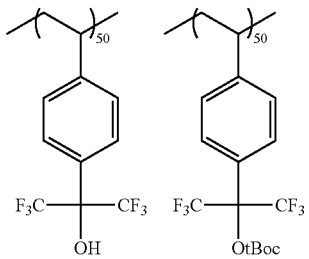
(FII-19) 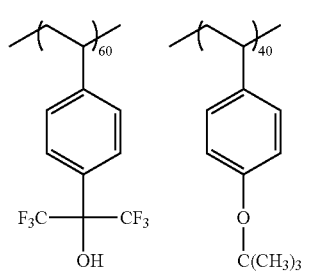
(FII-20) 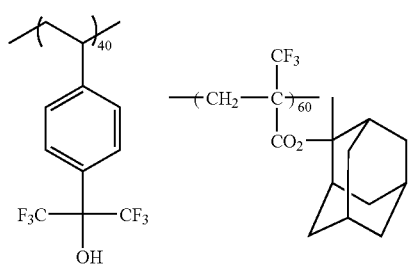
(FII-21) 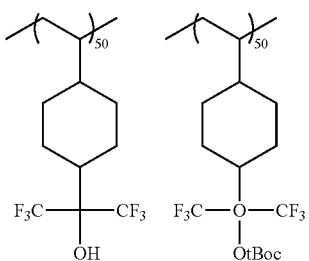
(FII-22) 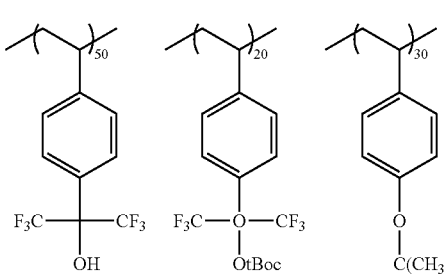
(FII-23) 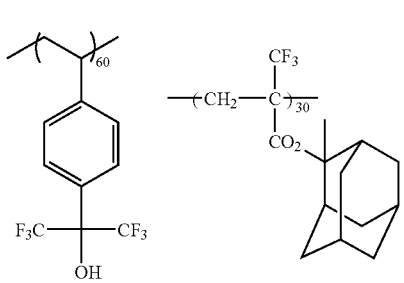

-continued

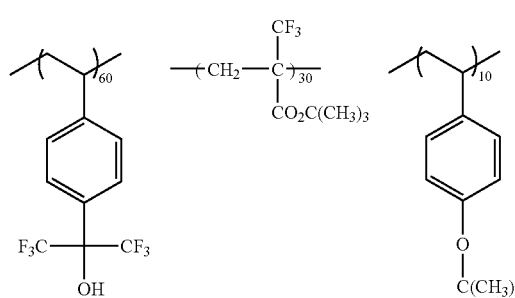

(FII-24)

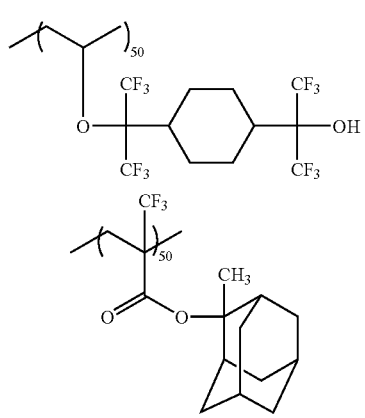

(FII-25)

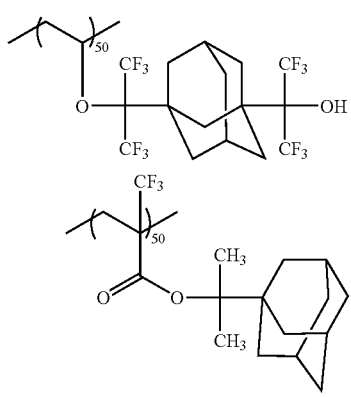

(FII-26)

TABLE 1-continued

| Resin | Weight average molecular weight (Mw) | Degree of dispersion | Content of oligomers having a molecular weight of not more than 1,000 |
| --- | --- | --- | --- |
| (FII-17) | 16900 | 1.42 | 8 |
| (FII-18) | 15900 | 1.85 | 9 |
| (FII-19) | 15000 | 1.55 | 4 |
| (FII-20) | 12500 | 1.88 | 8 |
| (FII-21) | 25000 | 1.68 | 9 |
| (FII-22) | 16000 | 1.54 | 7 |
| (FII-23) | 14600 | 1.95 | 5 |
| (FII-24) | 17500 | 1.48 | 5 |

TABLE 2

| Resin | Weight average molecular weight (Mw) | Degree of dispersion | Content of oligomers having a molecular weight of not more than 1,000 |
| --- | --- | --- | --- |
| (FII-25) | 16500 | 1.52 | 6 |
| (FII-26) | 14600 | 1.63 | 5 |

<Resin (D)>

Structures, molecular weights and molecular weight distributions of resins (D) to be used in the Examples will be given below.

| | | Mw | Mw/Mn |
| --- | --- | --- | --- |
| P-1 | | 17000 | 2.15 |
| P-2 | | 16000 | 2.30 |
| P-3 | | 19000 | 2.2 |
| P-4 | | 12000 | 1.2 |

TABLE 1

| Resin | Weight average molecular weight (Mw) | Degree of dispersion | Content of oligomers having a molecular weight of not more than 1,000 |
| --- | --- | --- | --- |
| (FII-1) | 15200 | 1.45 | 5 |
| (FII-2) | 24000 | 1.75 | 8 |
| (FII-3) | 18200 | 1.85 | 7 |
| (FII-4) | 16500 | 1.46 | 6 |
| (FII-5) | 9500 | 1.58 | 8 |
| (FII-6) | 19500 | 2.02 | 8 |
| (FII-7) | 6500 | 1.85 | 7 |
| (FII-8) | 28400 | 1.68 | 9 |
| (FII-9) | 28600 | 1.44 | 5 |
| (FII-10) | 12800 | 1.65 | 8 |
| (FII-11) | 16800 | 1.68 | 9 |
| (FII-12) | 28400 | 1.58 | 6 |
| (FII-13) | 19800 | 1.69 | 8 |
| (FII-14) | 8700 | 1.95 | 8 |
| (FII-15) | 15200 | 1.46 | 7 |
| (FII-16) | 19500 | 1.65 | 4 |

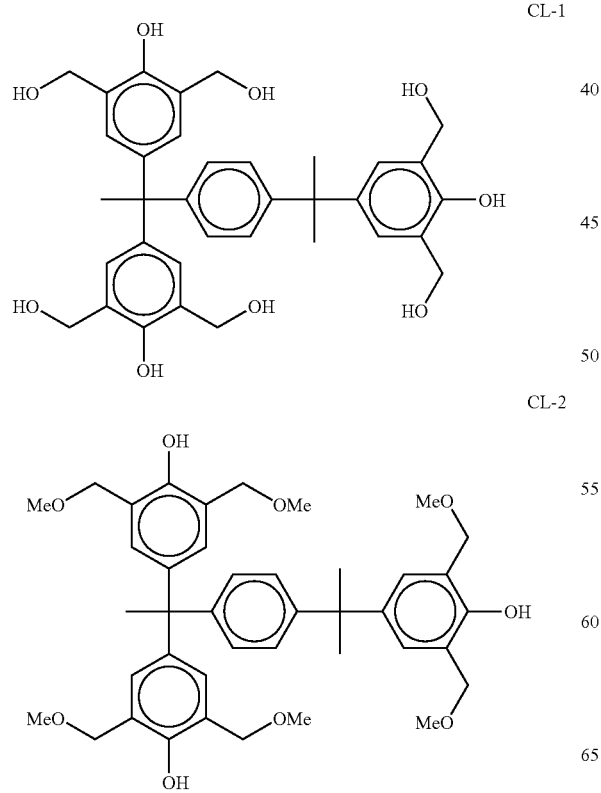
P-6 is VP-5000 manufactured by Nippon Soda Co., Ltd.
<Crosslinking Agent (E)>
Structures of crosslinking agents to be used in the Examples will be given below.

EXAMPLES 1 To 36 AND COMPARATIVE EXAMPLE 1

<Preparation of Resist>

Components as shown in Table 3 or 4 were dissolved in a solvent to prepare solutions each having a concentration of solid contents of 12% by weight. Each of the solutions was filtered through a 0.1 μm polytetrafluoroethylene filter or polyethylene filter to prepare positive resist solutions. The thus prepared positive resist solutions were evaluated in the following methods. The results are shown in Tables 5 and 6.

TABLE 3

| | Resin (B) (10 g) | Acid generator (g) | Basic Compound (g) | Surfactant (0.03 g) | Solvent (weight ratio) | Component (C) (g) |
|---|---|---|---|---|---|---|
| Example 1 | (1) | I-1 (0.6) | DBN (0.02) | W-1 | A1 = 100 | — |
| Example 2 | (2) | I-2 (0.5) Z33 (0.15) | TMEA (0.02) | W-1 | A1 = 100 | — |
| Example 3 | (3) | I-3 (0.3) Z46 (0.2) | TPSA (0.02) | W-2 | A1 = 100 | — |
| Example 4 | (4) | I-4 (0.3) Z44 (0.2) | HEP (0.01) | W-2 | A3/B1 = 80/20 | — |
| Example 5 | (5) | I-5 (0.6) Z45 (0.1) | TOA (0.03) | W-3 | A2/B1 = 90/10 | — |
| Example 6 | (6) | I-1 (0.3) Z31 (0.15) | TBAH (0.01) | W-3 | A4/B1 = 90/10 | LCB (1) |
| Example 7 | (7) | I-1 (0.05) Z33 (0.15) Z31 (0.3) | TPA (0.007) | W-4 | A1/B1 = 50/50 | — |
| Example 8 | (8) | I-10 (0.5) | DBN (0.02) | W-4 | A1/B1 = 90/10 | — |
| Example 9 | (9) | I-11 (0.1) Z3 (0.2) | TPI (0.03) | W-1 | A5/B2 = 90/10 | — |
| Example 10 | (10) | I-8 (0.2) Z34 (0.2) | TPI (0.02) | W-1 | A1/B1 = 95/5 | — |
| Example 11 | (11) | I-14 (0.1) Z1 (0.05) Z26 (0.1) | DIA (0.02) | W-2 | A1/B1 = 90/10 | — |
| Example 12 | (12) | I-15 (0.3) Z33 (0.15) | DIA (0.01) HAP (0.01) | W-2 | A1/B1 = 95/5 | — |
| Example 13 | (13) | I-16 (0.3) Z14 (0.1) | TPI (0.03) | W-3 | A1/B1 = 95/5 | — |
| Example 14 | (14) | I-17 (0.2) Z21 (0.3) Z33 (0.075) | DBN (0.02) | W-3 | A1/B1 = 95/5 | — |
| Example 15 | (15) | I-18 (0.2) Z7 (0.05) Z2 (0.1) | DIA (0.02) | W-4 | A1/B1 = 80/20 | — |
| Example 16 | (16) | I-19 (0.1) Z33 (0.2) | TPA (0.01) | W-4 | A1 = 100 | — |
| Example 17 | (17) | I-20 (0.1) Z33 (0.2) | TPI (0.03) | W-4 | A1 = 100 | — |
| Example 18 | (18) | I-21 (0.2) Z22 (0.2) | DCMA (0.01) | W-4 | A1 = 100 | — |
| Example 19 | (19) | I-22 (0.3) Z29 (0.1) Z35 (0.2) | TPI (0.02) | W-4 | A1/B1 = 95/5 | — |
| Example 20 | (20) | I-23 (0.2) Z17 (0.2) | TPI (0.03) | W-4 | A1/B1 = 95/5 | — |
| Example 21 | (21) | I-24 (0.2) Z32 (0.2) | DBN (0.02) | W-1 | A1/B1 = 95/5 | — |
| Example 22 | (22) | I-25 (0.5) Z8 (0.1) | DIA (0.01) HAP (0.01) | W-1 | A1/B1 = 80/20 | — |
| Example 23 | (23) | I-26 (0.4) Z41 (0.15) | TPSA (0.02) | W-2 | A1/B1 = 90/10 | — |
| Example 24 | (24) | I-27 (0.1) Z5 (0.15) | HEP (0.01) | W-2 | A3/B2 = 80/20 | — |
| Example 25 | (25) | I-28 (0.15) Z13 (0.15) | DIA (0.02) | W-3 | A2/B1 = 90/10 | — |
| Example 26 | (26) | I-29 (0.7) Z12 (0.1) | DIA (0.03) | W-3 | A4/B1 = 90/10 | — |
| Example 27 | (27) | I-30 (0.1) Z43 (0.2) | TPA (0.007) | W-4 | A1/B1 = 50/50 | — |

TABLE 4

| | Resin (B) (10 g) | Acid generator (g) | Basic Compound (g) | Surfactant (0.03 g) | Solvent (weight ratio) |
|---|---|---|---|---|---|
| Example 28 | (2) (5 g) (7) (5 g) | I-1 (0.7) Z44 (0.3) | DIA (0.02) PEA (0.02) | W-4 | A1/B1 = 60/40 |
| Example 29 | (1) (3 g) (7) (7 g) | I-18 (0.5) Z45 (0.2) | DIA (0.01) PEA (0.02) | W-4 | A1/B1 = 60/40 |
| Example 30 | (6) (5 g) (7) (5 g) | I-25 (0.7) Z43 (0.1) | DIA (0.02) PEA (0.01) | W-4 | A1/B1 = 60/40 |
| Example 31 | (7) (5 g) (23) (5 g) | I-1 (0.2) Z33 (0.15) Z46 (0.4) | DIA (0.03) PEA (0.02) | W-4 | A1/B1 = 60/40 |
| Example 32 | (6) (7 g) (25) (3 g) | I-1 (0.5) Z40 (0.3) | DIA (0.01) TMEA (0.01) | W-4 | A1/B1 = 60/40 |
| Example 33 | (7) (5 g) (15) (5 g) | I-2 (0.3) I-3 (0.3) Z33 (0.1) | DIA (0.01) DCMA (0.005) | W-4 | A1/B1 = 60/40 |
| Example 34 | (6) (7 g) (21) (3 g) | I-1 (0.4) Z21 (0.2) Z6 (0.1) | REA (0.02) | W-4 | A1/B1 = 60/40 |
| Example 35 | (7) (6 g) (16) (4 g) | I-1 (1) | PEA (0.01) DCMA (0.005) | W-4 | A1/B1 = 60/40 |
| Example 36 | (2) (3 g) (13) (7 g) | I-1 (0.05) Z33 (0.15) Z31 (0.3) | DIA (0.01) PEA (0.01) | W-4 | A1/B1 = 60/40 |
| Comparative Example 1 | (1) | PAG-X (0.6) | DBN (0.02) | W-1 | A1 = 100 |

In each of the tables, the abbreviations are as follows.

| | |
|---|---|
| DBN: | 1,5-Diazabicyclo[4.3.0]nona-5-ene |
| TPI: | 2,4,5-Triphenyl imidazole |
| TPSA: | Triphenylsulfonium acetate |
| HEP: | N-Hydroxyethylpyridine |
| DIA: | 2,6-Diisopropylaniline |
| DCMA: | Dicyclohexylmethylamine |
| TPA: | Tripentylamine |
| TOA: | Tir-n-octylamine |
| HAP: | Hydroxyantipyrine |
| TBAH: | Tetrabutylammonium hydroxide |
| TMEA: | Tris(methoxyethoxyethyl)amine |
| PEA: | N-Phenyldiethanolamine |
| W-1: | Megaface F176 (manufactured by Dainippon Ink and Chemicals, Incorporated) (fluorine based) |
| W-2: | Megaface R08 (manufactured by Dainippon Ink and Chemicals, Incorporated) (fluorine and silicon based) |
| W-3: | Polysiloxane polymer KP-341 (manufactured by Shin-Etsu Chemical Co., Ltd.) (silicon based) |
| W-4: | Troyl Sol S-366 (manufactured by Troy Chemical Industries, Inc.) |
| A1: | Propylene glycol methyl ether acetate |
| A2: | 2-Heptane |
| A3: | Ethylethoxy propionate |
| A4: | γ-Butyrolactone |
| A5: | Cyclohexanone |
| B1: | Propylene glycol methyl ether |
| B2: | Ethyl lactate |
| LCB: | t-Butyl lithocholate |

The acid generator (PAG-X) is as follows.

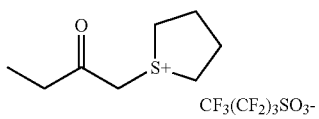

$CF_3(CF_2)_3SO_3^-$

Incidentally, in each of the tables, in the case of a plurality of resins or solvents were used, the designated ratio is a weight ratio.

<Evaluation of Resist>

An antireflection film, DUV-42 (manufactured by Brewer Science, Inc.) was uniformly coated in a thickness of 600 angstroms on a silicon substrate treated with hexamethyl disilazane using a spin coater, dried at 100° C. for 90 seconds on a hot plate, and then heated and dried at 190° C. for 240 seconds. Thereafter, each of the positive resist solutions was coated thereon using a spin coater and dried at 120° C. for 90 seconds to form a 0.30 μm-thick resist film.

The resist film was exposed by an ArF excimer laser stepper (manufactured by ISI, Inc., NA=0.6) through a mask and immediately after the exposure, heated at 120° C. for 90 seconds on a hot plate. Further, the resulting resist film was developed with a 2.38% tetramethylammonium hydroxide aqueous solution at 23° C. for 60 seconds, rinsed with pure water for 30 seconds, and then dried to obtain a line pattern.

(1) Sensitivity:

Exposure amount necessary for reproducing a 1/1 line-and-space mask pattern of 0.15 μm.

(2) Profile:

A line profile of the 1/1 line-and-space of 0.15 μm was observed by a scanning microscope and evaluated according to the following criteria.

A: The profile is completely rectangular.
B: The profile is in a slight taper shape or somewhat tailing shape.
C: The profile is in a complete taper shape or complete tailing shape.

TABLE 5

| | Sensitivity (mJ/cm²) | Profile |
|---|---|---|
| Example 1 | 14 | A |
| Example 2 | 11 | A |
| Example 3 | 10 | A |
| Example 4 | 13 | A |
| Example 5 | 15 | A |
| Example 6 | 12 | A |

TABLE 5-continued

| | Sensitivity (mJ/cm$^2$) | Profile |
|---|---|---|
| Example 7 | 11 | A |
| Example 8 | 15 | A |
| Example 9 | 14 | A |
| Example 10 | 10 | A |
| Example 11 | 13 | A |
| Example 12 | 15 | A |
| Example 13 | 11 | A |
| Example 14 | 13 | A |
| Example 15 | 13 | A |
| Example 16 | 15 | A |
| Example 17 | 12 | A |
| Example 18 | 14 | A |
| Example 19 | 13 | A |
| Example 20 | 15 | A |
| Example 21 | 12 | A |
| Example 22 | 12 | A |
| Example 23 | 11 | A |
| Example 24 | 10 | A |
| Example 25 | 14 | A |
| Example 26 | 10 | A |
| Example 27 | 13 | A |

TABLE 6

| | Sensitivity (mJ/cm$^2$) | Profile |
|---|---|---|
| Example 28 | 13 | A |
| Example 29 | 11 | A |
| Example 30 | 13 | A |
| Example 31 | 15 | A |
| Example 32 | 11 | A |
| Example 33 | 10 | A |
| Example 34 | 12 | A |
| Example 35 | 14 | A |
| Example 36 | 12 | A |
| Comparative Example 1 | 36 | B |

It is evident from Tables 5 and 6 that the positive resist compositions of Examples 1 to 36 are excellent with respect to sensitivity and pattern profile.

EXAMPLES 37 TO 48 AND COMPARATIVE EXAMPLE 2

<Preparation of Resist>

Components as shown in Table 7 were dissolved in a solvent, and each of the solutions was filtered through a 0.1 μm polytetrafluoroethylene filter to prepare positive resist solutions each having a concentration of solid contents of 12% by weight.

The thus prepared positive resist solutions were evaluated in the following methods. The results are shown in Table 9.

TABLE 7

| | Acid generator (g) | Resin (10 g) (weight ratio) | Basic Compound (g) | Surfactant (0.03 g) | Solvent (weight ratio) | Dissolution inhibiting compound (g) |
|---|---|---|---|---|---|---|
| Example 37 | I-1 (0.6) | R-2 | DBN (0.02) | W-1 | A1 = 100 | — |
| Example 38 | I-2 (0.5) Z33 (0.15) | R-7 | TPI (0.03) | W-1 | A1 = 100 | — |
| Example 39 | I-3 (0.3) Z46 (0.2) | R-8 | TPSA (0.01) | W-2 | A1 = 100 | — |
| Example 40 | I-4 (0.3) Z44 (0.2) | R-9 | HEP (0.02) | W-2 | A3/B1 = 80/20 | — |
| Example 41 | I-5 (0.6) Z45 (0.1) | R-17 | DIA (0.05) | W-3 | A2/B1 = 90/10 | — |
| Example 42 | I-1 (0.3) Z31 (0.15) | R-23 | DCMA (0.03) | W-4 | A4/B1 = 90/10 | — |
| Example 43 | I-1 (0.05) Z33 (0.15) Z31 (0.3) | R-24 | TPA (0.01) | W-4 | A1/B1 = 50/50 | — |
| Example 44 | I-10 (0.5) | R-2/R-23 = 50/50 | TOA (0.005) | W-4 | A1/B1 = 90/10 | — |
| Example 45 | I-11 (0.1) Z3 (0.2) | R-17/R-2 = 30/70 | TBAH (0.0015) | W-4 | A5/B2 = 90/10 | — |
| Example 46 | I-8 (0.2) Z34 (0.2) | R-2/R-22 = 50/50 | TMEA (0.02) | W-4 | A1/B1 = 95/5 | — |
| Example 47 | I-14 (0.1) Z1 (0.05) Z26 (0.1) | PHS* | HAP (0.01) | W-1 | A1/B1 = 90/10 | C-1 (2) |
| Example 48 | I-15 (0.3) Z33 (0.15) | R-2 | DBN (0.002) | W-2 | A1/B1 = 95/5 | C-2 (1) |
| Comparative Example 2 | PAG-X (0.6) | R-2 | DBN (0.02) | W-1 | A1 = 100 | — |

PHS*: Polyhydroxystyrene (VP-8000: manufactured by Nippon Soda Co., Ltd.)

Molar ratios and weight average molecular weights of Resins (R-2) to (R-24) in Table 7 will be shown in Table 8.

TABLE 8

| Resin | Molar ratio of repeating units (corresponding to the order from the left side) | Weight average molecular weight |
|---|---|---|
| R-2 | 60/40 | 12000 |
| R-7 | 60/30/10 | 18000 |

TABLE 8-continued

| Resin | Molar ratio of repeating units (corresponding to the order from the left side) | Weight average molecular weight |
|---|---|---|
| R-8 | 60/20/20 | 12000 |
| R-9 | 10/50/40 | 13000 |
| R-17 | 10/70/20 | 15000 |
| R-22 | 70/30 | 12000 |
| R-23 | 10/60/30 | 8000 |
| R-24 | 50/20/30 | 16000 |

Structures of the dissolution inhibiting compounds (C-1) and (C-2) in Table 7 are as follows.

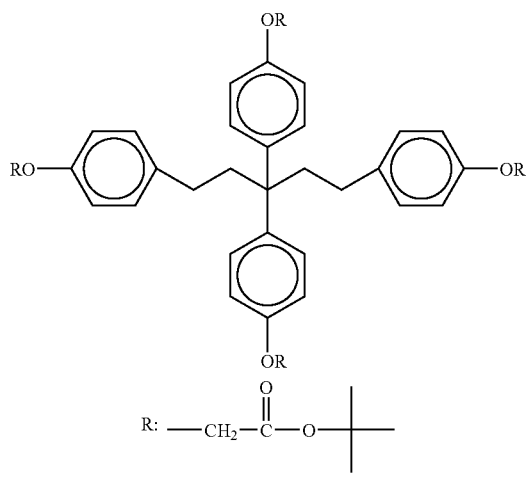

(C-1)

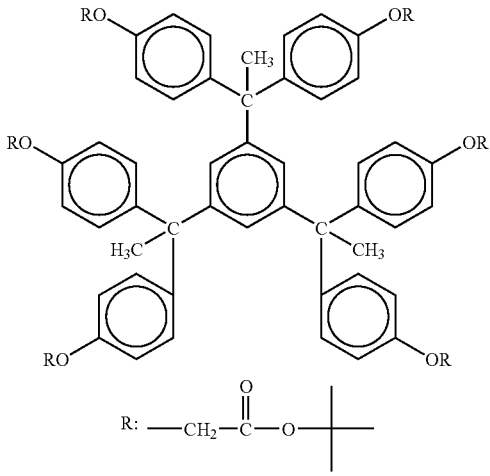

(C-2)

<Evaluation of Resist>

Each of the prepared positive resist solutions was uniformly coated on a silicon substrate treated with hexamethyl disilazane using a spin coater and dried at 120° C. for 90 seconds to form a 0.3 μm-thick resist film.

The resist film was irradiated using an electron beam projection lithography system (acceleration voltage: 100 keV) (manufactured by Nikon Corporation) and immediately after the irradiation, heated at 110° C. for 90 seconds on a hot plate. Further, the resulting resist film was evaluated for sensitivity in the same manner as in Example 1, except for developing with a 2.38% tetramethylammonium hydroxide aqueous solution at 23° C. for 60 seconds, rinsing with pure water for 30 seconds, and then drying to form a line pattern of 1/1 line-and-space of 0.10 μm.

TABLE 9

|  | Seonsitivity ($\mu$ C/cm$^2$) |
|---|---|
| Example 37 | 5 |
| Example 38 | 3 |
| Example 39 | 6 |
| Example 40 | 4 |
| Example 41 | 4 |
| Example 42 | 3 |
| Example 43 | 4 |
| Example 44 | 5 |
| Example 45 | 6 |
| Example 46 | 4 |
| Example 47 | 6 |
| Example 48 | 3 |
| Comparative Example 2 | 14 |

It is evident from Table 9 that the positive resist compositions of Examples 37 to 48 are excellent with respect to sensitivity.

EXAMPLES 49 TO 60 AND COMPARATIVE EXAMPLE 3

<Preparation of Resist>

Each of compositions as shown in Table 10 was filtered through a 0.1 μm polytetrafluoroethylene filter to prepare negative resist solutions each having a concentration of solid contents of 12% by weight.

The thus prepared negative resist solutions were evaluated in the same manner as in Example 37. The results are shown in Table 11.

TABLE 10

|  | Acid generator (g) | Resin (10 g) (weight ratio) | Basic Compound (g) | Surfactant (0.03 g) | Solvent (weight ratio) | Crosslinking agent (g) |
|---|---|---|---|---|---|---|
| Example 49 | I-1 (0.6) | P-1 | DIA (0.05) | W-1 | A1 = 100 | CL-1 (2) |
| Example 50 | I-2 (0.5) Z33 (0.15) | P-2 | TPI (0.03) | W-1 | A1 = 100 | CL-2 (3) |

TABLE 10-continued

| | Acid generator (g) | Resin (10 g) (weight ratio) | Basic Compound (g) | Surfactant (0.03 g) | Solvent (weight ratio) | Crosslinking agent (g) |
|---|---|---|---|---|---|---|
| Example 51 | I-3 (0.3) Z46 (0.2) | P-3 | TOA (0.005) | W-2 | A1 = 100 | CL-3 (2.5) |
| Example 52 | I-4 (0.3) Z44 (0.2) | P-4 | HEP (0.02) | W-2 | A3/B1 = 80/20 | CL-4 (3) |
| Example 53 | I-5 (0.6) Z45 (0.1) | P-5 | DBN (0.03) | W-3 | A2/B1 = 90/10 | CL-5 (1.5) |
| Example 54 | I-1 (0.3) Z31 (0.15) | P-6 | DCMA (0.03) | W-4 | A4/B1 = 90/10 | CL-6 (3) |
| Example 55 | I-1 (0.05) Z33 (0.15) Z31 (0.3) | P-1 | TPA (0.01) | W-4 | A1/B1 = 50/50 | CL-7 (2.5) |
| Example 56 | I-10 (0.5) | P-2/P-6 (80/20) | TPSA (0.1) | W-4 | A1/B1 = 90/10 | CL-8 (2.5) |
| Example 57 | I-11 (0.1) Z3 (0.2) | P-3 | TBAH (0.015) | W-4 | A5/B2 = 90/10 | CL-1 (2) CL-5 (2) |
| Example 58 | I-8 (0.2) Z34 (0.2) | P-4 | TMEA (0.02) | W-4 | A1/B1 = 95/5 | CL-2 (1) CL-7 (2) |
| Example 59 | I-14 (0.1) Z1 (0.05) Z26 (0.1) | P-5 | HAP (0.01) | W-1 | A1/B1 = 90/10 | CL-1 (2.5) |
| Example 60 | I-15 (0.3) Z33 (0.15) | P-6 | DBN (0.002) | W-2 | A1/B1 = 95/5 | CL-2 (2.5) |
| Comparative Example 3 | PAG-X (0.6) | P-1 | DIA (0.05) | W-1 | A1 = 100 | CL-1 (2) |

TABLE 11

| | Seonsitivity (µC/cm²) |
|---|---|
| Example 49 | 5 |
| Example 50 | 3 |
| Example 51 | 3 |
| Example 52 | 6 |
| Example 53 | 4 |
| Example 54 | 3 |
| Example 55 | 6 |
| Example 56 | 5 |
| Example 57 | 4 |
| Example 58 | 3 |
| Example 59 | 6 |
| Example 60 | 5 |
| Comparative Example 3 | 13 |

It is evident from Table 11 that the negative resist compositions of Examples 49 to 60 are excellent with respect to sensitivity.

EXAMPLES 61 TO 86 AND COMPARATIVE EXAMPLE 4

<Preparation of Resist>

Each of compositions as shown in Table 12 was filtered through a 0.1 µm polytetrafluoroethylene filter to prepare positive resist solutions each having a concentration of solid contents of 10% by weight.

TABLE 12

| | Acid generator (g) | Resin (B) (10 g) | Basic Compound (g) | Surfactant (0.03 g) | Solvent (weight ratio) | Component (C) (g) |
|---|---|---|---|---|---|---|
| Example 61 | I-1 (0.6) | (FII-1) | DBN (0.02) | W-1 | A1 = 100 | — |
| Example 62 | I-2 (0.5) Z33 (0.15) | (FII-2) | TMEA (0.02) | W-1 | A1 = 100 | — |
| Example 63 | I-3 (0.3) Z46 (0.2) | (FII-3) | TPSA (0.02) | W-2 | A1 = 100 | — |
| Example 64 | I-4 (0.3) Z44 (0.2) | (FII-4) | HEP (0.01) | W-2 | A3/B1 = 80/20 | — |
| Example 65 | I-5 (0.6) Z45 (0.1) | (FII-5) | TOA (0.03) | W-3 | A2/B1 = 90/10 | — |
| Example 66 | I-1 (0.3) Z31 (0.15) | (FII-6) | TBAH (0.01) | W-3 | A4/B1 = 90/10 | LCB (1) |
| Example 67 | I-1 (0.05) Z33 (0.15) Z31 (0.3) | (FII-7) | TPA (0.007) | W-4 | A1/B1 = 50/50 | — |
| Example 68 | I-10 (0.5) | (FII-8) | DBN (0.02) | W-4 | A1/B1 = 90/10 | — |

TABLE 12-continued

| | Acid generator (g) | Resin (B) (10 g) | Basic Compound (g) | Surfactant (0.03 g) | Solvent (weight ratio) | Component (C) (g) |
|---|---|---|---|---|---|---|
| Example 69 | I-11 (0.1) Z3 (0.2) | (FII-9) | TPI (0.03) | W-1 | A5/B2 = 90/10 | — |
| Example 70 | I-8 (0.2) Z34 (0.2) | (FII-10) | TPI (0.02) | W-1 | A1/B1 = 95/5 | — |
| Example 71 | I-14 (0.1) Zi (0.05) Z26 (0.1) | (FII-11) | DLA (0.02) | W-2 | A1/B1 = 90/10 | — |
| Example 72 | I-15 (0.3) Z33 (0.15) | (FII-12) | DLA (0.01) HAP (0.01) | W-2 | A1/B1 = 95/5 | — |
| Example 73 | I-16 (0.3) Z14 (0.1) | (FII-13) | TPI (0.03) | W-3 | A1/B1 = 95/5 | — |
| Example 74 | I-17 (0.2) Z21 (0.3) Z33 (0.075) | (FII-14) | DBN (0.02) | W-3 | A1/B1 = 95/5 | — |
| Example 75 | I-18 (0.2) Z7 (0.05) Z2 (0.1) | (FII-15) | DLA (0.02) | W-4 | A1/B1 = 80/20 | — |
| Example 76 | I-19 (0.1) Z33 (0.2) | (FII-16) | TPA (0.01) | W-4 | A1 = 100 | — |
| Example 77 | I-20 (0.1) Z33 (0.2) | (FII-17) | TPI (0.03) | W-4 | A1 = 100 | — |
| Example 78 | I-21 (0.2) Z22 (0.2) | (FII-18) | DCMA (0.01) | W-4 | A1 = 100 | — |
| Example 79 | I-22 (0.3) Z29 (0.1) Z35 (0.2) | (FII-19) | TPI (0.02) | W-4 | A1/B1 = 95/5 | — |
| Example 80 | I-23 (0.2) Z17 (0.2) | (FII-20) | TPI (0.03) | W-4 | A1/B1 = 95/5 | — |
| Example 81 | I-24 (0.2) Z32 (0.2) | (FII-21) | DBN (0.02) | W-1 | A1/B1 = 95/5 | — |
| Example 82 | I-25 (0.5) Z8 (0.1) | (FII-22) | DLA (0.01) HAP (0.01) | W-1 | A1/B1 = 80/20 | — |
| Example 83 | I-26 (0.4) Z41 (0.15) | (FII-23) | TPSA (0.02) | W-2 | A1/B1 = 90/10 | — |
| Example 84 | I-27 (0.1) Z5 (0.15) | (FII-24) | HEP (0.01) | W-2 | A3/B2 = 80/20 | — |
| Example 85 | I-28 (0.15) Z13 (0.15) | (FII-25) | DBN (0.02) | W-1 | A1 = 100 | — |
| Example 86 | I-29 (0.7) Z12 (0.1) | (FII-26) | DBN (0.02) | W-1 | A1 = 100 | — |
| Comparative Example 4 | PAG-X (0.6) | (FII-1) | DBN (0.02) | W-1 | A1 = 100 | — |

<Evaluation of Resist>

Each of the positive resist solutions was coated on a silicon wafer treated with hexamethyl disilazane using a spin coater and heated and dried at 120° C. for 90 seconds using a vacuum adhesion type hot plate, to form a 0.1 μm-thick resist film.

The obtained resist film was exposed using a laser exposure/dissolution behavior analyzer of 157 nm, VUVES-4500 (manufactured by Litho Tech Japan Corporation) and immediately after the exposure, heated at 120° C. for 90 seconds on a hot plate. Further, the resulting resist film was developed with a 2.38% tetramethylammonium hydroxide aqueous solution for 60 seconds and rinsed with pure water to obtain sample wafers. These sample wafers were evaluated for sensitivity and profile in the same manner as in Example 1. The results are shown in Table 13.

TABLE 13

| | Sensitivity (mJ/cm$^2$) | Profile |
|---|---|---|
| Example 61 | 3 | A |
| Example 62 | 3 | A |
| Example 63 | 2 | A |
| Example 64 | 4 | A |
| Example 65 | 3 | A |
| Example 66 | 5 | A |
| Example 67 | 2 | A |
| Example 68 | 3 | A |
| Example 69 | 4 | A |
| Example 70 | 4 | A |
| Example 71 | 5 | A |
| Example 72 | 4 | A |
| Example 73 | 2 | A |
| Example 74 | 4 | A |
| Example 75 | 3 | A |
| Example 76 | 5 | A |
| Example 77 | 4 | A |
| Example 78 | 2 | A |
| Example 79 | 3 | A |
| Example 80 | 5 | A |
| Example 81 | 2 | A |
| Example 82 | 3 | A |
| Example 83 | 4 | A |
| Example 84 | 2 | A |
| Example 85 | 2 | A |
| Example 86 | 4 | A |
| Comparative Example 4 | 8 | C |

It is evident from Table 13 that the positive resist compositions of Examples 61 to 86 are excellent with respect to sensitivity and profile.

Incidentally, though ArF excimer laser, electron beams and F$_2$ excimer laser are used as the actinic rays in the foregoing Examples, it is predicted that the resist compositions of the invention exhibit the same effects against EUV rays.

According to the invention, it is possible to provide photosensitive compositions having excellent sensitivity and profile.

This application is based on Japanese patent application JP 2002-279273, filed on Sep. 25, 2002, the entire content of which is hereby incorporated by reference, the same as if set forth at length.

What is claimed is:

1. A photosensitive composition comprising a compound capable of generating an acid upon irradiation with an actinic ray, the compound being represented by the following general formula (I):

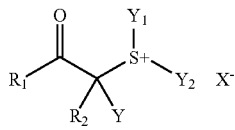

(I)

wherein R$_1$ represents a substituted or unsubstituted alkyl group provided that when R$_1$ represents a substituted alkyl group, the substituent is not an aryl group;

R$_2$ represents an alkyl group;

Y represents an alkyl group;

Y$_1$ and Y$_2$ may be the same or different and each represents an alkyl group, an aryl group, an aralkyl group, or a hetero atom-containing aromatic group;

R$_1$ and R$_2$ may be bonded to each other to form a ring;

R$_2$ and Y may be bonded to each other to form a ring;

Y$_1$ and Y$_2$ may be bonded to each other to form a ring;

two or more structures of the general formula (I) may be bonded to each other at any position of R$_1$, R$_2$ or Y, or Y$_1$ or Y$_2$ via a connecting group; and X$^-$ represents a non-nucleophilic anion.

2. The photosensitive composition as described in claim 1, which further comprises (F) a basic compound.

3. The photosensitive composition as described in claim 1, which further comprises (G) a surfactant containing at least one of a fluorine atom and a silicon atom.

4. The photosensitive composition as described in claim 1, wherein each of the R$_2$ and Y in the formula (I) represents an alkyl group having 1 to 20 carbon atoms.

5. The photosensitive composition as described in claim 1, which further comprises at least one of an arylsulfonium compound and a compound having a phenacylsulfonium salt structure.

6. A method of forming a resist pattern, which comprises: forming a film including the photosensitive composition described in claim 1; irradiating the film with an actinic ray; and developing the irradiated film.

7. A positive photosensitive composition comprising:

(A) a compound capable of generating an acid upon irradiation with an actinic ray, the compound being represented by the following general formula (I); and (B) a resin that is decomposed by the action of an acid to increase its solubility in an alkaline developer:

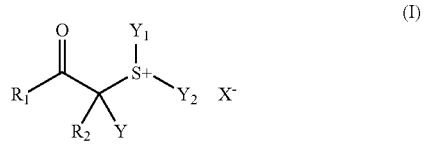

(I)

wherein R$_1$ represents a substituted or unsubstituted alkyl group provided that when R$_1$ represents a substituted alkyl group, the substituent is not an aryl group;

R$_2$ represents an alkyl group;

Y represents an alkyl group;

Y$_1$ and Y$_2$ may be the same or different and each represents an alkyl group, an aryl group, an aralkyl group, or a hetero atom-containing aromatic group;

R$_1$ and R$_2$ may be bonded to each other to form a ring;

R$_2$ and Y may be bonded to each other to form a ring;

Y$_1$ and Y$_2$ may be bonded to each other to form a ring;

two or more structures of the general formula (I) may be bonded to each other at any position of R$_1$, R$_2$ or Y, or Y$_1$ or Y$_2$ via a connecting group; and X— represents a non-nucleophilic anion.

8. The positive photosensitive composition as described in claim 7, wherein the resin (B) contains a hydroxystyrene structural unit.

9. The positive photosensitive composition as described in claim 7, wherein the resin (B) contains a monocyclic or polycyclic alicyclic hydrocarbon structure.

10. The positive photosensitive composition as described in claim 9, wherein the resin (B) further contains a repeating unit having a lactone structure.

11. The positive photosensitive composition as described in claim 7, wherein the resin (B) contains a fluorine atom.

12. The positive photosensitive composition as described in claim 7, which further comprises (C) a dissolution inhibiting compound having a molecular weight of not more than 3,000, which is decomposed by the action of an acid to increase its solubility in an alkaline developer.

13. A positive photosensitive composition comprising:

(A) a compound capable of generating an acid upon irradiation with an actinic ray, the compound being represented by the following general formula (I);

(D) an alkaline developer-soluble resin; and (C) a dissolution inhibiting compound having a molecular weight of not more than 3,000, which is decomposed by the action of an acid to increase its solubility in an alkaline developer:

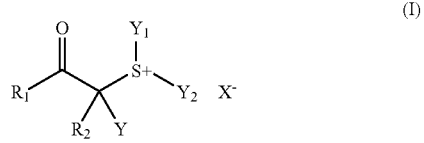

(I)

wherein R$_1$ represents a substituted or unsubstituted alkyl group provided that when R$_1$ represents a substituted alkyl group, the substituent is not an aryl group;

R$_2$ represents an alkyl group;

Y represents an alkyl group;

Y$_1$ and Y$_2$ may be the same or different and each represents an alkyl group, an aryl group, an aralkyl group, or a hetero atom-containing aromatic group;

$R_1$ and $R_2$ may be bonded to each other to form a ring;
$R_2$ and Y may be bonded to each other to form a ring;
$Y_1$ and $Y_2$ may be bonded to each other to form a ring;
two or more structures of the general formula (I) may be bonded to each other at any position of $R_1$, $R_2$ or Y, or $Y_1$ or $Y_2$ via a connecting group; and
X— represents a non-nucleophilic anion.

14. A negative photosensitive composition comprising:
(A) a compound capable of generating an acid upon irradiation with an actinic ray, the compound being represented by the following general formula (I);
(D) an alkaline developer-soluble resin; and
(E) an acid crosslinking agent capable of crosslinking with the alkaline developer-soluble resin by the action of an acid:

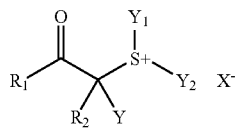

(I)

wherein $R_1$ represents an alkyl group;
$R_2$ represents a hydrogen atom, an alkyl group, or an aryl group;
Y represents an alkyl group;
$Y_1$ and $Y_2$ may be the same or different and each represents an alkyl group, an aryl group, an aralkyl group, or a hetero atom-containing aromatic group;
$R_1$ and $R_2$ may be bonded to each other to form a ring;
$R_2$ and Y may be bonded to each other to form a ring;
$Y_1$ and $Y_2$ may be bonded to each other to form a ring;
two or more structures of the general formula (I) may be bonded to each other at any position of $R_1$, $R_2$ or Y, or $Y_1$ or $Y_2$ via a connecting group; and
X— represents a non-nucleophilic anion.

15. An acid generator represented by the following general formula (I):

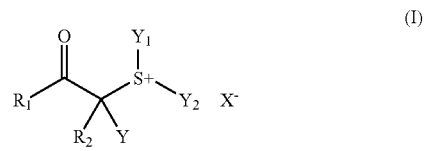

(I)

wherein $R_1$ represents a substituted or unsubstituted alkyl group provided that when $R_1$ represents a substituted alkyl group, the substituent is not an aryl group;
$R_2$ represents an alkyl group;
Y represents an alkyl group;
$Y_1$ and $Y_2$ may be the same or different and each represents an alkyl group, an aryl group, an aralkyl group, or a hetero atom-containing aromatic group;
$R_1$ and $R_2$ may be bonded to each other to form a ring;
$R_2$ and Y may be bonded to each other to form a ring;
$Y_1$ and $Y_2$ may be bonded to each other to form a ring;
two or more structures of the general formula (I) may be bonded to each other at any position of $R_1$, $R_2$ or Y, or $Y_1$ or $Y_2$ via a connecting group; and
$X^-$ represents a non-nucleophilic anion.

* * * * *